US008921857B2

(12) United States Patent
Moriwaki

(10) Patent No.: US 8,921,857 B2
(45) Date of Patent: Dec. 30, 2014

(54) SEMICONDUCTOR DEVICE

(75) Inventor: Hiroyuki Moriwaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/378,375

(22) PCT Filed: Jun. 9, 2010

(86) PCT No.: PCT/JP2010/059736
§ 371 (c)(1),
(2), (4) Date: Dec. 15, 2011

(87) PCT Pub. No.: WO2010/147032
PCT Pub. Date: Dec. 23, 2010

(65) Prior Publication Data

US 2012/0087460 A1 Apr. 12, 2012

(30) Foreign Application Priority Data

Jun. 18, 2009 (JP) ................................. 2009-145795

(51) Int. Cl.

| | |
|---|---|
| ***H01L 31/00*** | (2006.01) |
| ***H01L 29/10*** | (2006.01) |
| ***G11C 19/00*** | (2006.01) |
| ***H01L 29/417*** | (2006.01) |
| ***H01L 27/02*** | (2006.01) |
| ***H01L 27/12*** | (2006.01) |

(52) U.S. Cl.
CPC .......... *H01L 27/12* (2013.01); *H01L 29/41733* (2013.01); *H01L 27/0255* (2013.01); *H01L 27/1214* (2013.01)
USPC .................. 257/57; 257/66; 438/149; 377/64

(58) Field of Classification Search
CPC ............ H01L 27/1251; H01L 27/3248; H01L 2924/13069; H01L 29/78618; H01L 29/41733; H01L 27/1214; H01L 27/12; H01L 27/1225; H01L 29/04; H01L 27/3262; H01L 27/283; H01L 29/4908; H01L 29/786; H01L 29/78624; H01L 33/0041; H01L 27/016
USPC ....... 257/E29.151, E51.005–E51.008, E27.1, 257/E29.117, E27.016–E27.046, E29.195, 257/121, 328, 577, 28, 355–357, 360, 362, 257/347, 351, 352, 365, 57, 59, E21.09, 257/E21.159, E21.19, E21.347, E21.409, 257/E21.459, E21.46, E21.477, E21.495, 257/E21.521, E21.585, E21.689, E21.705, 257/E23.019, E23.181, E27.06, E27.112, 257/E27.14, E29.08, E29.095, E29.242, 257/E29.279, E29.29, E29.293, E29.295, 257/E29.3, E33.003, E33.013, E33.055, 257/E33.06, E33.062, E33.066, E33.068, 257/197, 288, 315, 66, 704, 759, 89, 98; 377/54–81, 53; 438/158, 29, 104, 34, 438/166, 157, 30, 458, 487, 149, 151, 23, 438/244, 283, 294, 4, 46, 624, 637, 652, 438/656, 672, 675, 795; 345/204, 76, 211, 345/100, 87, 98, 205, 206, 209, 212, 214, 345/419, 82, 92
See application file for complete search history.

(56) References Cited

U.S. PATENT DOCUMENTS

| | | | | |
|---|---|---|---|---|
| 5,371,351 | A | 12/1994 | Van Berkel | |
| 5,686,349 | A | 11/1997 | Nakata | |
| 5,744,822 | A * | 4/1998 | Takayama et al. | 257/66 |
| 7,379,127 | B2 * | 5/2008 | Tsao | 349/40 |
| 7,746,299 | B2 * | 6/2010 | Aoki et al. | 345/76 |
| 2004/0075094 | A1 * | 4/2004 | Yamazaki et al. | 257/72 |
| 2004/0090412 | A1 * | 5/2004 | Jeon et al. | 345/100 |
| 2005/0099744 | A1 * | 5/2005 | Kitagawa | 361/56 |
| 2006/0002045 | A1 | 1/2006 | Kobashi | |
| 2006/0119757 | A1 * | 6/2006 | Tsao | 349/40 |
| 2006/0176628 | A1 | 8/2006 | Hasegawa et al. | |
| 2008/0055505 | A1 | 3/2008 | Yeh et al. | |
| 2008/0067511 | A1 * | 3/2008 | Kim | 257/59 |
| 2009/0183766 | A1 * | 7/2009 | Takahashi et al. | 136/255 |
| 2010/0059744 | A1 * | 3/2010 | Yin et al. | 257/43 |
| 2010/0148859 | A1 * | 6/2010 | Cleeves et al. | 327/564 |
| 2011/0274234 | A1 | 11/2011 | Sakamoto et al. | |
| 2011/0297936 | A1 * | 12/2011 | Makita et al. | 257/53 |

FOREIGN PATENT DOCUMENTS

| | | | |
|---|---|---|---|
| JP | 01-218070 | A | 8/1989 |
| JP | 05-056666 | B2 | 8/1993 |
| JP | 05-304171 | A | 11/1993 |
| JP | 06-196701 | A | 7/1994 |
| JP | 08-087893 | A | 4/1996 |
| JP | 63-220289 | A | 9/1998 |
| JP | 2001-028424 | A | 1/2001 |
| JP | 2002-076356 | A | 3/2002 |
| JP | 2006-245552 | A | 9/2006 |
| JP | 2008-140489 | A | 6/2008 |

OTHER PUBLICATIONS

Official Communication issued in International Patent Application No. PCT/JP2010/059736, mailed on Sep. 14, 2010.

Xu et al., "A Novel Thin-film Transistors With μc-Si/a-Si Dual Active Layer Structure for AM-LCD," AM-LCD '96/IDW '96 Proceedings of The Third International Display Workshops, vol. 1, 1996, pp. 117-120.

Lee et al., "42.2: World's Largest (15-inch) XGA AMLCD Panel Using IGZO Oxide TFT," SID 08 Digest, Society for Information Display, 2008, vol. 39, 1st Edition, pp. 625-628.

English translation of Official Communication issued in corresponding International Application PCT/JP2010/059736, mailed on Jan. 26, 2012.

* cited by examiner

*Primary Examiner* — Colleen A Matthews
*Assistant Examiner* — Junaiden Mirsalahuddin
(74) *Attorney, Agent, or Firm* — Keating & Bennett, LLP

(57) ABSTRACT

A semiconductor device comprising a circuit including a plurality of thin film transistors and at least one diode (D2*a*), wherein: the plurality of thin film transistors have the same conductivity type; when the conductivity type of the plurality of thin film transistors is an N type, a cathode-side electrode of the diode (D2*a*) is connected to a line (550) connected to a gate of a selected one of the plurality of thin film transistors; when the conductivity type of the plurality of thin film transistors, an anode-side electrode of the diode is connected to a line (550) connected to a gate of a selected one of the plurality of thin film transistors; and another diode arranged so that a current flow direction thereof is opposite to that of the diode (D2*a*) is not formed on the line (550). Thus, it is possible to suppress damage to a thin film transistor due to ESD while suppressing the increase in circuit scale from conventional techniques.

18 Claims, 28 Drawing Sheets

(a)

(b)

(a)

(b)

(a)

(b)

SEMICONDUCTOR DEVICE

TECHNICAL FIELD

The present invention relates to a semiconductor device including a plurality of thin film transistors and ESD protection diodes.

BACKGROUND ART

In recent years, liquid crystal display devices and organic EL display devices are becoming widespread which include a thin film transistor (hereinafter "TFT") for each pixel. TFTs are made by using the semiconductor layer formed on a substrate such as a glass substrate. A substrate on which TFTs are formed is referred to as an active matrix substrate.

Conventionally, TFTs using an amorphous silicon film as the active layer (hereinafter "amorphous silicon TFTs") and TFTs using a polycrystalline silicon film as the active layer (hereinafter "polycrystalline silicon TFTs") are widely used as TFTs.

Since the carrier mobility of a polycrystalline silicon film is higher than an amorphous silicon film, a polycrystalline silicon TFT has a higher ON current than an amorphous silicon TFT and is capable of high-speed operation. In view of this, display panels have been developed in which not only TFTs for pixels but also some or all of TFTs for peripheral circuits such as drivers are formed by polycrystalline silicon TFTs. Drivers thus formed on an insulative substrate (typically, a glass substrate) forming a display panel may be called monolithic drivers. Drivers include a gate driver and a source driver, and only one of these may be a monolithic driver. Herein, a display panel refers to a portion of a liquid crystal display device or an organic EL display device including a display region, and does not include a backlight, a bezel, or the like, of the liquid crystal display device.

The production of polycrystalline silicon TFTs requires complicated processes such as a thermal annealing process or an ion doping process as well as a laser crystallization process for crystallizing an amorphous silicon film. Thus, currently, polycrystalline silicon TFTs are used mainly in medium and small display devices, and amorphous silicon TFTs are used in large display devices.

In recent years, with increasing demands for increasing the image quality and reducing the power consumption in addition to increasing the size of display devices, proposals have been made (Patent Document No. 1, Patent Document No. 2 and Non-Patent Document No. 1) of TFTs using a micro-crystalline silicon (μc-Si) film as the active layer which have higher performance and lower manufacturing cost than amorphous silicon TFTs. Such a TFT is called a "micro-crystalline silicon TFT".

A micro-crystalline silicon film is a silicon film having micro-crystal particles therein, and the grain boundaries of the micro-crystal particles are primarily in amorphous phase. That is, it is in a mixed state between crystalline phase of micro-crystal particles and amorphous phase. The size of each micro-crystal particle is smaller than that of each crystalline particle included in a polycrystalline silicon film. In a micro-crystalline silicon film, each micro-crystal particle has a columnar shape growing from the substrate surface, for example.

TFTs have been proposed which use a metal oxide semiconductor such as a Zn—O semiconductor (ZnO) film or an In—Ga—Zn—O semiconductor (IGZO) film, as a new material to replace silicon. Patent Document No. 3 states that it is possible, using a semiconductor layer of ZnO, to obtain a TFT having an ON/OFF current ratio of $4.5\times10^5$, a mobility of about 150 $cm^2/Vs$, and a threshold value of about 1.3 V. This mobility is much higher than that of an amorphous silicon TFT. Non-Patent Document No. 2 states that by using a semiconductor layer of IGZO, it is possible to obtain a TFT having a mobility of about 5.6 to 8.0 $cm^2/Vs$ and a threshold value of about −6.6 to −9.9 V. Similarly, the mobility is higher than that of an amorphous silicon TFT.

Thus, with large display devices, there are cases in which some or all of TFTs for a peripheral circuit such as a driver are formed on an active matrix substrate, in addition to TFTs for pixels, using amorphous silicon, micro-crystal silicon, IGZO, etc.

On the other hand, an ESD (ElectroStatic Discharge) protection circuit is normally provided on an active matrix substrate in order to prevent electrostatic damage to elements, lines, etc.

FIG. 1 is a diagram showing an example of an ESD protection circuit provided for an IC internal circuit having a CMOS (Complementary Metal Oxide Semiconductor). The ESD protection circuit shown in FIG. 1 includes a protection resistor R formed between the input terminal and the CMOS, and two protection diodes D1 and D2 of opposite polarities. The protection diodes D1 and D2 are both connected to the input signal line of the CMOS.

With the ESD protection circuit, when an ESD surge enters the input terminal, the potential of the input terminal increases (+) or decreases (−). If it increases (+), the protection diode D1 is turned ON, thereby shunting the positive charge to the VCC line. If it decreases (−), the protection diode D2 is turned ON, thereby shunting the negative charge to the VSS line. The magnitude of the current flow is restricted by the protection resistor R.

Patent Document No. 4 discloses an active matrix substrate including a plurality of gate lines 401 and a plurality of drain lines 402 crossing each other, with a pixel thin film transistor 407 provided at each intersection, as shown in FIG. 2, wherein ESD protection diodes 404 are provided between a reference potential line 403, to which a reference potential is given, and the gate lines 401 and between the reference potential line 403 and the drain lines 402. The two diodes 404 are formed by using the same semiconductor film as the semiconductor layer of the pixel thin film transistor 407, and have a structure in which the source and the gate of a TFT are shorted together. Diodes having such a structure are referred to also as "TFT-type diodes". The gate electrode of one of the two diodes 404 is connected to the gate line 401, and the gate electrode of the other is connected to the reference potential line 403. Therefore, whether the gate line 401 is charged positively or negatively with respect to the reference potential line 403, it is possible to provide a current flow between the gate line 401 and the reference potential line 403 in such a direction as to cancel out the charge. Therefore, it is possible to suppress the voltage between the gate line and the drain line caused by ESD, and to prevent the thin film transistor 407 from being damaged by an ESD surge.

While FIG. 2 shows the TFT-type diodes 404 for protecting the pixel thin film transistors 407, similar TFT-type diodes may be used for protecting circuit thin film transistors used in circuits such as driver circuits, for example.

CITATION LIST

Patent Literature

Patent Document No. 1: Japanese Laid-Open Patent Publication No. 6-196701

Patent Document No. 2: Japanese Laid-Open Patent Publication No. 5-304171

Patent Document No. 3: Japanese Laid-Open Patent Publication No. 2002-76356

Patent Document No. 4: Japanese Laid-Open Patent Publication No. 63-220289

Non-Patent Literature

Non-Patent Document No. 1: Zhongyang Xu, et al., "A Novel Thin-film Transistors With μc-Si/a-Si Dual Active Layer Structure For AM-LCD" IDW'96 Proceedings of The Third International Display Workshops VOLUME 1, 1996, p. 117-120

Non-Patent Document No. 2: Je-hun Lee, et al., "World's Largest (15-inch) XGA AMLCD Panel Using IGZO Oxide TFT", SID 08 DIGEST (USA), Society for Information Display, 2008, Volume 39, Issue 1, pp. 625-628

SUMMARY OF INVENTION

Technical Problem

As can be seen from the example shown in FIGS. 1 and 2, an ESD protection circuit includes at least two diodes so that whether a line to be protected is charged with a positive charge or a negative charge, that charge can be shunted. Thus, there is a problem that the circuit scale increases.

Particularly, where TFT-type diodes using a semiconductor film such as an amorphous silicon film, which has a relatively low mobility, are used as ESD protection diodes, it is necessary to increase the channel width W of the TFT-type diodes, thereby further increasing the size of the ESD protection diode and, as a result, enlarging the bezel region of the display device.

When one attempts to apply the ESD protection circuit to a shift register circuit that has no VDD line, it is necessary to route a new VDD line from outside, thereby further increasing the circuit scale.

The present invention has been made in view of the problems described above, and an object thereof is to provide a semiconductor device including a plurality of thin film transistors and an ESD protection circuit for protecting the thin film transistors from ESD, with a circuit scale reduced from that of conventional techniques while suppressing damage to thin film transistors due to ESD.

Solution to Problem

A semiconductor device of the present invention is a semiconductor device including a circuit including a plurality of thin film transistors and at least one diode, wherein: the plurality of thin film transistors have the same conductivity type; when the conductivity type of the plurality of thin film transistors is an N type, a cathode-side electrode of the at least one diode is connected to a line connected to a gate of a selected one of the plurality of thin film transistors; when the conductivity type of the plurality of thin film transistors is a P type, an anode-side electrode of the at least one diode is connected to a line connected to a gate of a selected one of the plurality of thin film transistors; and another diode arranged so that a current flow direction thereof is opposite to that of the at least one diode is not formed on the line.

In a preferred embodiment, a voltage peak value of the circuit is 20 V or more.

It is preferred that semiconductor layers of the at least one thin film diode and the selected one of the thin film transistors are formed from the same semiconductor film.

The same semiconductor film may be a micro-crystalline silicon film.

The circuit may include a shift register.

In a preferred embodiment, the shift register includes a plurality of stages each successively outputting output signals; each of the plurality of stages includes a first transistor for outputting the output signal, and a plurality of second transistors whose source region or drain region is electrically connected to a gate electrode of the first transistor; and the plurality of second transistors include a multi-channel transistor having an active layer including at least two channel regions, a source region and a drain region.

The at least one diode may include: a gate electrode formed on a substrate; a gate insulating layer formed on the gate electrode; at least one semiconductor layer formed on the gate insulating layer and having a first region and a second region; a first electrode provided on the first region and electrically connected to the first region and the gate electrode; and a second electrode provided on the second region and electrically connected to the second region.

The at least one semiconductor layer may include a channel region overlapping with the gate electrode with the gate insulating layer interposed therebetween, and a resistive region not overlapping with the gate electrode with the gate insulating layer interposed therebetween; and a current path including the channel region and the resistive region may be formed between the first electrode and the second electrode while the diode is ON.

Advantageous Effects of Invention

According to the present invention, in a semiconductor device including a circuit of single-channel TFTs, it is possible to suppress the increase in off-leak of TFTs due to ESD while suppressing the increase in circuit scale. Therefore, it is possible to prevent erroneous operation of the circuit.

It is particularly effective to apply the present invention to an active matrix substrate that includes a driving circuit.

DESCRIPTION OF EMBODIMENTS

Figure 1:
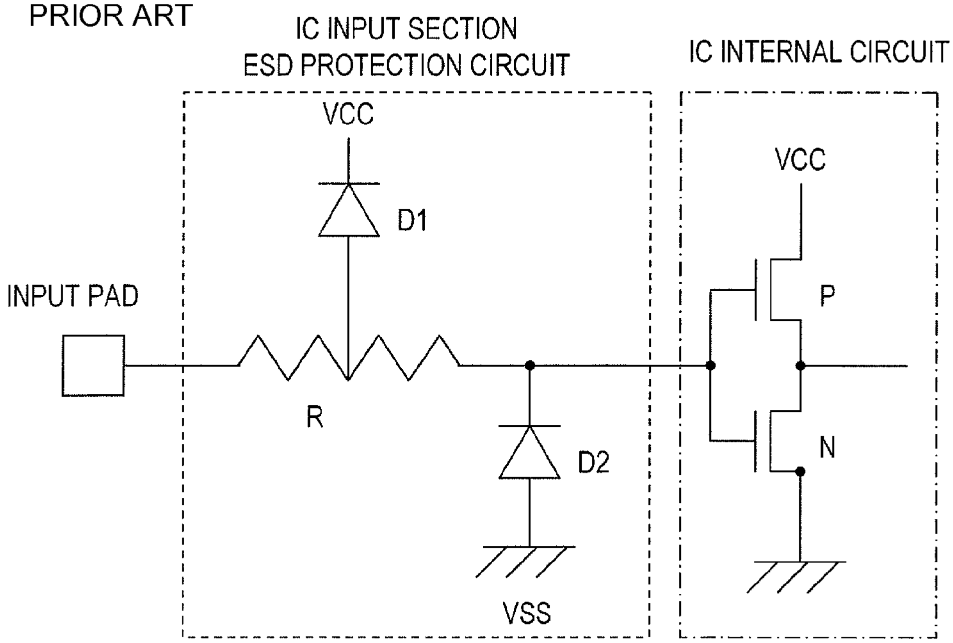
FIG. 1 A diagram showing an example of a conventional ESD protection circuit provided in an IC internal circuit.
Figure 2:
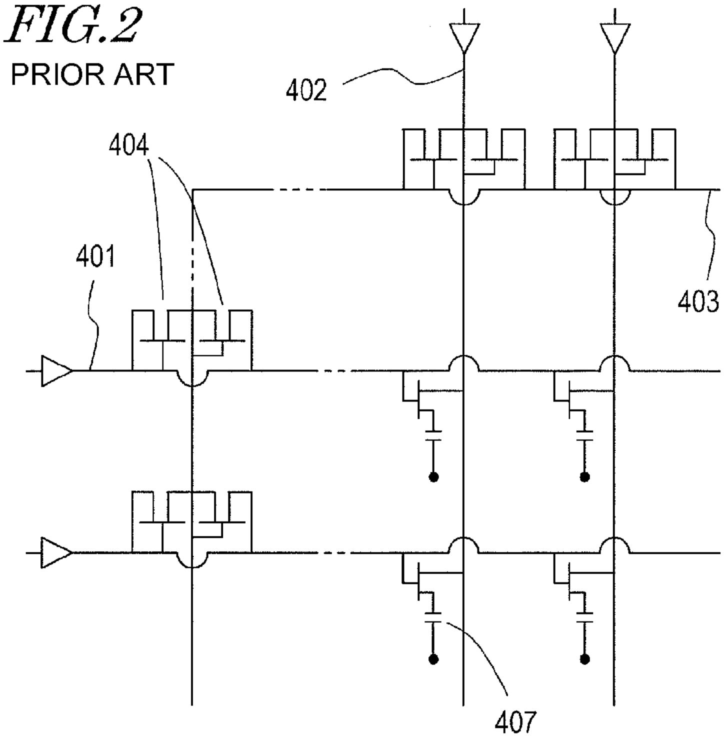
FIG. 2 A diagram showing a conventional active matrix substrate having an ESD protection circuit.

A semiconductor device of the present invention has a circuit including a plurality of thin film transistors and at least one diode. The thin film transistors included in the circuit of the present invention all have the same conductivity type (all being P-channel TFTs or all being N-channel TFTs). In the present specification, such a circuit is referred to as a "circuit formed by single-channel TFTs".

In the present invention, if the conductivity type of the plurality of thin film transistors having the same conductivity type is the N type, the cathode-side electrode of the at least one diode is connected to a line which is connected to the gate of one of the plurality of thin film transistors. If the conductivity type of the plurality of thin film transistors is the P type, the anode-side electrode of the at least one diode is connected to a line which is connected to the gate of one of the plurality of thin film transistors. Another diode arranged so that the direction of current flow is opposite to that of the at least one diode is not formed on the line.

The present invention is widely applicable to driving circuits and active matrix substrates of display devices, or display devices using the same. For example, for a relatively large display device such as a thin LCD television, it is preferred that a semiconductor film having a lower mobility than polysilicon such as an amorphous silicon film, a micro-crystalline silicon film and an IGZO film is used not only for pixel TFTs but also circuit TFTs used in peripheral circuits such as the driving circuit, but such circuit TFTs are typically single-channel TFTs. That is, they are N-channel TFTs or P-channel TFTs, and do not form a CMOS.

Now, referring to the drawings, problems to be solved by the present invention will be described in detail.

A circuit formed by single-channel TFTs has a problem that the OFF leak current of the TFTs increases, and erroneous operations are likely to occur, as compared with circuits including a CMOS used in an LPS or a single-crystal IC. The reason is as follows. With a CMOS, the threshold value can be controlled by using the doping step. In contrast, normally with a single-channel TFT, in order to reduce the cost, the doping step is not performed, and the threshold value therefore cannot be controlled. Thus, the sub-threshold region of the Id-Vg characteristics is near Vg=0[V], and it is likely that OFF leak occurs.

The present inventors have conducted researches to find the cause of the above problem, and as a result, found that when a positive or negative charge is input to the gate of a single-channel TFT, the threshold value of the TFT shifts in the positive or negative direction depending on the polarity of the charged applied thereto. It has also been found that with an N-channel single-channel TFT, the OFF leak current increases only when the threshold value shifts in the negative direction.

Figure 3:
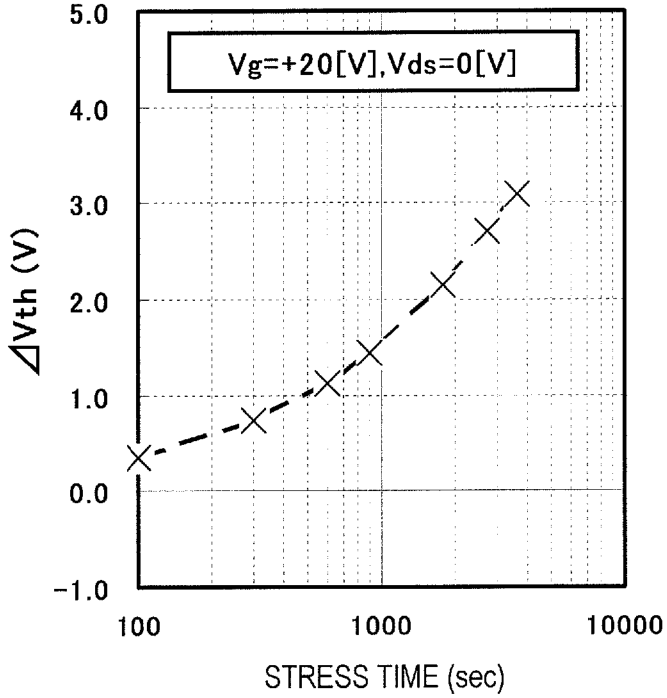
FIGS. 3 (*a*) and (*b*) are graphs showing results of a stress test of charging the gate of an N-channel amorphous silicon TFT with a positive charge (Vg=20 V), and results of a stress test of charging the gate with a negative charge (Vg=−20 V), respectively.
Figure 3:
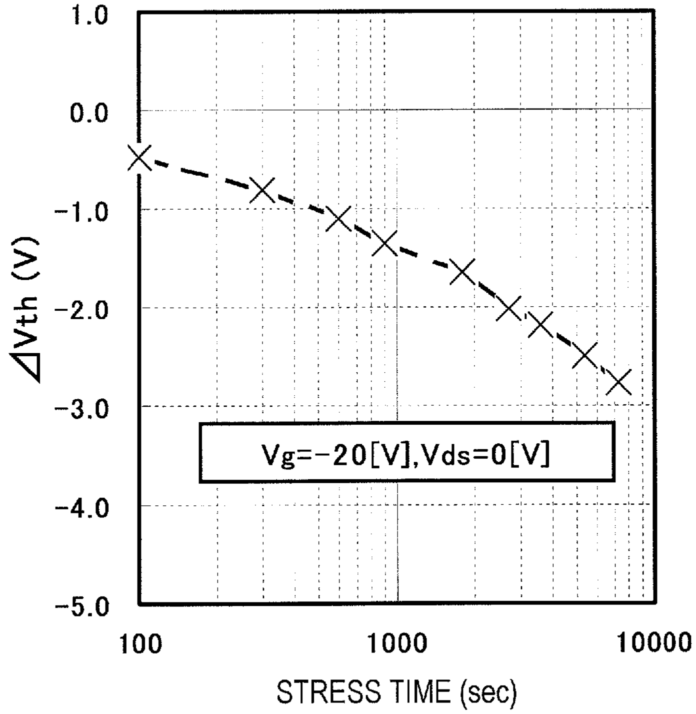

FIGS. 3(*a*) and 3(*b*) are graphs showing results of a stress test in which the gate of an N-channel amorphous silicon TFT is charged with a positive charge (Vg=20 V), and results of a stress test in which the gate is charged with a negative charge (Vg=−20 V), respectively. In both stress tests, the source-drain voltage is assumed to be 0 V. The vertical axis of the graphs represents the amount of change (ΔVth) of the threshold value Vth of the N-channel amorphous silicon TFT, and the horizontal axis represents the stress time. The amount of change ΔVth of threshold value is the value obtained by subtracting the threshold value before the stress application from the threshold value after a stress is applied over a predetermined period of time.

As can be seen from the results shown in FIG. 3(*a*), when a positive charge is applied to the gate of an N-channel amorphous silicon TFT, the threshold value shifts in the positive direction, thereby increasing the threshold value. On the other hand, as shown in FIG. 3(*b*), when a negative charge is applied to the gate, the threshold value shifts in the negative direction, thereby decreasing the threshold value.

Although the gate-OFF leak current (the OFF leak current) does not increase when the threshold value of a TFT shifts in the positive direction, the gate-OFF leak current (the OFF leak current) increases when it shifts in the negative direction.

Figure 4:
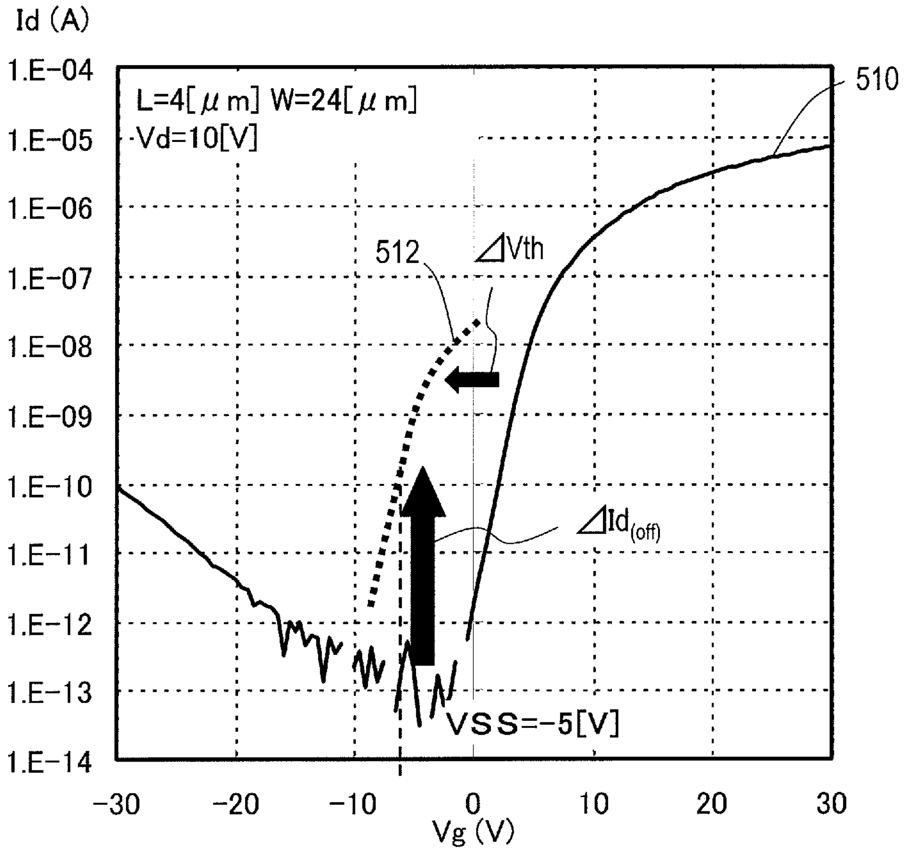
FIG. 4 A graph showing current (Id)–voltage (Vg) characteristics of an amorphous silicon TFT.

FIG. 4 is a graph showing the current (Id)–voltage (Vg) characteristics of an amorphous silicon TFT. It is assumed that the channel length L of the amorphous silicon TFT is 4 μm, the channel width W is 24 μm, the drain voltage Vd is 10 V, and the source voltage VSS is −5 V. It is assumed that the measurement temperature is room temperature. Substantially no current $Id_{(off)}$ flows when the gate is OFF (Vg=VSS), before the threshold value shifts, as indicated by a curve 510. However, when the threshold value shifts in the negative direction, the gate-OFF current $Id_{(off)}$ substantially increases, as indicated by a curve 512.

When the gate-OFF current $Id_{(off)}$ increases, the circuit including this TFT may operate erroneously. Where the circuit of the present embodiment is a gate driver, it may be possible that no signal is output. Conversely, even if the threshold value shifts in the positive direction, the gate-OFF current $Id_{(off)}$ does not increase, and it is unlikely that the erroneous operation of the circuit occurs due to the OFF leak.

Based on the findings described above, the present inventors found that in a circuit formed by single-channel TFTs, TFTs need to be protected only from a charge having such a polarity that increases the OFF leak current of the TFTs, of the positive or negative charge applied to the gates of the TFTs, and do not need to be protected from a charge having the other polarity, thus arriving at the present invention.

That is, in a semiconductor device having a circuit including an N-channel TFT as a single-channel TFT of the present invention, it is necessary to form only a protection diode (a diode D2 in the protection circuit of FIG. 1) to suppress the charging of the gate of the N-channel TFT with the negative charge. On the other hand, in a semiconductor device having a circuit including a P-channel TFT as a single-channel TFT, it is necessary to form only a protection diode (a diode D1 in the protection circuit of FIG. 1) for suppressing the charging of the gate of the P-channel TFT with the positive charge. Therefore, since the number of diodes for ESD protection can be reduced in ½, it is possible to reduce the circuit scale from conventional techniques while preventing erroneous operation of the circuit due to ESD. When applied to a shift register circuit that does not include a VDD line, it is no longer necessary to route a VDD line for the purpose of forming the ESD protection circuit, it is possible to more effectively reduce the circuit scale.

First Embodiment

A first embodiment of the semiconductor device of the present invention will now be described with reference to the drawings.

The semiconductor device of the present embodiment has a circuit including a plurality of TFTs, and a protection diode for protecting at least one of the plurality of TFTs from ESD. The plurality of TFTs are all N-channel TFTs or are all P-channel TFTs (the single-channel configuration). The protection diode is provided on a line that is connected to the gate of the TFT to be protected.

Figure 5:
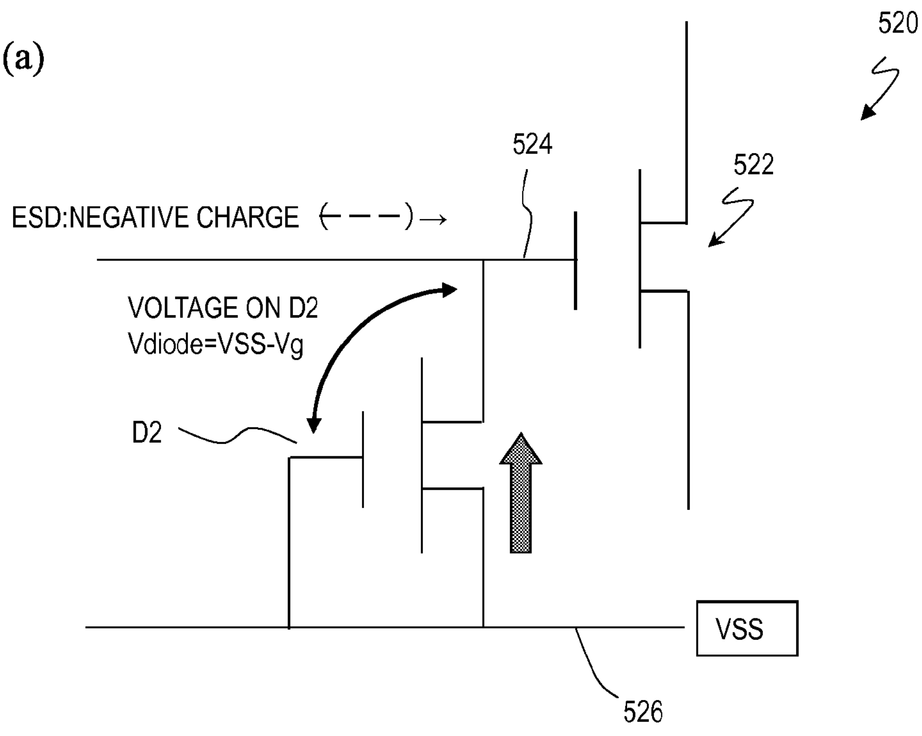
FIGS. 5 (*a*) and (*b*) are diagrams each illustrating a portion of a circuit 520 in a first embodiment of the present invention.
Figure 5:
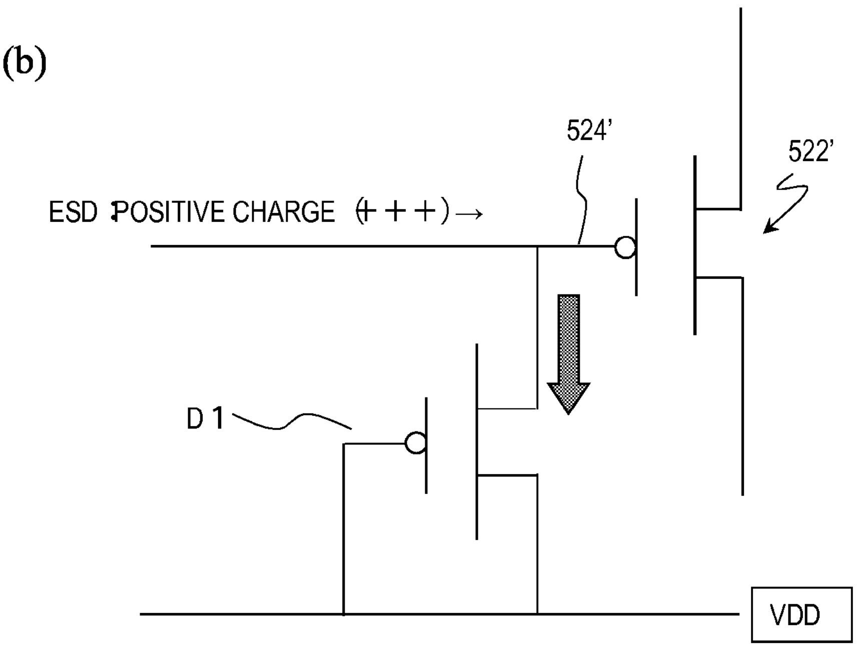

FIG. 5(*a*) is a diagram illustrating a portion of a circuit 520 of the present embodiment. The circuit 520 includes an N-channel thin film transistor 522, a line 524 connected to the gate of the thin film transistor 522, a VDD line 526, and a protection circuit including the protection diode D2. The protection diode D2 has a structure in which the source and the gate of a TFT are shorted together, for example, and is referred to also as a "TFT-type diode".

Figure 6:
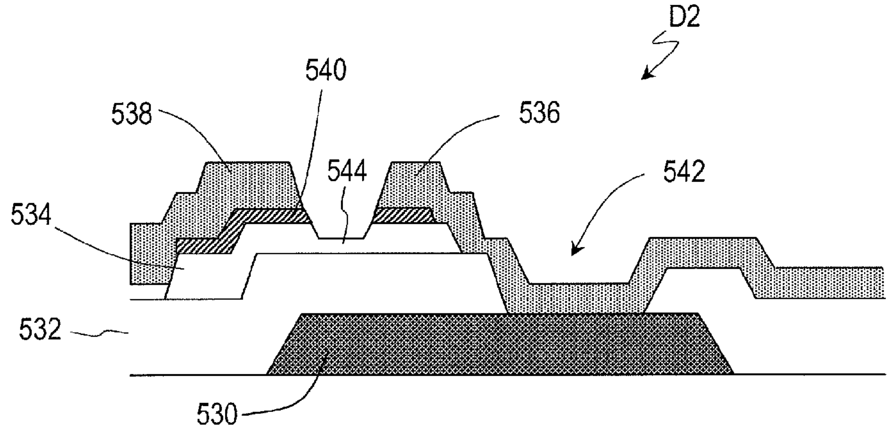
FIG. 6 A schematic cross-sectional view showing a protection diode of the first embodiment of the present invention.

FIG. 6 is a schematic cross-sectional view illustrating the protection diode D2. The protection diode D2 includes a gate electrode 530, a semiconductor layer 534 formed on the gate electrode 530 with a gate insulating film 532 interposed therebetween, and a first electrode (source electrode) 536 and a second electrode (drain electrode) 538 electrically connected to the opposite ends of the semiconductor layer 534. It is assumed that the current flow from the source to the drain. A contact layer 540 is formed between the semiconductor layer 534 and each of the first and second electrodes 536 and 538. The first electrode 536 is connected to the gate electrode 530 in a contact hole 542. A portion (channel portion) 544 of the semiconductor layer 534 sandwiched between the two electrodes 536 and 538 overlaps with the gate electrode 530. In the protection diode D2, a current flows from the first electrode 536 to the second electrode 538 via the channel portion 544 of the semiconductor layer 534. In the present embodiment, the first electrode (anode side) 536 and the gate electrode 530 of the protection diode D2 are connected to the VSS line 526 shown in FIG. 5(*a*), and the second electrode (cathode side) 538 is connected to the line 524.

FIG. 5(*a*) will be referred to again. As described above, since the thin film transistor 522 is of the N channel, if a negative ESD surge is applied to the gate of the thin film transistor 522, the threshold value may shift in the negative direction, thereby increasing the OFF leak. With this circuit 520, when a negative ESD surge is input to the line 524, the ESD surge can be shunted by the protection diode D2 to the VSS line 526, thereby suppressing the increase in OFF leak due to the application of a negative ESD surge to the gate of the thin film transistor 522.

On the other hand, when a positive ESD surge is input to the line 524, the ESD surge is applied directly to the gate of the thin film diode 522 because there is no protection circuit for shunting a positive charge. In this case, however, since the threshold value of the thin film transistor 522 shifts in the positive direction, the OFF leak does not increase due to the threshold value shift.

Thus, with the present embodiment, it is possible to suppress the increase in OFF leak of the thin film transistor 522 due to ESD. While two protection diodes of different current flow directions are provided for each line with conventional techniques, it is possible with the present embodiment to suppress the increase in OFF leak of the thin film transistor 522 by providing one protection diode D2 for each line 524, thereby reducing the circuit scale from conventional techniques.

Figure 7:
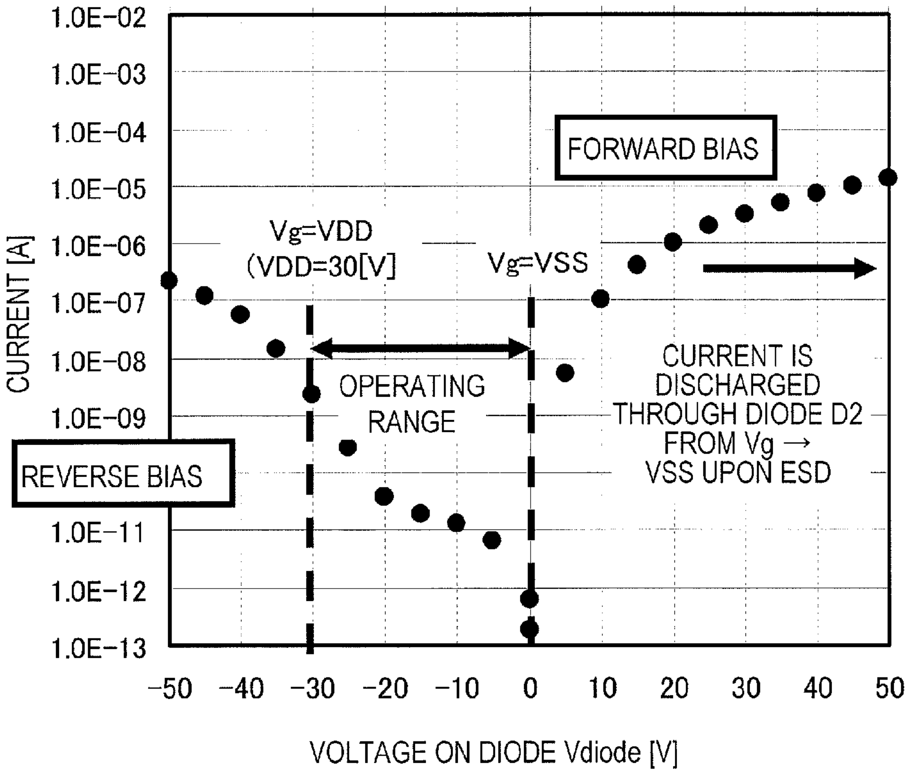
FIG. 7 A graph illustrating characteristics of a protection diode D2 of the first embodiment of the present invention.

FIG. 7 is a graph illustrating the characteristics of the protection diode D2 of the present embodiment. The horizontal axis of the graph represents the voltage $V_{diode}$ (V) on the protection diode D2, and the vertical axis represents the current (A) flowing through the protection diode D2. The voltage $V_{diode}$ is expressed as VSS−Vg (Vg: the potential of a line 24). It is assumed in this example that the channel width W of the protection diode D2 is 20 μm and the channel length L is 16 μm.

As can be seen from FIG. 7, when a negative charge is input to the line 524, thereby applying a positive voltage (VSS−Vg>0) of the protection diode D2 (forward bias), a current flows from the first electrode to the second electrode of the protection diode D2, and it is therefore possible to shunt the negative charge from the line 524 to the VSS line 526.

On the other hand, if the line potential Vg is within the operating voltage range (VSS≤Vg≤VDD) of the thin film transistor 522, no current flows through the protection diode D2 even if a negative voltage (VSS−Vg<0) is applied to the protection diode D2 (reverse bias).

While the channel width W and the channel length L of the protection diode D2 are not limited to particular values, it is typically preferred that the channel width W is large (e.g., 10 μm or more), in which case a large amount of charge can be discharged when ESD is input. More preferably, the channel width W is 20 μm or more. If the channel length L is large (e.g., 5 μm or more), the load resistance is large, and it is possible to suppress the leak occurring through the protection diode D2 during normal operation. On the other hand, if the channel width W and the channel length L are too large, it leads to an increase in the circuit scale, and it is therefore preferred that the channel width W is 1000 μm or less and the channel length L is 50 μm or less.

The circuit 520 of the present embodiment may include a P-channel thin film transistor instead of the N-channel thin film transistor 522. In this case, the protection circuit connected to the gate of the P-channel thin film transistor includes the protection diode D1 having a structure in which the drain and the gate are shorted together, as shown in FIG. 5(*b*). The cathode-side electrode (drain) of the protection diode D1 is connected to the VDD line, and the anode-side electrode (source) is connected to a line 524' connected to the gate of a P-channel thin film transistor 522'. The protection circuit does not include another diode arranged so that the current flow direction thereof is opposite to that of the protection diode D1. Thus, when a positive ESD surge is applied to the line 524', the ESD surge can be shunted to the VDD line, and it is therefore possible to prevent the threshold value of the P-channel thin film transistor from shifting in the positive direction.

The circuit 520 typically includes a plurality of TFTs of the same conductivity type, and an ESD protection circuit for protecting at least one of the plurality of TFTs from ESD. The ESD protection circuit includes the protection diode D2, which is effective against ESD of such a polarity that increases the OFF leak of the TFT to be protected, and does not include the protection diode D1, which is effective against ESD of the opposite polarity. The circuit of the present embodiment is only required to include at least one protection circuit described above, and the protection circuit described above may be provided for each of two or more TFTs. There may be a TFT protected by a protection circuit including two protection diodes D1 and D2.

The present embodiment is preferably applied to a semiconductor device including a circuit whose voltage peak value is 20 V or more. With such a semiconductor device, the threshold value of a TFT included in the circuit shifts by very large amounts, and it is therefore possible to obtain a particularly pronounced effect by providing the protection circuit described above.

The circuit 520 of the present embodiment may be a shift register that is formed (integral) monolithic with a liquid crystal display panel, for example. The configuration of the shift register of the present embodiment will now be described.

Figure 8:
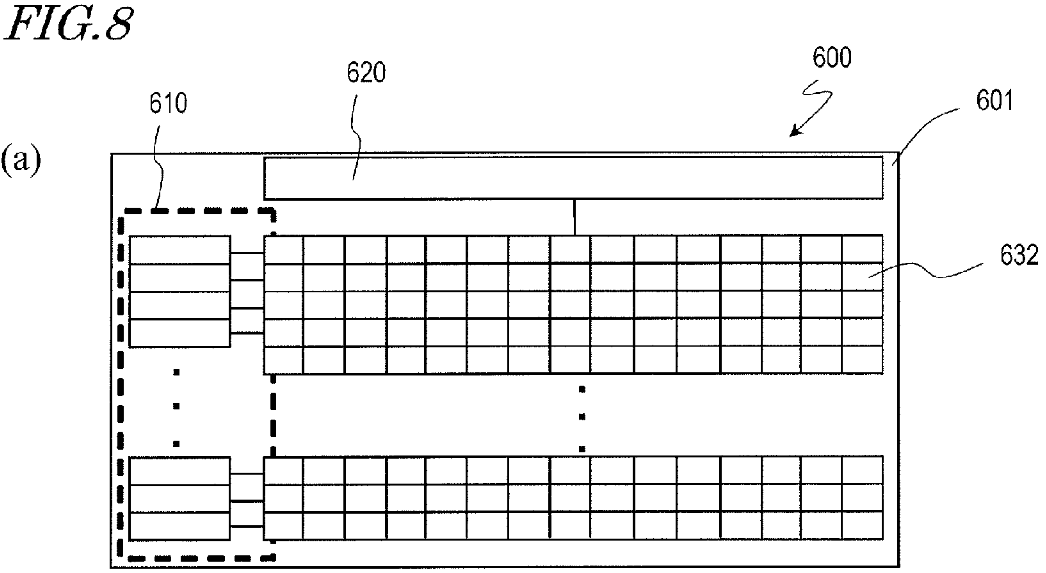
FIG. 8 (*a*) is a schematic plan view of a liquid crystal display panel 600 of an embodiment of the present invention, and (*b*) is a plan view showing a schematic structure of one pixel.
Figure 8:
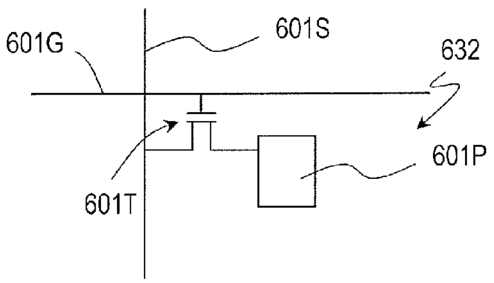

FIG. 8(*a*) is a schematic plan view of a liquid crystal display panel 600 of an embodiment of the present invention, and FIG. 8(*b*) shows a schematic structure of one pixel. FIG. 8(*a*) shows the structure of an active matrix substrate 601 of the liquid crystal display panel 600, and does not show the liquid crystal layer and the counter substrate. A liquid crystal display device is obtained by providing a backlight, a power supply, etc., in the liquid crystal display panel 600.

A gate driver 610 and a source driver 620 are formed integral with the active matrix substrate 601. A plurality of pixels are formed in the display region of the liquid crystal display panel 600, and regions of the active matrix substrate 601 corresponding to the pixels are denoted by reference numeral 632. The source driver 620 does not need to be formed integral with the active matrix substrate 601. A separately made source driver IC, or the like, may be mounted by a known method.

As shown in FIG. 8(*b*), the active matrix substrate 601 includes a pixel electrode 601P corresponding to one pixel of the liquid crystal display panel 600. The pixel electrode 601P is connected to a source bus line 601S via a pixel TFT 601T. The gate electrode of the TFT 601T is connected to a gate bus line 601G.

An output of the gate driver 610 is connected to the gate bus line 601G, and the gate bus lines 601G are scanned in a line-sequential manner. The output of the source driver 620 is connected to the source bus line 601S, and a display signal voltage (grayscale voltage) is supplied thereto.

Figure 9:
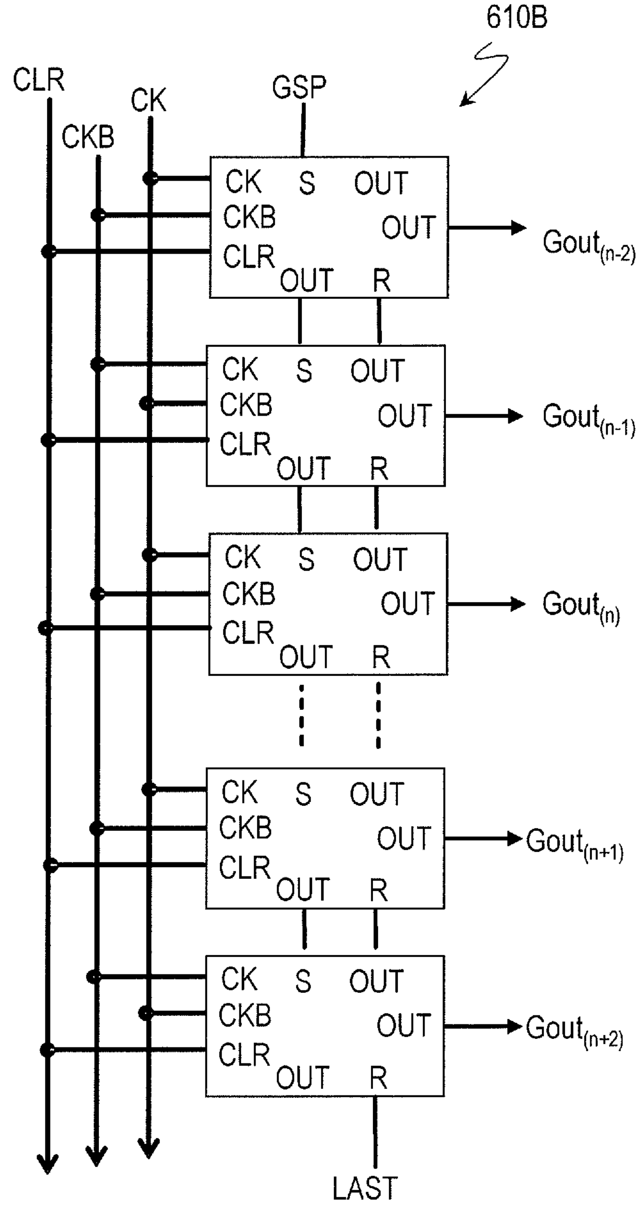
FIG. 9 A block diagram illustrating a structure of a shift register 610B included in a gate driver 610.

Next, FIG. 9 is a block diagram illustrating a configuration of a shift register 610B included in the gate driver 610. The shift register 610B is supported by an insulative substrate such as a glass substrate forming the active matrix substrate 601. TFTs forming the shift register 610B are preferably formed by the same process with the pixel TFTs 601T formed in the display region of the active matrix substrate 601.

FIG. 9 schematically shows only five stages from n−2 to n+2 of a plurality of stages of the shift register 610B. The plurality of stages have substantially the same structure, and are cascaded. The output from each stage of the shift register 610B is given to one gate bus line 601G of the liquid crystal display panel 600. Such a shift register 610B is described in Japanese Laid-Open Patent Publication No. 8-87893, for example. The disclosure of Japanese Laid-Open Patent Publication No. 8-87893 is herein incorporated by reference.

Figure 10:
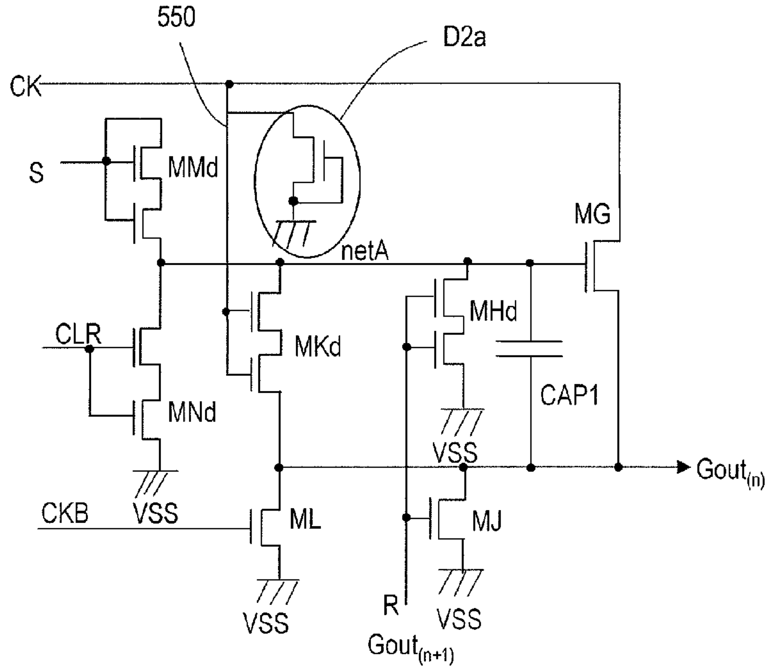
FIG. 10 A circuit diagram of one stage of a shift register of an embodiment of the present invention, which is used in one stage of the shift register 610B.
Figure 11:
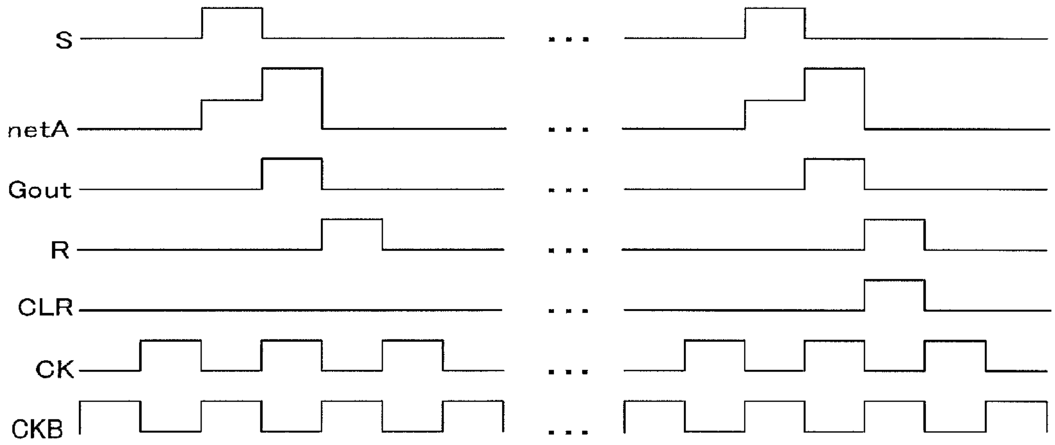
FIG. 11 A diagram showing waveforms of input/output signals at different stages of the shift register 610B and the voltage waveform of netA.
Figure 12:
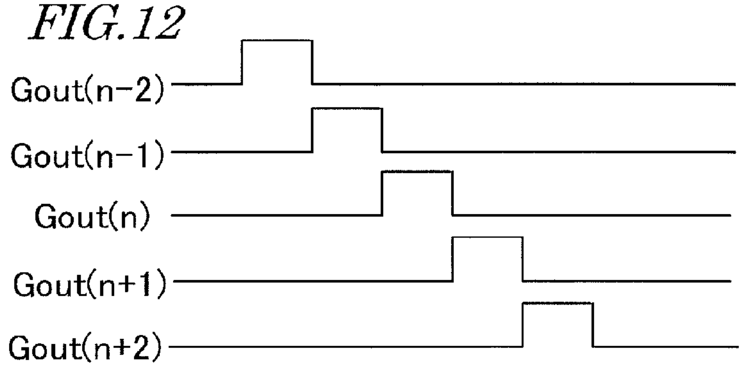
FIG. 12 A diagram showing waveforms of output signals from five stages from n−2 to n+2 of the shift register 610B.

FIG. 10 is a schematic diagram showing a configuration used in one stage of the shift register 610B, and FIG. 11 shows waveforms of input/output signals and a voltage waveform of netA of each stage of the shift register 610B. FIG. 12 shows waveforms of output signals from the five stages from n−2 to n+2 of the shift register 610B. As shown in FIG. 12, the shift register 610B sequentially outputs output signals Gout from the stages.

As shown in FIG. 10, each stage of the shift register 610B includes a first transistor MG for outputting the output signal Gout, and a plurality of second transistors (MHd, MKd, MMd and MNd) whose source region or drain region is electrically connected to the gate electrode of the first transistor MG. In FIG. 10, the first transistor MG is a so-called pull-up transistor, and the line connected to the gate electrode of the first transistor MG is referred to as netA. In the present embodiment, these transistors are all N-channel thin film transistors. A diode (protection diode) D2*a* for ESD protection is provided on a line 550 connected to the gate of the second transistor MKd. The configuration of the protection diode D2*a* may be similar to the configuration described above with reference to FIG. 6. The cathode-side electrode of the protection diode D2*a* is connected to the line 550, and the anode-side electrode is connected to the ground or VSS.

The output signal Gout is output from each stage to the gate bus line 601G only during the pixel write period. With respect to one stage, the configuration is such that the potential of Gout is fixed to VSS over most of one frame period (the period over which all the gate bus lines 601G are sequentially selected and until the subject gate bus line is selected).

By the S signal (the output signal Gout (n−1) of the preceding stage), netA is precharged. Then, the transistors MHd, MKd and MNd whose source region or drain region is connected to netA are OFF.

Next, when the clock signal CK is High, netA is pulled up. Then, the output signal Gout(n) is output to the ($n^{th}$) gate bus line 601G, thus turning ON the pixel TFT 601T connected to the gate bus line 601G and supplying a display signal voltage to the pixel electrode 601P from the source bus line 601S. That is, the liquid crystal capacitor formed by the pixel electrode 601P, the counter electrode (not shown) and the liquid crystal layer (not shown) therebetween is charged.

Thereafter, by the reset signal R (the output signal Gout (n+1) of the following stage), the potentials of netA and Gout are pulled down to VSS.

During the period in which the output signal Gout(n) is not output, netA and the potential of Gout are fixed to VSS by the transistor MKd and the transistor ML, respectively, using the clock signal CK and the clock signal CKB.

Herein, a capacitor CAP1 maintains the potential of netA and assists the output. The transistor MJ brings the potential of the output signal Gout to Low in response to the reset signal R. The transistor ML brings the potential of the output signal Gout to Low in response to the clock signal CKB. Once per frame (vertical scanning period), a clear signal CLR is supplied to all stages of the shift register to bring netA to Low for all stages during the vertical blanking interval (the interval from when the final stage of the shift register outputs to when the first stage outputs). Note that the clear signal CLR serves also as a reset signal for the final stage of the shift register.

With the provision of the protection diode D2*a*, the present embodiment has the following advantages.

Figure 13:
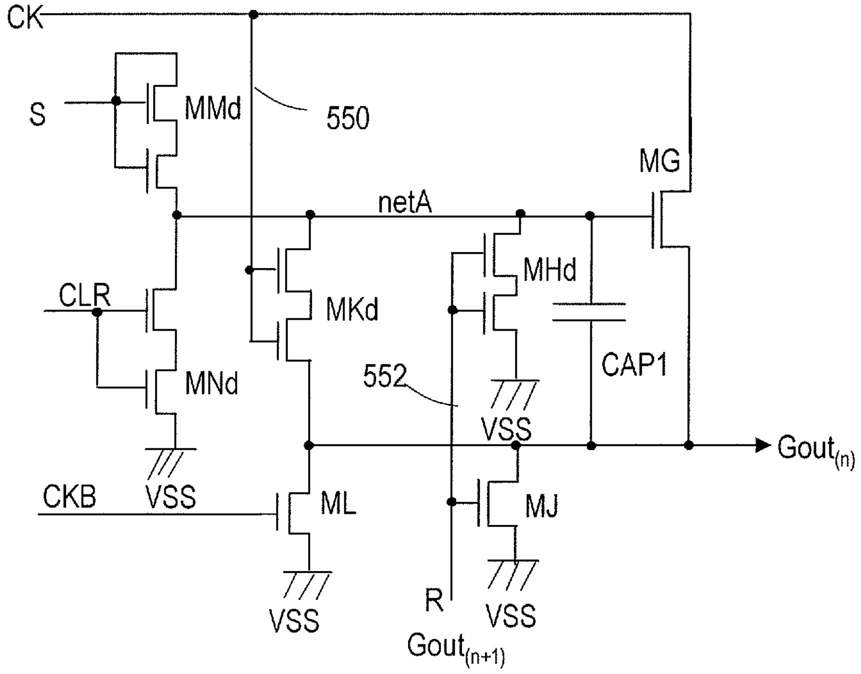
FIG. 13 A circuit diagram showing one stage of a shift register of a reference example.

For the purpose of comparison, FIG. 13 shows a circuit (a circuit of Reference Example) having a similar configuration to that of the circuit shown in FIG. 10 except that the protection diode D2*a* is absent. For the sake of simplicity, like elements to those of FIG. 10 are denoted by like reference numerals, and will not be further described below. The circuit of Reference Example shown in FIG. 13 is described in Japanese Patent Application No. 2008-297297 of the present applicant (unpublished). The disclosure of Japanese Patent Application No. 2008-297297 is herein incorporated by reference.

The circuit of Reference Example is easily influenced by external ESD since the second transistor (N-channel TFT) MKd to bootstrap netA is connected directly to the external signal CK. If a negative ESD surge is applied from the line 550 to the second transistor MKd, the OFF leak of the second transistor MKd increases, thereby increasing the probability that the circuit operates erroneously.

In contrast, with the present embodiment, since the protection diode D2*a* is provided on the line 550 as shown in FIG. 10, even if a negative ESD surge is input to the line 550, the negative ESD surge is shunted to the outside of the circuit via the protection diode D2*a* and is not applied to the second transistor MKd. Therefore, it is possible to suppress the increase in OFF leak of the second transistor MKd, and it is possible to prevent the circuit from operating erroneously due to ESD.

A diode which gives a current flow in the opposite direction to the current flow direction of the protection diode D2*a* is not provided on the line 550. If one attempts to further provide a diode for providing a current flow in the opposite direction on the line 550, it is necessary not only to form such a diode, but also to route a VDD line, which is not used in this circuit, as a line to which a charge (positive charge) is shunted from the line 550 via the diode. Thus, the circuit scale increases significantly. In contrast, in the present embodiment, since it is only necessary to form one protection diode D2*a* on the line 550, it is possible to appropriately protect the line 550 and the second transistor MKd from ESD while suppressing the increase in circuit scale.

In the circuit of the present embodiment, the transistor to be protected by a protection diode is not limited to the second transistor MKd. It is possible to provide a protection diode for protecting other transistors instead of the second transistor MKd, or in addition to the second transistor MKd.

Another example of the circuit of the present embodiment will now be described with reference to FIGS. 14 to 18.

Figure 14:
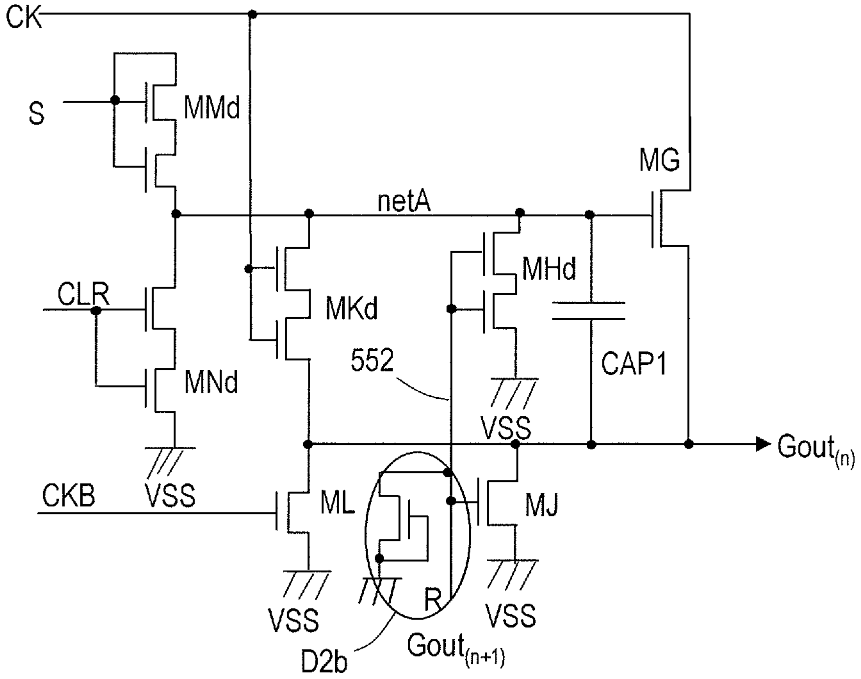
FIG. 14 A circuit diagram showing one stage of another shift register of an embodiment of the present invention, used in one stage of the shift register 610B.

In the circuit shown in FIG. 14, a protection diode D2*b* is provided on a line 552 connected to the gate of the second transistor MHd. The cathode-side electrode of the protection diode D2*b* is connected to the line 552, and the anode-side electrode is connected to the ground or VSS.

In the circuit of Reference Example shown in FIG. 13, the second transistor MHd for pulling down the potential from netA is connected directly to the external signal R, and is therefore easily influenced by ESD input from outside. When a negative ESD surge is applied to the second transistor MHd from the line 552, the OFF leak of the second transistor MHd increases. As a result, the voltage on the output transistor MG decreases, which may cause the circuit to operate erroneously. In contrast, in the example shown in FIG. 14, since the protection diode D2*b* is provided on the line 552, it is possible to suppress the application of a negative ESD surge to the second transistor MHd from the line 552. Therefore, it is possible to prevent the circuit from operating erroneously due to ESD.

Figure 15:
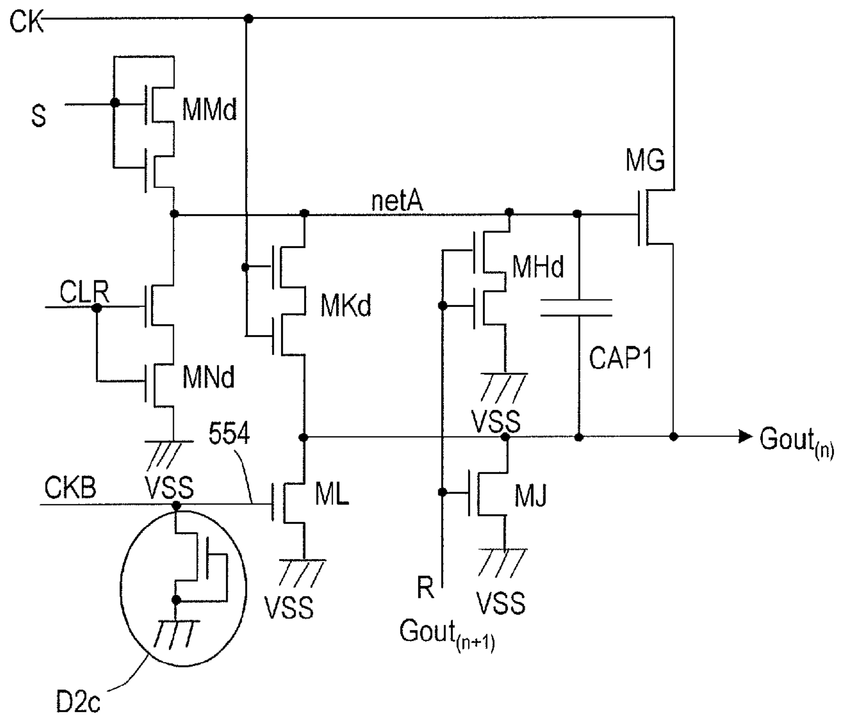
FIG. 15 A circuit diagram showing one stage of still another shift register of an embodiment of the present invention, used in one stage of the shift register 610B.

In the circuit shown in FIG. 15, a protection diode D2*c* is provided on a line 554 connected to the gate of the transistor ML. The cathode-side electrode of the protection diode D2*c* is connected to the line 554, and the anode-side electrode is connected to the ground or VSS.

In the circuit of Reference Example (FIG. 13), the transistor ML is connected directly to the external signal CKB, and is therefore easily influenced by ESD input from outside. In contrast, in the example shown in FIG. 15, the protection diode D2*c* is provided on the line 554, and it is therefore possible to suppress the application of the negative ESD surge input to the line 554 from being applied to the transistor ML. Therefore, it is possible to suppress the increase in the OFF leak of the transistor ML due to ESD.

Figure 16:
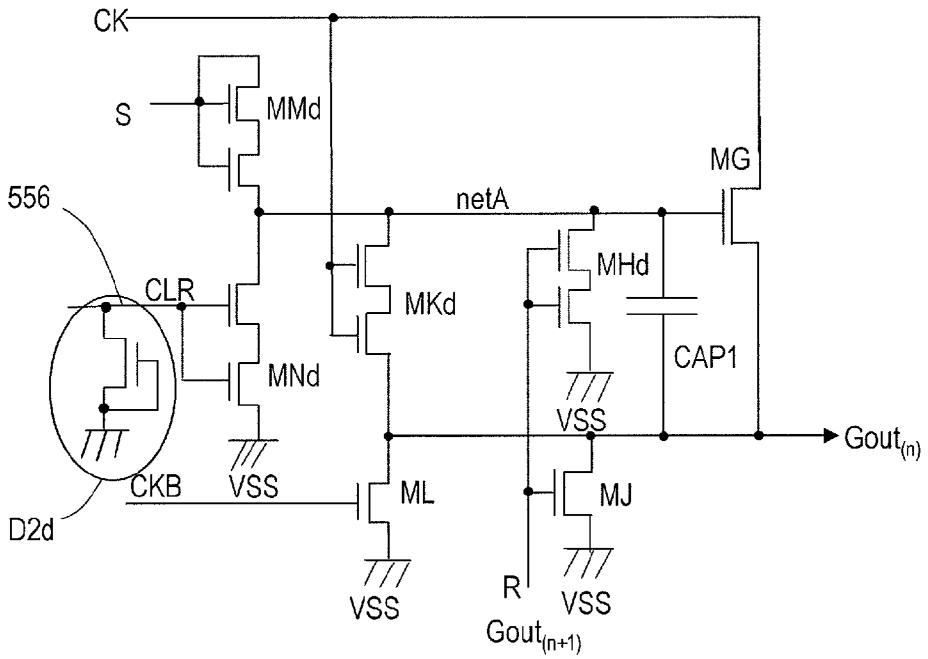
FIG. 16 A circuit diagram showing one stage of still another shift register of an embodiment of the present invention, used in one stage of the shift register 610B.

In the circuit shown in FIG. 16, a protection diode D2*d* is provided on a line 556 connected to the gate of the second transistor MNd. The cathode-side electrode of the protection diode D2*d* is connected to the line 556, and the anode-side electrode is connected to the ground or VSS.

In the circuit of Reference Example (FIG. 13), the second transistor MNd is connected directly to the external signal CLR, and is therefore easily influenced by ESD input from outside. In contrast, in the example shown in FIG. 16, the protection diode D2*b* is provided on the line 554, and it is therefore possible to suppress the application of the negative ESD surge input to the line 554 from being applied to the second transistor MNd. Therefore, it is possible to suppress the increase in the OFF leak of the transistor MNd due to ESD.

Figure 17:
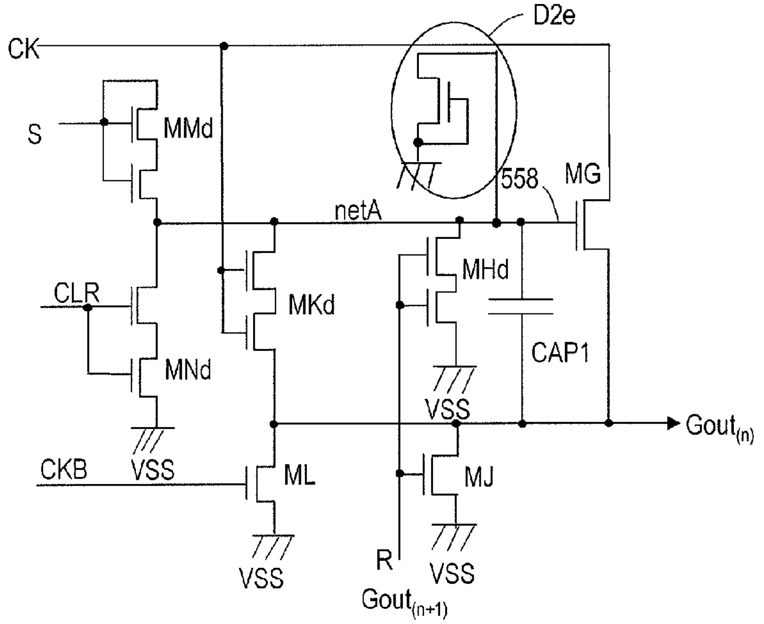
FIG. 17 A circuit diagram showing one stage of still another shift register of an embodiment of the present invention, used in one stage of the shift register 610B.

In the circuit shown in FIG. 17, a protection diode D2*e* is provided on the line netA connected to the gate of the output transistor MG. The cathode-side electrode of the protection diode D2*e* is connected to netA, and the anode-side electrode is grounded.

If the OFF leak of the output transistor MG increases due to ESD, the waveform of the output Gout may be blunted or the output transistor MG may fail to be turned ON. In the example shown in FIG. 17, since the protection diode D2*e* is provided between the output transistor MG and the second transistor MHd on netA, it is possible to suppress the application of an ESD surge to the output transistor MG and to prevent the above problem, which is due to an increase in the OFF leak of the output transistor MG.

Figure 18:
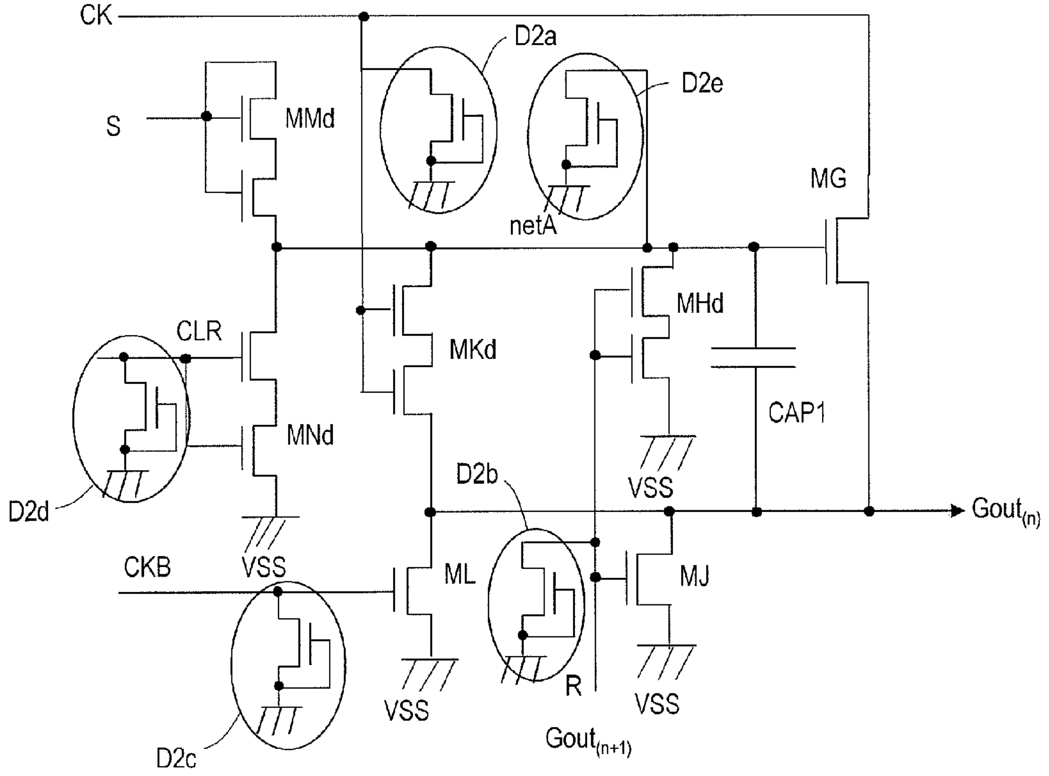
FIG. 18 A circuit diagram showing one stage of still another shift register of an embodiment of the present invention, used in one stage of the shift register 610B.

The circuit of the present embodiment may include one of the protection diodes D2*a* to D2*e* or may include a plurality of protection diodes. Of the protection diodes D2*a* to D2*e*, the ESD protection effect is higher in the order of protection diodes D2*a*, D2*b*, D2*c*, D2*d* and D2*e*. As shown in FIG. 18, the protection diodes D2*a* to D2*e* described above may all be present. Thus, it is possible to prevent the erroneous operation of the circuit more effectively due to ESD.

Where the circuit of the present embodiment has a PMOS single-channel configuration, a protection diode (the protection diode D1 shown in FIG. 1) may be provided on at least one of the lines 550 to 558 so that the positive charge can be shunted.

It is preferred that the transistor and the protection diode included in the circuit of the present embodiment are formed by using the same semiconductor film. The semiconductor film may be an amorphous silicon film, a micro-crystalline silicon film, a metal oxide semiconductor film (e.g., an IGZO film), etc.

In the above example, the second transistors MHd, MKd, MMd and MNd have a multi-channel structure (herein, a dual-channel structure), but they may have a single-channel structure instead. In particular, where these transistors are formed by using a micro-crystalline silicon film, it is preferred that these transistors have a multi-channel structure (a dual-channel structure in the above example). The reason for this will now be described.

If netA is pulled up, a large voltage (Vds) is applied between the source and the drain of the second transistor (in the OFF state) whose source or drain is connected to netA. The voltage of netA being pulled up decreases, due to the leak current of the second transistor whose source or drain is connected to netA, before it falls in response to the clock signal CK (Low) as it is supposed to. As the voltage of netA decreases, the output signal Gout is not turned High, or the waveform of the output signal Gout is blunted, failing to supply a sufficient voltage to the pixel electrode, thus lowering the display quality.

Where the shift register is formed by using micro-crystal silicon TFTs having a single-channel structure, since these TFTs have a relatively large leak current, such defects as described above are more likely to occur due to the leak current. In contrast, since the leak current in the sub-threshold region of a micro-crystal silicon TFT which has a multi-channel structure is smaller than that of a micro-crystal silicon TFT which has a single-channel structure, it is possible to suppress the blunting of the waveform of netA and the output signal Gout.

If the dual-channel structure is employed for at least one TFT of the plurality of second transistors, the leak current can be reduced for the at least one transistor. Where the dual-channel structure is employed for some TFTs of the plurality of second transistors, it is preferred that the dual-channel structure is employed for the transistors MHd, ML and MMd of which the source-drain voltage Vds is highest. The gate electrode of the transistor MHd is connected to the output of the preceding stage (Gout(n−1)), and the source electrode or the drain electrode thereof is connected to the gate electrode of the output transistor MG (netA) or VSS. The gate electrode of the transistor MNd is connected to the line of the clock signal CK, and the source electrode or the drain electrode thereof is connected to the gate electrode of the output transistor MG (netA) or VSS. The transistor MMd has its gate electrode and source electrode connected to each other (diode connection), and the output (S signal) of the preceding stage is supplied to the gate electrode thereof. The drain electrode of the transistor MMd is connected to the gate electrode of the transistor MG (netA). It is understood that the multi-channel structure is preferably employed for all of the plurality of second transistors in view of the characteristics.

A "micro-crystalline silicon film" means a film having a mixed state between the crystalline phase of micro-crystal particles and the amorphous phase. The volume percentage of the amorphous phase in the micro-crystalline silicon film can be controlled in the range of 5% or more and 95% or less, for example. The volume percentage of the amorphous phase is preferably 5% or more and 40% or less, and it is possible to effectively improve the ON/OFF ratio of the TFT because it is possible in this range to obtain a desirable micro-crystalline silicon film with little film defect. When Raman scattered spectroscopy using visible light is performed on a micro-crystalline silicon film, the spectrum has the highest peak at the wavelength of 520 $cm^{-1}$, which is the peak of crystalline silicon, and has a broad peak at the wavelength of 480 $cm^{-1}$, which is the peak of amorphous silicon. The peak height of amorphous silicon in the vicinity of 480 $cm^{-1}$ is 1/30 or more and 1 or less, for example, of the peak height of crystalline silicon seen in the vicinity of 520 $cm^{-1}$.

For the purpose of comparison, when Raman scattered spectroscopy is performed on a polycrystalline silicon film, hardly any amorphous component is observed with the peak height for amorphous silicon being substantially zero. There are cases where the amorphous phase remains locally depending on crystallization conditions when forming the polycrystalline silicon film, but even in such cases, the volume percentage of the amorphous phase in the polycrystalline silicon film is generally less than 5%, with the peak height for amorphous silicon by Raman scattered spectroscopy being generally less than 1/30 of the peak height for polycrystalline silicon.

Such a micro-crystalline silicon film can be formed by a CCP (capacitively coupled plasma) method or a high-density plasma CVD such as an ICP (inductively coupled plasma) method. The peak intensity ratio described above can be adjusted by the plasma CVD apparatus scheme and deposition conditions.

As described above, considering the polarity of the ESD surge and the direction in which the threshold value of the TFT shifts due to an ESD surge, the present embodiment provides a protection circuit that is only effective against an ESD surge having such a polarity that increases the OFF leak current of the TFT, and does not provide a protection circuit that is effective against an ESD surge of the other polarity. Therefore, it is possible to reduce the number of protection circuits, and to reduce the circuit scale.

The circuit configuration of the shift register of the present embodiment is not limited to those shown in FIGS. 10 and 14 to 18. The present embodiment is also applicable to other shift registers illustrated in Japanese Patent Application No. 2008-297297, for example. Also in other shift registers, it is possible to obtain effects similar to those described above, particularly by providing a protection diode of the present embodiment in a thin film transistor connected directly to an external signal.

The circuit of the present embodiment is not limited to shift registers. For example, the present embodiment is applicable to DACs, TGs, latches, power supply circuits, with which it is possible to obtain effects similar to those described above.

[Other Configurations of Protection Diode]

The configuration of the protection diode of the present embodiment is not limited to that described above with reference to FIG. 6. For example, where a semiconductor layer of a protection diode is formed by using a semiconductor film having a higher mobility than amorphous silicon (e.g., a micro-crystalline silicon film, a metal oxide semiconductor film), the current flows more easily through the semiconductor layer, and the current may possibly flow through the protection diode even during normal operation. In order to prevent such a problem, a low-resistance region to be described below may be formed in the semiconductor layer.

Figure 19:
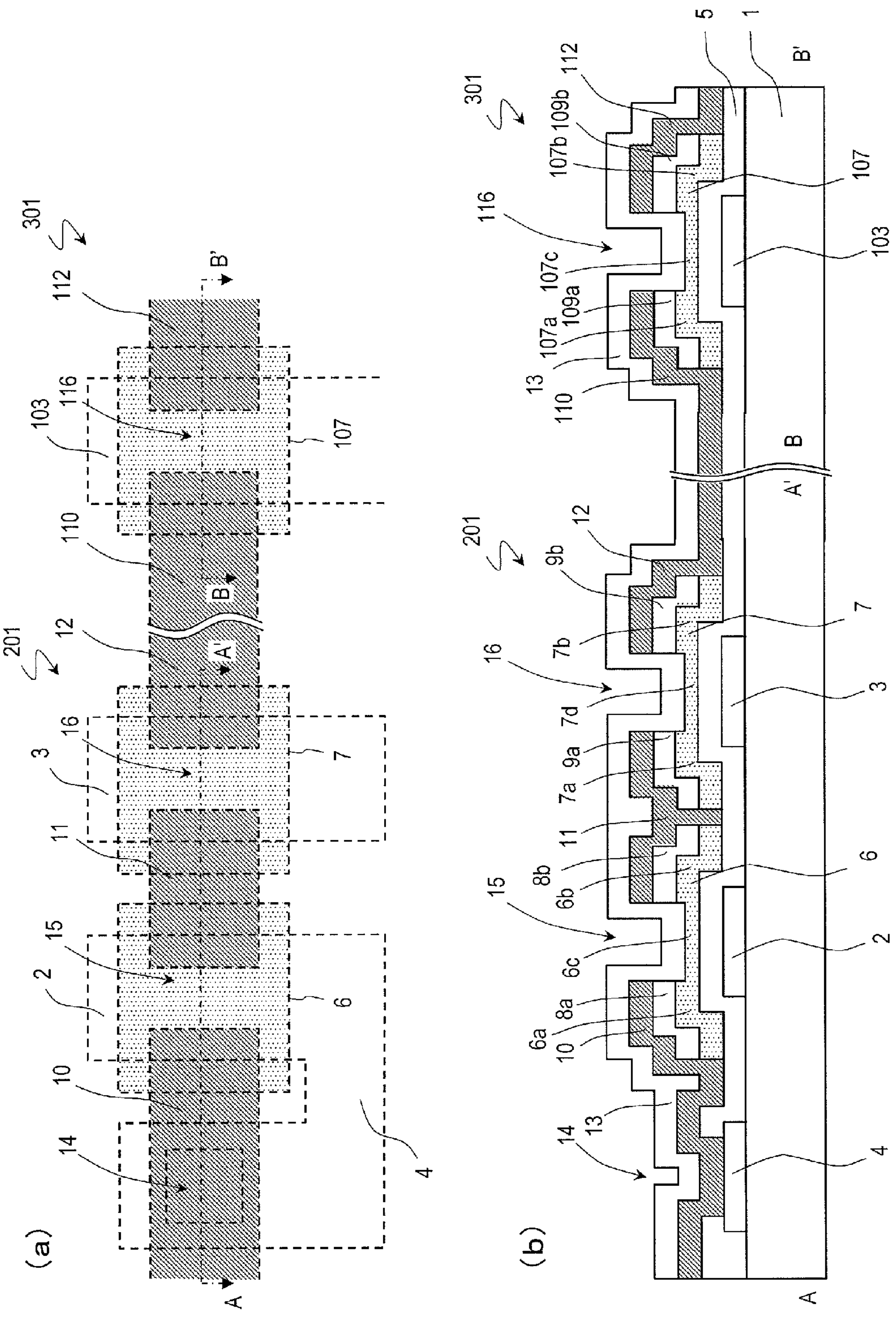
FIGS. 19 (*a*) and (*b*) are diagrams schematically showing a semiconductor device of the first embodiment of the present invention, wherein (*a*) is a plan view thereof, and (*b*) is a cross-sectional view taken along line A-A' and line B-B' of (*a*).

FIG. 19 is a diagram illustrating a semiconductor device including another protection diode of the present embodiment, wherein FIG. 19(*a*) is a plan view of the semiconductor device, and FIG. 19(*b*) is a cross-sectional view taken along line A-A' and line B-B' of FIG. 1(*a*).

The semiconductor device of the present embodiment includes a substrate 1, and a diode 201 and a thin film transistor 301 formed on the substrate 1. The diode 201 and the thin film transistor 301 are formed by using the same semiconductor film. The thin film transistor 301 is a second transistor of a shift register, for example, and the diode 201 is a protection diode for protecting the second transistor from ESD.

Herein, the semiconductor film is formed by using a micro-crystalline silicon film. The thin film transistor 301 is a reverse-staggered channel-etched TFT which has a bottom-gate structure, and the diode 201 has a structure based on a reverse-staggered channel-etched TFT which has a bottom-gate structure, with the gate electrode and the source electrode connected to each other.

The thin film transistor 301 includes a gate electrode 103 formed on the substrate 1, a gate insulating layer 5 formed so as to cover the gate electrode 103, a micro-crystal silicon layer 107 formed on the gate insulating layer 5, a source electrode 110 formed on the micro-crystal silicon layer 107 with a contact layer 109*a* interposed therebetween, and a drain electrode 112 formed on the micro-crystal silicon layer 107 with a contact layer 109*b* interposed therebetween.

The micro-crystal silicon layer 107 includes a channel region 107*c*, and a first region 107*a* and a second region 107*b* located on the opposite sides of the channel region 107*c*. The first region 107*a* is electrically connected to the source electrode 110 by the contact layer 109*a*. The second region 107*b* is electrically connected to the drain electrode 112 by the contact layer 109*b*. A gap portion 116 is formed on the channel region 107*c*.

The diode 201 includes a gate electrode 2, a conductive layer 3 and a connection line 4 formed on the substrate 1, the gate insulating layer 5 formed so as to cover the gate electrode 2, the conductive layer 3 and the connection line 4, a micro-crystal silicon layer 6 placed on the gate insulating layer 5 so as to overlap with the gate electrode 2, a micro-crystal silicon layer 7 placed on the gate insulating layer 5 so as to overlap with the conductive layer 3, the first electrode (source electrode) 10 formed on the micro-crystal silicon layer 6 with a contact layer 8*a* interposed therebetween, an intermediate electrode 11 formed on the micro-crystal silicon layers 6 and 7 with contact layers 8*b* and 9*a* interposed therebetween, and a second electrode (drain electrode) 12 formed on the micro-crystal silicon layer 7 with a contact layer 9*b* interposed therebetween.

The micro-crystal silicon layer 6 includes a channel region 6*c*, and a first region 6*a* and an intermediate region 6*b* located on the opposite sides of the channel region 6*c*. The first region 6*a* is electrically connected to the source electrode 10 by the contact layer 8*a*. The intermediate region 6*b* is electrically connected to the intermediate electrode 11 by the contact layer 8*b*. Similarly, the micro-crystal silicon layer 7 includes a region that serves as a resistor (hereinafter referred to as a "resistive region") 7*d*, and an intermediate region 7*a* and a second region 7*b* located on opposite sides of the resistive region 7*d*. The intermediate region 7*a* is electrically connected to the intermediate electrode 11 with the contact layer 9*a* interposed therebetween. The second region 7*b* is electrically connected to the drain electrode 12 with the contact layer 9*b* interposed therebetween. Gap portions 15 and 16 are formed on the channel region 6*c* and the resistive region 7*d*.

In the present embodiment, the gate electrode 2, the conductive layer 3 and the connection line 4 are formed by the same conductive film. The gate electrode 2 is placed so as to overlap with the channel region 6*c* of the micro-crystal silicon layer 6, and controls the conductivity of the channel region 6*c*. The gate electrode 2 is connected to the connection line 4, and the connection line 4 is electrically connected to the source electrode 10 in a contact hole 14, which is an opening provided in the gate insulating layer 5. Although not shown in the figures, the gate electrode 2 and the connection line 4 are electrically connected to the gate electrode 103 of the thin film transistor 301.

On the other hand, the conductive layer 3 is placed so as to overlap with the micro-crystal silicon layer 7, i.e., so that it can control the conductivity of the resistive region 7*d*. Note however that the conductive layer 3 is not connected to other electrodes and lines such as the source electrode 10, but is floating.

The micro-crystal silicon layers 107, 6 and 7 in the thin film transistor 301 and the diode 201 include a plurality of columnar micro-crystal particles, and crystal grain boundaries of amorphous phase. The volume percentage of the amorphous phase in the micro-crystal silicon layers 107, 6 and 7 is 5% to 40%, for example. The peak height for amorphous phase by Raman scattered spectroscopy is ⅓ to 1/10 of the peak height for the micro-crystal portion. An amorphous silicon layer or a polycrystalline silicon layer may be used as an active layer, instead of the micro-crystal silicon layers 107, 6 and 7. A film made of metal oxide semiconductor such as a Zn—O semiconductor (ZnO) film, an In—Ga—Zn—O semiconductor (IGZO) film, an In—Zn—O semiconductor (IZO) film and a Zn—Ti—O semiconductor (ZTO) film may be used as an active layer.

The contact layers 109*a*, 109*b*, 8*a*, 8*b*, 9*a* and 9*b* in the thin film transistor 301 and the diode 201 are provided in order to improve the electrical conduction between the micro-crystal silicon layers 107, 6 and 7 and the corresponding electrodes 110, 112, 10, 11 and 12. In the present embodiment, these contact layers are formed by the same $n^+$-type silicon film. These contact layers may each be a single layer of a polycrystalline silicon layer, a micro-crystal silicon layer, an amorphous silicon layer, or the like, or may have a layered structure including at least one of these layers. Where a film of a metal oxide semiconductor is used, instead of a micro-crystal silicon layer, as an active layer, no contact layer may be used.

A passivation 13 is provided on an upper portion of the electrodes 110, 112, 10, 11 and 12 in the thin film transistor 301 and the diode 201 so as to cover the gap portions 116, 15 and 16 and the surrounding area. The passivation 13 may be a film of an inorganic material such as silicon nitride, an organic film such as an acrylic resin, or a layered film thereof.

Although not shown in the figures, an opening through which an electric signal such as a predetermined voltage is input to the source electrodes 110 and 10 and the drain electrodes 112 and 12 may be provided as necessary in the passivation 13 by a method such as photolithography. The source electrodes 110 and 10 and the drain electrodes 112 and 12 may have a configuration so that an electric signal can be input from outside by appropriate connection with openings and connection lines.

The operation of the thin film transistor 301 and the diode 201 will now be described.

In the thin film transistor 301, a current flows primarily between the source electrode 110 and the drain electrode 112 when the resistance of the channel region 107*c* is sufficiently reduced by the voltage applied to the gate electrode 103. Then, the current flows through the first region 107*a*, the channel region 107*c* and the second region 107*b* of the micro-crystal silicon layer 107 from the source electrode 110 via the contact layer 109*a*. Then, it flows via the contact layer 109*b* to reach the drain electrode 112.

In the diode 201, a current flows primarily between the source electrode 10 and the drain electrode 12 when the resistance of the channel region 6*c* is sufficiently reduced by the voltage applied to the gate electrode 2. Then, the current flows through the first region 6*a*, the channel region 6*c* and the intermediate region 6*b* of the micro-crystal silicon layer 6 from the source electrode 10 via the contact layer 8*a*. Then, it flows via the contact layer 8*b* to reach the intermediate electrode 11. Similarly, past the intermediate electrode 11, it flows via the contact layer 9*a* through the intermediate region 7*a*, the resistive region 7*d* and the second region 7*b* of the micro-crystal silicon layer 7 in this order, and it then flows via the contact layer 9*b* to reach the drain electrode 12.

As described above, the conductive layer 3 under the micro-crystal silicon layer 7 is not connected to other electrodes or lines, and therefore no voltage is applied directly to the conductive layer 3. Thus, the first region 7*a*, the resistive region 7*d* and the second region 7*b* of the micro-crystal silicon layer 7 always have high resistance values and serve as resistors, but not as switching elements. In the diode 201, since such resistors are located between the source electrode 10 and the drain electrode 12, the resistance therebetween (the ON resistance) can be increased. Therefore, even when the diode 201 is formed by using a micro-crystal silicon having a high mobility, it is possible to prevent a current from flowing excessively through the diode 201. Therefore, the diode 201 can be used suitably in applications such as a diode for short ring, for example.

While the micro-crystal silicon layer 7 on the side of the drain electrode 12 does not overlap with the gate electrode 2 in FIG. 19, similar effects to those described above can be obtained also when the micro-crystal silicon layer 7 overlaps with the gate electrode 2 and the micro-crystal silicon layer 6 on the side of the source electrode 10 does not overlap with the gate electrode 2. That is, similar effects to those described above can be obtained even with a configuration where the gate electrode 2 and the conductive layer 3 are switched around.

While the semiconductor layer (active layer) of the thin film transistor and the diode is a single layer of a micro-crystal silicon layer, or the like, in the present embodiment and the embodiment to be described below, it may have a layered structure of a micro-crystal silicon layer and an amorphous silicon layer, for example. similarly, the gate electrode, the conductive layer, the source electrode, the intermediate electrode and the drain electrode also do not have to be formed by a single conductive layer such as a metal layer, but may have a layered structure of the same or different conductive layers.

The substrate for supporting the thin film transistor and the diode may be an insulative substrate such as a plastic substrate, instead of a glass substrate. Alternatively, a stainless substrate having an insulative film on the surface thereof may be used. The substrate does not have to be a transparent substrate.

Moreover, the thin film transistor and the diode of the present embodiment and the embodiment to be described below do not have to include a passivation film.

<Method for Manufacturing Semiconductor Device>

Next, an example of a method for manufacturing the semiconductor device shown in FIG. 19 will be described with reference to the drawings.

Figure 20:
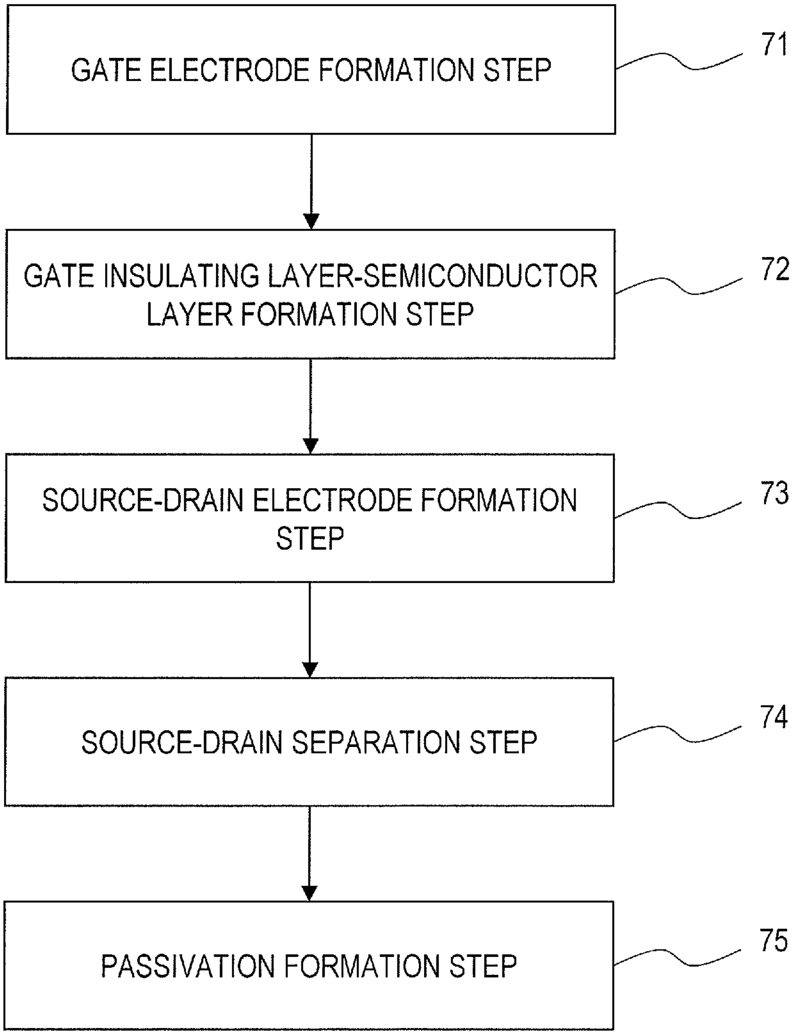
FIG. 20 A chart showing an example of a method for manufacturing a semiconductor device shown in FIG. 19.

As shown in FIG. 20, the method for manufacturing a semiconductor device includes a gate electrode formation step 71 of forming a gate electrode, a gate insulating layer-semiconductor layer formation step 72 of forming an island-like semiconductor layer to be the gate insulating layer and the active layer, a source-drain electrode formation step 73 of forming source and drain electrodes, a source-drain separation step 74 of electrically separating the source and drain electrodes from each other, and a passivation formation step 75.

Figure 21:
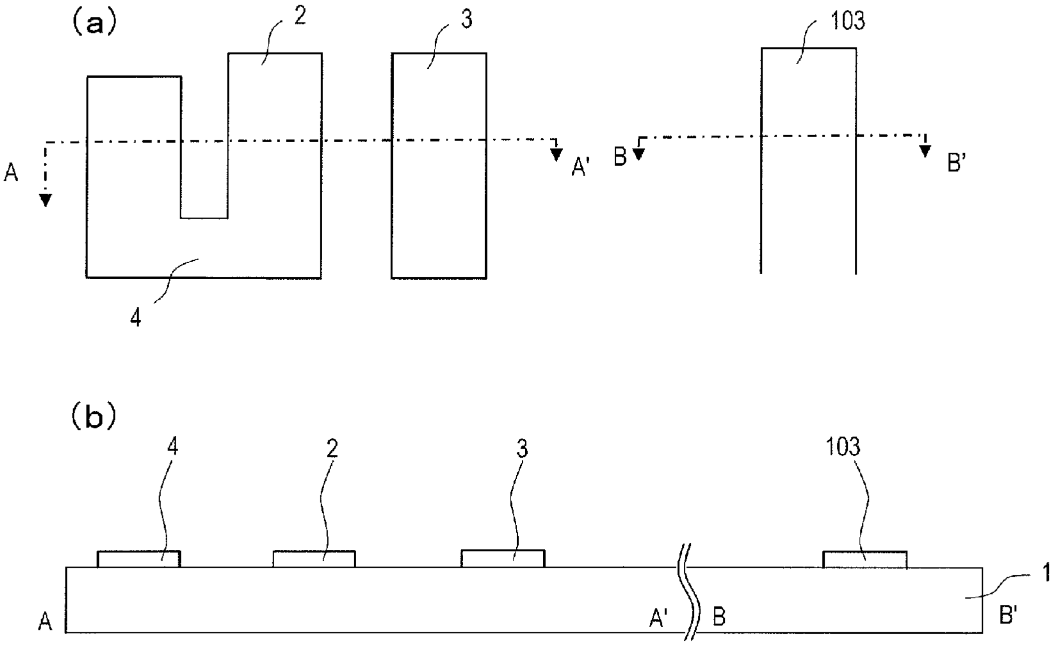
FIGS. 21 (*a*) and (*b*) are diagrams illustrating a step for manufacturing the semiconductor device shown in FIG. 19, wherein (*a*) is a plan view, and (*b*) is a cross-sectional view taken along line A-A' and line B-B' of (*a*).

Each step will now be described in detail with reference to FIGS. 21 to 24. FIGS. 21 to 24 are schematic diagrams illustrating the steps of the method for manufacturing a semiconductor device. FIG. 21(*a*) is a plan view, and FIG. 21(*b*) is a cross-sectional view taken along line A-A' and line B-B' shown in FIG. 21(*a*). This similarly applies to FIGS. 22 to 24, wherein (a) is a plan view, and (b) is a cross-sectional view taken along line A-A' and line B-B' of the corresponding plan view.

(1) Gate Electrode Formation Step 71

As shown in FIGS. 21(*a*) and 21(*b*), a gate metal film is formed on the substrate 1 and is patterned so as to form the gate electrode 103 of the thin film transistor 301, and the gate electrode 2, the conductive layer 3 and the connection line 4 of the diode 201. The connection line 4 and the gate electrode 2 are formed adjacent to each other within a single pattern. The conductive layer 3 is formed in a pattern separate from the gate electrode 2 and the connection line 4.

Specifically, first, molybdenum (Mo) is deposited to a thickness of 0.2 μm to form a gate metal film (not shown) on the substrate 1 such as a glass substrate by a sputtering method using an argon (Ar) gas. The temperature of the substrate 1 when forming the gate metal film is 200 to 300° C.

Then, a resist pattern film (not shown) of a photoresist material is formed on the gate metal film, and the gate metal film is patterned using the resist pattern film as a mask (photolithography step). This yields the gate electrode 103 of the thin film transistor 301, and the gate electrode 2, the conductive layer 3 and the connection line 4 of the diode 201. For example, a wet etching method is used for etching the gate metal film. A solution containing 10 to 80 wt % of phosphoric acid, 1 to 10 wt % of nitric acid, 1 to 10 wt % of acetic acid, and balance water may be used as the etchant. After the etching, the resist pattern film is removed using a remover containing organic alkali.

The material of the gate metal film may be a single metal such as indium tin oxide (ITO), tungsten (W), copper (Cu), chromium (Cr), tantalum (Ta), aluminum (Al) and titanium (Ti), as well as molybdenum (Mo), or a material obtained by mixing nitrogen, oxygen or another metal therewith. The gate metal film may be a single layer using the material listed above, or may have a layered structure. For example, the gate electrode 2 may be a Ti/Al/Ti layered film of titanium and aluminum, a Ti/Cu/Ti layered film of titanium and copper, or an Mo/Cu/Mo layered film of copper and molybdenum.

The method for forming the gate metal film may be a vapor deposition method, or the like, as well as the sputtering method. The thickness of the gate metal film is not limited to any particular value. The method for etching the gate metal film is not limited to the wet etching method described above, but may also be a dry etching method, or the like, using a combination of a chlorine ($Cl_2$) gas, a boron trichloride ($BCl_3$) gas, a $CF_4$ (carbon tetrafluoride) gas, $O_2$ (oxygen), etc.

(2) Gate Insulating Layer-Semiconductor Layer Formation Step 72

Figure 22:
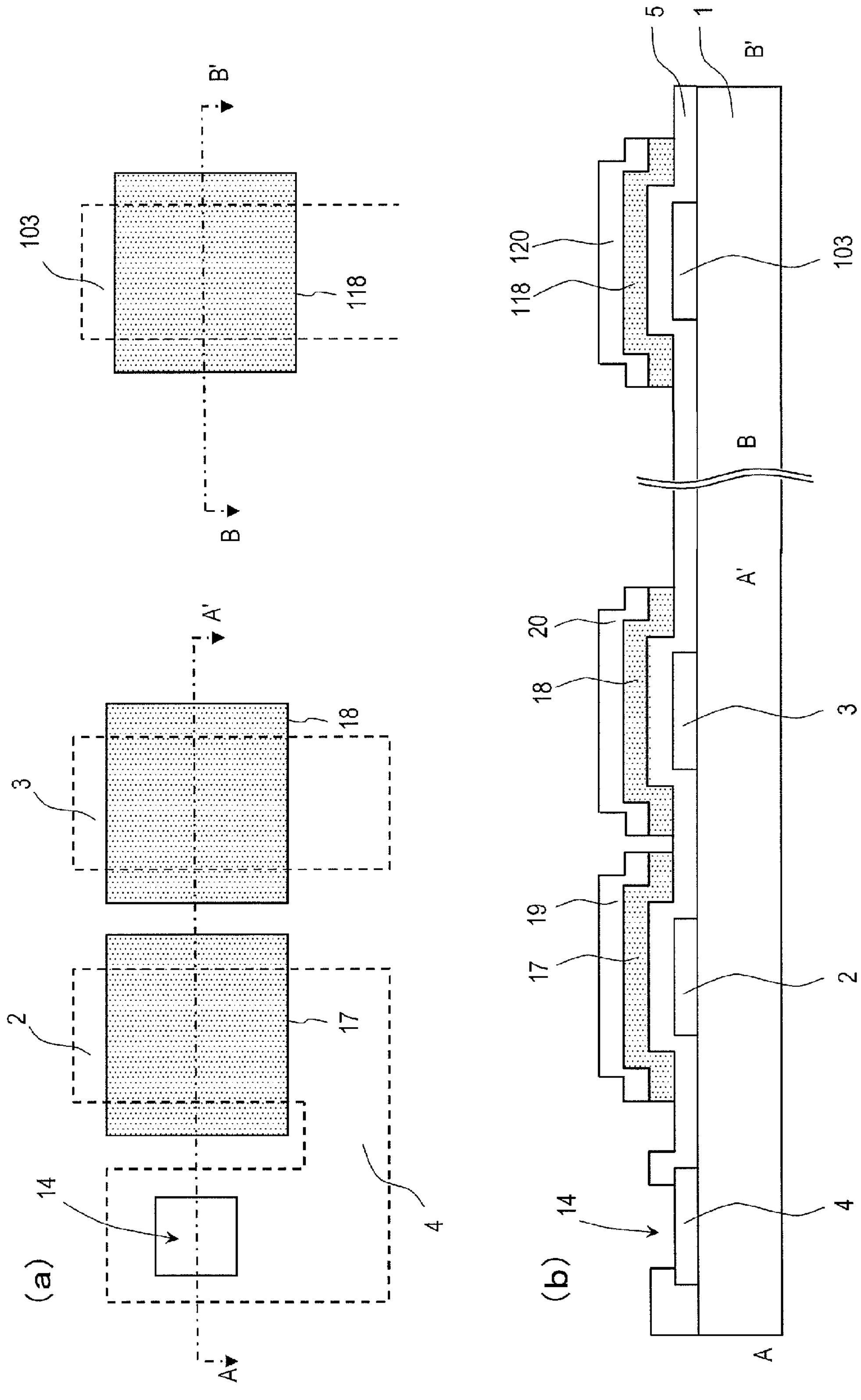
FIGS. 22 (*a*) and (*b*) are diagrams illustrating a step for manufacturing the semiconductor device shown in FIG. 19, wherein (*a*) is a plan view, and (*b*) is a cross-sectional view taken along line A-A' and line B-B' of (*a*).

Then, the gate insulating layer 5, a micro-crystalline silicon film and an $n^+$-type silicon film are formed in this order on the gate electrodes 2 and 103, the conductive layer 3 and the connection line 4, and the micro-crystalline silicon film and the $n^+$-type silicon film are patterned. This yields island-like micro-crystal silicon machined films 118, 17 and 18 and $n^+$-type silicon machined films 120, 19 and 20, as shown in FIGS. 22(*a*) and 22(*b*). Then, the contact hole 14 for exposing a portion of the connection line 4 therethrough is provided in the gate insulating layer 5.

Specifically, first, a gate insulating layer (thickness: 0.4 μm, for example) 5 made of silicon nitride ($SiN_x$) is formed by a plasma enhanced chemical vapor deposition (PECVD) method on the substrate 1 with the gate electrode 2, etc., formed thereon. In the present embodiment, the gate insulating layer 5 is formed under conditions of the substrate temperature: 250 to 300° C., the pressure: 50 to 300 Pa and the electric power density: 10 to 20 mW/cm$^2$, using a deposition chamber having a parallel plate (capacitive coupling) electrode structure. A mixed gas of silane ($SiH_4$), ammonium ($NH_3$) and nitrogen ($N_2$) is used as the deposition gas.

Then, a micro-crystalline silicon film (thickness: 0.12 μm for example) is formed by using the same chamber as the deposition chamber used for the formation of the gate insulating layer 5. In the present embodiment, the micro-crystalline silicon film is formed under conditions of the substrate temperature: 250 to 300° C., the pressure: 50 to 300 Pa and the electric power density: 1 to 30 mW/cm$^2$, using a silane gas diluted with a hydrogen gas as the deposition gas. The flow ratio between silane ($SiH_4$) and hydrogen ($H_2$) is 1:200 to 1:1000.

Moreover, an $n^+$-type silicon film (thickness: 0.05 μm for example) is formed using the same deposition chamber as that described above. In the present embodiment, the formation of the $n^+$-type silicon film is substantially the same as the formation of the micro-crystalline silicon film, but a mixed gas of silane ($SiH_4$), hydrogen ($H_2$) and phosphine ($PH_3$) is used as the deposition gas.

Then, a resist pattern film (not shown) of a photoresist material is formed on the gate insulating layer 5, and the micro-crystalline silicon film and the $n^+$-type silicon film are patterned using the resist pattern film as a mask (photolithography step). This yields the island-like micro-crystal silicon machined films 118, 17 and 18, and the $n^+$-type silicon machined films 120, 19 and 20. A dry etching method primarily using a chlorine ($Cl_2$) gas, for example, for etching the micro-crystalline silicon film and the $n^+$-type silicon film. After the etching, the resist pattern film is removed using a remover containing organic alkali.

Moreover, a resist pattern film (not shown) of a photoresist material is formed, and the contact hole 14 is formed in the gate insulating layer 5 using the resist pattern film as a mask (photolithography step). A dry etching method using a combination of $CF_4$ (carbon tetrafluoride) gas, $O_2$ (oxygen), etc., for example, may be used for the formation of the contact hole 14. After the etching, the resist pattern film is removed using a remover containing organic alkali.

(3) Source-Drain Electrode Formation Step 73

A conductive film, to be used for forming the source-drain electrode, is formed on the $n^+$-type silicon machined films 120, 19 and 20 and the gate insulating layer 5. In the present embodiment, a conductive film (thickness: 0.2 μm for example) is formed by depositing molybdenum to a thickness of 0.2 μm on the surface of the substrate 1 by a sputtering method using an argon (Ar) gas. The substrate temperature during the formation of the conductive film is 200 to 300° C.

Figure 23:
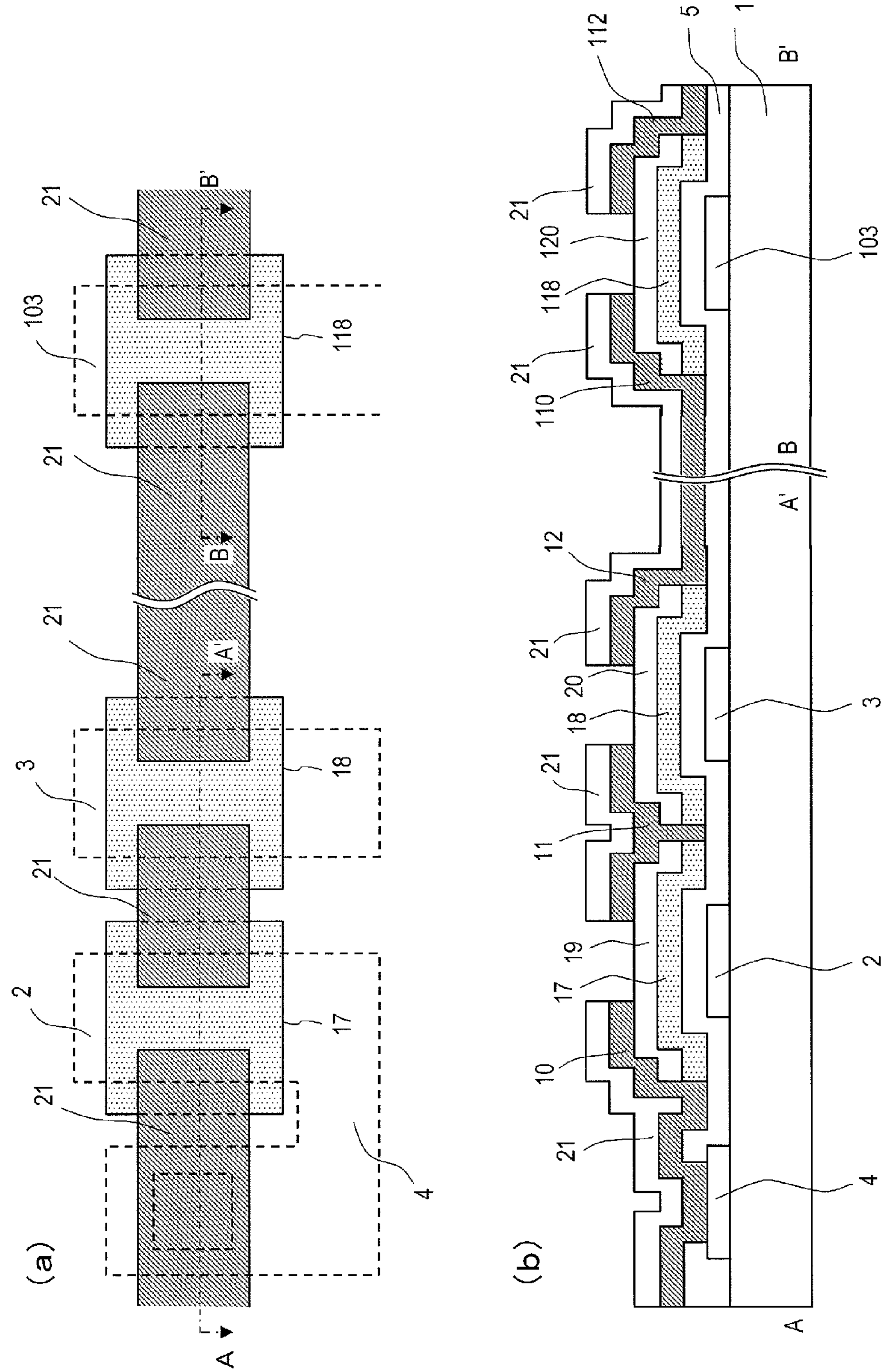
FIGS. 23 (*a*) and (*b*) are diagrams illustrating a step for manufacturing the semiconductor device shown in FIG. 19, wherein (*a*) is a plan view, and (*b*) is a cross-sectional view taken along line A-A' and line B-B' of (*a*).

Then, as shown in FIGS. 23(*a*) and 23(*b*), a resist pattern film 21 is formed on the conductive film on the conductive film, and the conductive film is patterned using this as a mask, thus obtaining the source electrode 110 and the drain electrode 112 of the thin film transistor 301, and the source electrode 10, the intermediate electrode 11 and the drain electrode 12 of the diode 201.

The conductive film can be patterned using a wet etching method, for example. In the present embodiment, a solution containing 10 to 80 wt % of phosphoric acid, 1 to 10 wt % of nitric acid, 1 to 10 wt % of acetic acid and balance water is used as the etchant. The resist pattern film 21 on the source electrode 10, the intermediate electrode 11 and the drain electrode 12 is not removed even after the etching and is left unremoved through the following step.

The material of the conductive film may be a single metal such as indium tin oxide (ITO), tungsten (W), copper (Cu), chromium (Cr), tantalum (Ta), aluminum (Al) and titanium (Ti), as well as molybdenum (Mo), or a material obtained by mixing nitrogen, oxygen or another metal therewith. The source electrode 10 may be a single layer using the material listed above, or may have a layered structure. For example, the conductive film may be a Ti/Al/Ti layered film of titanium and aluminum, a Ti/Cu/Ti layered film of titanium and copper, or an Mo/Cu/Mo layered film of copper and molybdenum.

The method for forming the conductive film may be a vapor deposition method, or the like, as well as the sputtering method. The method for forming the conductive film is also not limited to a wet etching using an etchant described above. Moreover, the thickness of the conductive film is not limited to the thickness described above.

(4) Source-Drain Separation Step 74

Figure 24:
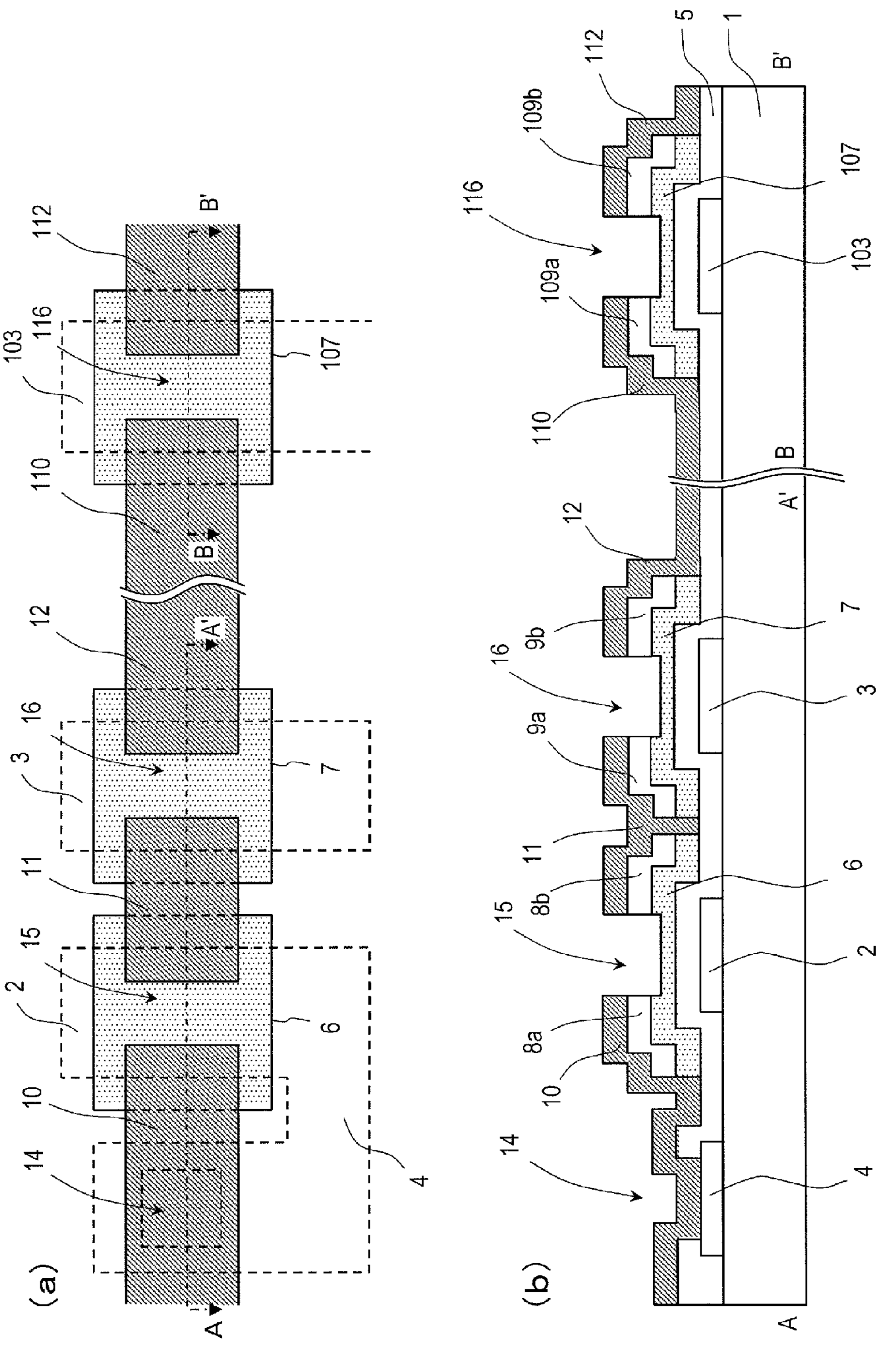
FIGS. 24 (*a*) and (*b*) are diagrams illustrating a step for manufacturing the semiconductor device shown in FIG. 19, wherein (*a*) is a plan view, and (*b*) is a cross-sectional view taken along line A-A' and line B-B' of (*a*).

Then, as shown in FIGS. 24(*a*) and 24(*b*), a portion of the $n^+$-type silicon machined film 120 that is covered by neither of the source electrode 110 and the drain electrode 112 is removed, thereby forming the gap portion 116. Similarly, portions of the $n^+$-type silicon machined films 19 and 20 that are covered by none of the source electrode 10, the intermediate electrode 11 and the drain electrode 12 are removed, thereby forming the gap portions 15 and 16, respectively. In this process, portions of the micro-crystal silicon machined films 118, 17 and 18 that are located in the gap portions 116, 15 and 16 will be thinner than other portions due to overetching. Thus, the micro-crystal silicon layer 107 and the contact layers 109*a* and 109*b* are obtained from the micro-crystal silicon machined film 118 and the $n^+$-type silicon machined film 120. Similarly, the micro-crystal silicon layers 6 and 7 and the contact layers 8*a*, 8*b*, 9*a* and 9*b* are obtained from the micro-crystal silicon machined films 17 and 18 and the $n^+$-type silicon machined films 19 and 20, respectively. After the etching, the resist pattern film 21 is removed.

In the present embodiment, a dry etching method using a chlorine ($Cl_2$) gas is used for etching the $n^+$-type silicon machined films 120, 19 and 20. After the etching, the resist pattern film 21 is removed using a remover containing organic alkali. The etching method is not limited to the method described above.

(5) Passivation Formation Step 75

Then, the passivation 13 made of silicon nitride ($SiN_x$) is formed so as to cover the source electrode 110, the drain electrode 112, the gap portion 116, and the surrounding area of the thin film transistor 301, and the source electrode 10, the intermediate electrode 11, the drain electrode 12, the gap portions 15 and 16, and the surrounding area of the diode 201. This yields the semiconductor device shown in FIGS. 19(*a*) and 19(*b*).

Specifically, the passivation 13 (thickness: 0.3 μm for example) made of silicon nitride ($SiN_x$) is formed by a plasma enhanced chemical vapor deposition (PECVD) method. In the present embodiment, the passivation 13 is formed under conditions of the substrate temperature: 200° C., the pressure: 50 to 300 Pa and the electric power density: 10 to 20 mW/cm$^2$, using a deposition chamber having a parallel plate (capacitive coupling) electrode structure. A mixed gas of silane ($SiH_4$), ammonium ($NH_3$) and nitrogen ($N_2$) is used as the deposition gas.

Although not shown in the drawings, openings through which an electric signal such as a predetermined voltage is input to the source electrodes 110 and 10, the drain electrodes 112 and 12, etc., may be provided as necessary in the passivation 13.

With the diode of the present embodiment, it is possible to obtain similar effects to those of the diode shown in FIG. 19 as long as a current path including the channel region and the resistive region of the semiconductor layer is formed in the ON state. For example, the diode may include three or more island-like micro-crystal silicon layers. Also in this case, similar effects to those described above can be obtained as long as at least one micro-crystal silicon layer does not overlap with the gate electrode, while the other micro-crystal silicon layers have a channel region where they overlap with the gate electrode. In the example shown in FIG. 19, the semiconductor layer (the micro-crystal silicon layers 6 and 7) and the contact layers 8*a*, 8*b*, 9*a* and 9*b* are in an island-like pattern, but they do not have to be in an island-like pattern. Moreover, the diode 201 does not have to include the conductive layer 3.

The configuration of the thin film transistor is also not limited to the configuration shown in FIG. 19. Although the thin film transistor 301 shown in FIG. 19 includes one gate electrode 103, it may include a plurality of gate electrodes. In this case, one island-like micro-crystal silicon layer may be placed over each gate electrode, or one micro-crystal silicon layer may be arranged so as to overlap with a plurality of gate electrodes. Alternatively, as will be later described in detail, a plurality of channel regions may be formed in a micro-crystal silicon layer placed over one gate electrode.

Thus, where a portion of the semiconductor layer that forms the current path does not partly overlap with the gate electrode, even if a positive potential is given to the first electrode, a positive potential is not given to a portion of the semiconductor layer that is not overlapping with the gate electrode through the gate electrode, whereby electrons, which are mobile charges, do not accumulate, and the electrical resistance of this portion does not decrease. Therefore, a portion that is not overlapping with the gate electrode has an electrical resistance as it is connected directly to the channel region.

Therefore, by adjusting the size (area) of a portion of the semiconductor layer that is not overlapping with the gate electrode, it is possible to give the diode a series-connection electrical resistance of an appropriate magnitude. It is also possible to realize characteristics equivalent to those of the conventional protection diode using amorphous silicon.

A portion of the semiconductor layer of the diode that is not overlapping with the gate electrode may be placed over the conductive layer not connected to the first electrode of the diode. The "conductive layer" as used herein is, for example, a layer that is formed by the same conductive film as the gate electrode and is in an open state (floating state). Particularly, where the present invention is applied to a display device, it is preferred that the conductive layer is provided below a portion of the semiconductor layer that is not overlapping with the gate electrode, in which case it is possible, with the conductive layer, to suppress changes in characteristics (optical deterioration) of the semiconductor layer due to light from the backlight.

The thin film transistors 301 and 302 and the diodes 201, 202 and 204 may use an amorphous silicon layer or a polycrystalline silicon layer as the active layer, instead of a micro-crystal silicon layer. A film made of a metal oxide semiconductor such as a Zn—O semiconductor (ZnO) film, an In—Ga—Zn—O semiconductor (IGZO) film, an In—Zn—O semiconductor (IZO) film and a Zn—Ti—O semiconductor (ZTO) film may be used as the active layer. In this case, the contact layers 25$a$, 25$b$, 25$d$, 25$e$, 109$a$ and 109$b$ are not necessary, and the active layer and the source-drain electrode can be electrically connected to each other directly. Particularly, where a metal oxide semiconductor such as IGZO is used, the mobility exceeds 4 $cm^2/Vs$, and it is therefore possible to obtain even better effects by applying the present invention.

Note however that where a polycrystalline silicon film and an amorphous silicon film are used, there is little advantage in forming the resistive region. This is because where a polycrystalline silicon film is used, adjustments such as increasing the resistance of the diode can be made easily by adjusting the concentration of an impurity with which a portion of the semiconductor layer of the diode is doped. Also, where an amorphous silicon film is used, the resistance of the diode is sufficiently high, and it is often not necessary to significantly reduce the current of the diode.

Figure 25:
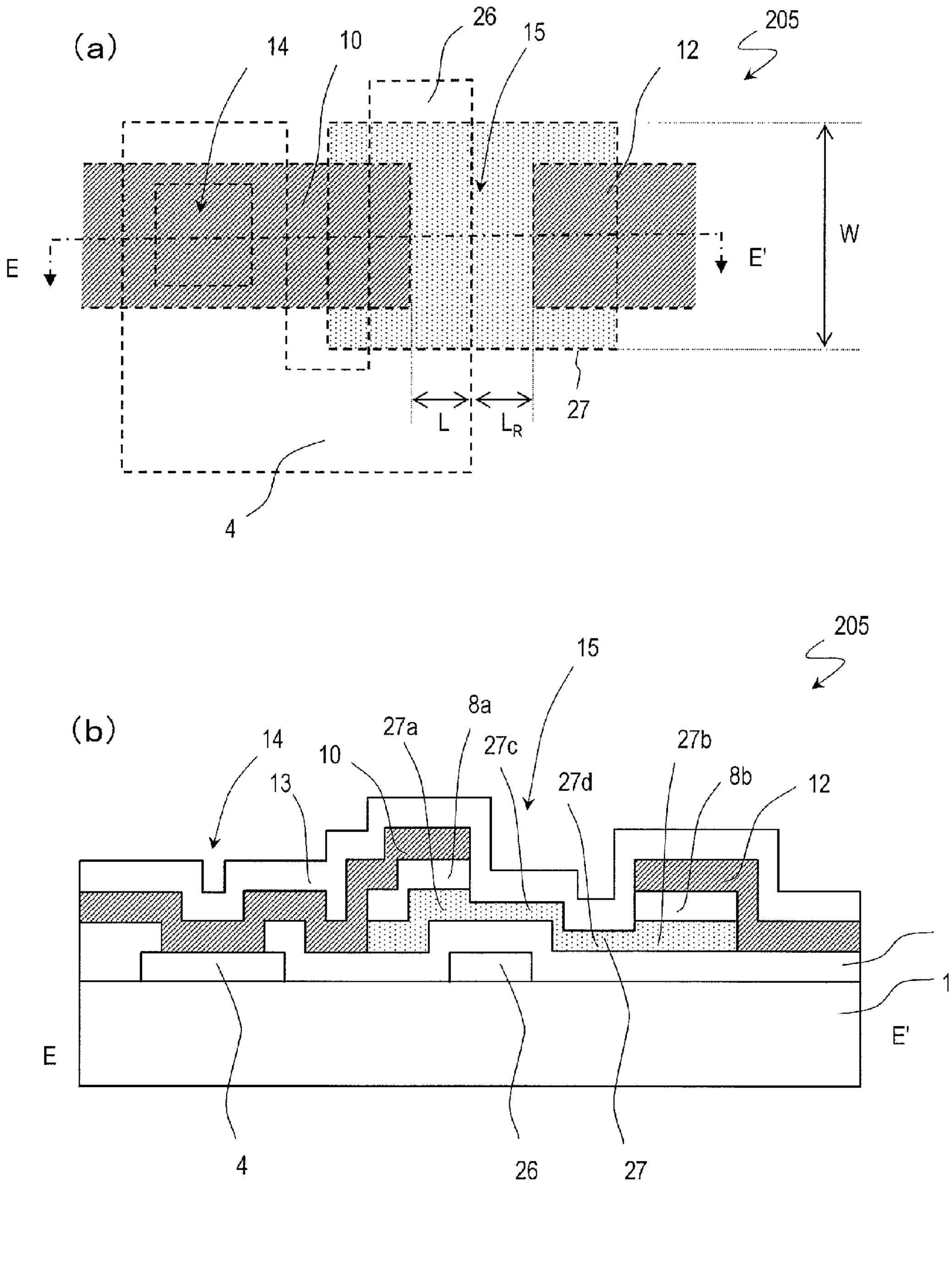
FIG. 25 (*a*) is a plan view schematically showing still another diode of the first embodiment of the present invention, and (*b*) is a cross-sectional view taken along line E-E' of (*a*).

FIG. 25 is a diagram schematically showing another diode of the present embodiment, wherein FIG. 25($a$) is a plan view of the other diode, and FIG. 25($b$) is a cross-sectional view taken along line E-E' of FIG. 25($a$). The diode shown in FIG. 25 is different from the diode 201 shown in FIG. 19 in that it is formed by using one island-like semiconductor layer. For the sake of simplicity, like elements to those of the diode 201 shown in FIG. 19 are denoted by like reference numerals, and will not be further described below.

A diode 205 is a reverse-staggered channel-etched TFT which has a bottom-gate structure, with the gate electrode and the source electrode connected to each other. Although not shown in the drawings, it further includes a TFT on the same substrate as the diode 205. This TFT may include an active layer formed by using the same micro-crystalline silicon film as that of a micro-crystal silicon layer 27 of the diode 205, and may have a similar configuration to that of the thin film transistor 301 shown in FIGS. 19($a$) and 19($b$), for example.

The diode 205 includes the substrate 1 such as a glass substrate, a gate electrode 26 formed on the substrate 1, the gate insulating layer 5 formed on the substrate 1 so as to cover the gate electrode 26, the micro-crystal silicon layer 27 formed on the gate insulating layer 5, the source electrode 10 formed on the micro-crystal silicon layer 27 with the contact layer 8$a$ interposed therebetween, and the drain electrode 12 formed on the micro-crystal silicon layer 27 with the contact layer 8$b$ interposed therebetween.

The micro-crystal silicon layer 27 includes a channel region 27$c$, and first and second regions 27$a$ and 27$b$ located on opposite sides of the channel region 27$c$. The first region 27$a$ is electrically connected to the source electrode 10 by the contact layer 8$a$. A second region 27$b$ is electrically connected to the drain electrode 12 by the contact layer 8$b$.

The channel region 27$c$ is placed so as to overlap with the gate electrode 26, and the conductivity of the channel region 27$c$ can be controlled by the voltage applied to the gate electrode 26. The micro-crystal silicon layer 27 is located between the first and second regions 27$a$ and 27$b$, and includes a portion (resistive region) 27$d$ that is not overlapping with the gate electrode 26. The resistive region 27$d$ serves as a resistor because the resistance thereof is not reduced even if a voltage is applied to the gate electrode 26. While the lengths L and $L_R$ of the channel region 27$c$ and the resistive region 27$d$ in the channel direction are adjusted as necessary, when the channel width W is 10 μm, for example, the length (channel length) L of the channel region 27$c$ is 3 μm and the length $L_R$ of the resistive region 27$d$ is 3 μm. In the example shown in FIG. 25, the second region 27$b$ is also not overlapping with the gate electrode 26, and therefore the second region 27$b$ also serves as a resistor.

In the example shown in FIG. 25, the contact layers 8$a$ and 8$b$, the source electrode 10 and the drain electrode 12 are patterned so as not to lie over the channel region 27$c$ and the resistive region 27$d$, thereby forming the gap portion 15 over the channel region 27$c$ and the resistive region 27$d$. The gate electrode 26, the connection line 4 and the gate electrode (not shown) of the TFT are formed by the same conductive film. The gate electrode 26 is connected to the connection line 4, and the connection line 4 is electrically connected to the source electrode 10 in the contact hole 14, which is an opening provided in the gate insulating layer 5.

The materials of the micro-crystal silicon layer 27, the contact layers 8$a$ and 8$b$ and the passivation 13 of the diode 205 may be similar to the materials of the corresponding elements of the diode 201 shown in FIG. 19.

In the diode 205, a current flows primarily between the source electrode 10 and the drain electrode 12. Then, the current flows through the first region 27$a$, the channel region 27$c$, the resistive region 27$d$ and the second region 27$b$ of the micro-crystal silicon layer 27 from the source electrode 10 via the contact layer 8$a$. Then, it flows via the contact layer 8$b$ to reach the drain electrode 12.

Also in the example shown in FIG. 25, since the gate electrode 26 is not placed under the resistive region 27$d$ and the second region 27$b$ of the micro-crystal silicon layer 27, electrons, which are mobile charges, do not accumulate even if a voltage is applied to the gate electrode 26. Therefore, the resistive region 27$d$ and the second region 27$b$ always have a high resistance without being substantially influenced by the potential of the gate electrode 26. It is possible to realize characteristics suitable for the application of the diode 205 by providing such a high-resistance region 27$d$ in the micro-crystal silicon layer 15, making it more difficult for a current to flow between the source electrode 10 and the drain electrode 12.

The diode described above is only required to include at least one semiconductor layer having both the channel region 27$c$ and the resistive region 27$d$, and it may include two or more semiconductor layers including such a semiconductor layer. In this case, the two or more semiconductor layers may be connected together by an intermediate electrode provided on the semiconductor layer.

The semiconductor device shown in FIG. 25 can be produced by a method similar to that described above with reference to FIGS. 20 to 24.

Figure 26:
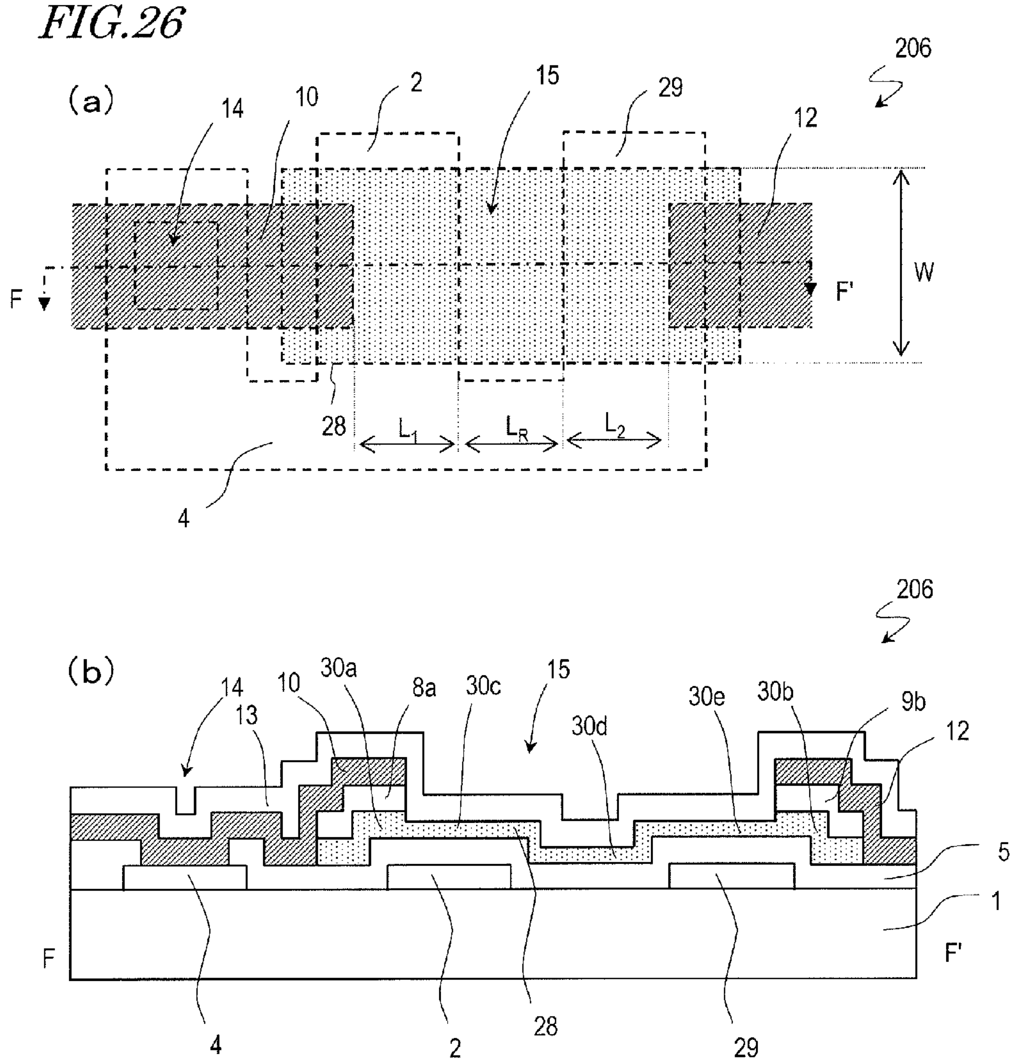
FIG. 26 (*a*) is a plan view schematically showing still another diode of the first embodiment of the present invention, and (*b*) is a cross-sectional view taken along line F-F' of (*a*).

FIG. 26 is a diagram showing another diode of the present embodiment, wherein FIG. 26($a$) is a plan view, and FIG. 26($b$) is a cross-sectional view taken along line F-F' of FIG. 26($a$). The diode shown in FIG. 26 is different from the diode 201 shown in FIG. 19 in that two gate electrodes are provided under the semiconductor layer of the diode, and also that no intermediate electrode is provided between the source electrode and the drain electrode of the diode. For the sake of simplicity, like elements to those of the diode 201 shown in FIG. 19 are denoted by like reference numerals, and will not be further described below.

The thin film transistor 206 is a reverse-staggered channel-etched TFT which has a bottom-gate structure, with the gate electrode and the source electrode connected to each other. Although not shown in the figures, a reverse-staggered channel-etched TFT which has a bottom-gate structure is provided on the same substrate as the diode 206. This TFT may include an active layer formed by using the same micro-crystalline silicon film as that of the micro-crystal silicon layer of the diode 206, and may have a similar configuration to that of the thin film transistor 301 shown in FIGS. 19($a$) and 19($b$), for example.

The diode 206 includes the substrate 1 such as a glass substrate, the gate electrodes 2 and 29 placed on the substrate 1 with an interval therebetween, the gate insulating layer 5 formed on the substrate 1 so as to cover the gate electrodes 2 and 29, a micro-crystal silicon layer 30 formed on the gate insulating layer 5, the source electrode 10 formed on the micro-crystal silicon layer 30 with the contact layer 8*a* interposed therebetween, and the drain electrode 12 formed on the micro-crystal silicon layer 30 with the contact layer 9*b* interposed therebetween. The gate electrode 2 and the gate electrode 29 are electrically connected to the source electrode 10 via the connection electrode 4 and the contact hole 14.

The micro-crystal silicon layer 30 includes channel regions 30*c* and 30*e*, a resistive region 30*d* located between the channel regions 30*c* and 30*e*, and first and second regions 30*a* and 30*b* located on opposite sides of the channel regions 30*c* and 30*e*. The first region 30*a* is electrically connected to the source electrode 10 by the contact layer 8*a*. The second region 30*b* is electrically connected to the drain electrode 12 by the contact layer 9*b*.

The channel region 30*c* is placed so as to overlap with the gate electrode 2, and the conductivity of the channel region 30*c* can be controlled by the voltage applied to the gate electrode 2. Similarly, the channel region 30*e* is placed so as to overlap with the gate electrode 29, and the conductivity of the channel region 30*e* can be controlled by the voltage applied to the gate electrode 29. On the other hand, the resistive region 30*d* is not overlapping with the gate electrodes 2 and 29, and serves as a resistor because the resistance thereof is not reduced even if a voltage is applied to the gate electrodes 2 and 29.

While the lengths $L_1$, $L_2$ and $L_R$ of the channel regions 30*c* and 30*e* and the resistive region 30*d* in the channel direction are adjusted as necessary, when the channel width W is 10 μm, the total length of the channel regions 30*c* and 30*e* (channel length L: $L=L_1+L_2$) is 6 μm, and the length $L_R$ of the resistive region 30*d* is 3 μm.

The materials of the micro-crystal silicon layer 30, the contact layers 8*a* and 9*b* and the passivation 13 of the diode 206 may be similar to the materials of the corresponding elements of the diode 201 shown in FIG. 19.

In the diode 206, a current flows primarily between the source electrode 10 and the drain electrode 12. Then, the current flows through the first region 30*a*, the channel region 30*c*, the resistive region 30*d*, the channel region 30*e* and the second region 30*b* of the micro-crystal silicon layer 30, in this order, from the source electrode 10 via the contact layer 8*a*. Then, it flows via the contact layer 9*b* to reach the drain electrode 12.

Also with the diode 206, since the gate electrodes 2 and 29 are not placed under the resistive region 30*d* of the micro-crystal silicon layer 30, the resistive region 30*d* always has a high resistance without being substantially influenced by the potential of the gate electrodes 2 and 29. It is possible to realize characteristics suitable for the application of the diode 206 by providing such a region 30*d* of a high resistance in the micro-crystal silicon layer 30 to make it less easy for a current to flow between the source electrode 10 and the drain electrode 12.

The semiconductor device shown in FIG. 26 can also be produced by a method similar to that described above with reference to FIGS. 20 to 24.

Figure 27:
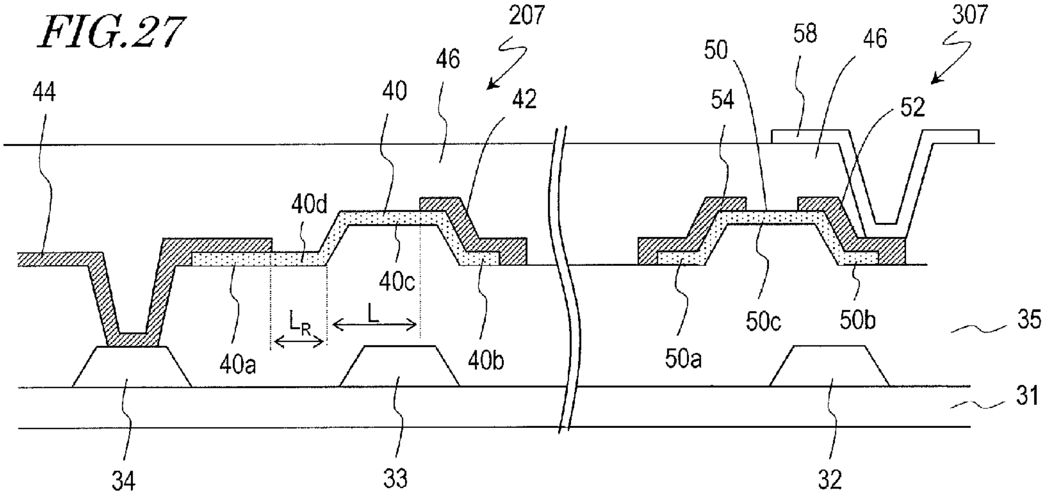
FIG. 27 A schematic cross-sectional view showing still another semiconductor device of the first embodiment of the present invention.

FIG. 27 is a cross-sectional view showing still another semiconductor device of the present embodiment. In the example shown in FIG. 27, the configuration is different from that shown in FIG. 19 in that the active layers of the diode and the thin film transistor are formed by using an In—Ga—Zn—O semiconductor (IGZO) film and also that the contact layer is absent.

The semiconductor device includes a substrate 31, and a diode 207 and a thin film transistor 307 formed on the substrate 31. The diode 207 and the thin film transistor 307 are formed by using the same IGZO film. The thin film transistor 207 is a reverse-staggered channel-etched TFT which has a bottom-gate structure, and the diode 307 has a structure based on a reverse-staggered channel-etched TFT which has a bottom-gate structure, with the gate electrode and the source electrode connected to each other.

The thin film transistor 307 includes a gate electrode 32 formed on the substrate 31, a gate insulating layer 35 formed so as to cover the gate electrode 32, an IGZO layer 50 formed on the gate insulating layer 35, and a source electrode 54 and a drain electrode 52 formed on the IGZO layer 50.

The IGZO layer 50 includes a channel region 50*c*, and a source region 50*a* and a drain region 50*b* located on opposite sides of the channel region 50*c*. The source region 50*a* is in contact with the source electrode 54. The drain region 50*b* is in contact with the drain electrode 52.

The diode 207 includes a gate electrode 33 and a connection line 34 formed on the substrate 31, the gate insulating layer 35 formed so as to cover the gate electrode 33 and the connection line 34, an IGZO layer 40 placed on the gate insulating layer 35 so as to overlap with the gate electrode 33, a first electrode (source electrode) 44 formed on the IGZO layer 40, and a second electrode (drain electrode) 42 formed on the IGZO layer 40.

The IGZO layer 40 includes a channel region 40*c*, and first and second regions 40*a* and 40*b* located on opposite sides of the channel region 40*c*. The channel region 40*c* is placed so as to overlap with the gate electrode 33, and the conductivity of the channel region 40*c* can be controlled by the voltage applied to the gate electrode 33. The first region 40*a* is electrically connected to the source electrode 44. The second region 40*b* is in contact with the drain electrode 42.

The IGZO layer 40 further includes a portion (resistive region) 40*d* that is located between the first and second regions 40*a* and 40*b* and is not overlapping with the gate electrode 33. The resistive region 40*d* serves as a resistor because it has a high resistance irrespective of the voltage applied to the gate electrode 33. In the example shown in FIG. 27, the first region 40*a* is also not overlapping with the gate electrode 33, and therefore the first region 40*a* also serves as a resistor.

The gate electrodes 32 and 33 and the connection line 34 are formed from the same conductive film. The gate electrode 33 is connected to the connection line 34, and the connection line 34 is electrically connected to the source electrode 44 in a contact hole, which is an opening provided in the gate insulating layer 35.

The IGZO layers 50 and 40 in the thin film transistor 307 and the diode 207 are formed from the same IGZO film. The IGZO film is a film containing In:Ga:Zn at a ratio of 2:2:1, for example. Other metal oxide semiconductor films may be used instead of the IGZO film.

A passivation 46 is provided on an upper portion of the electrodes 52, 54, 42 and 44 in the thin film transistor 307 and the diode 207. A pixel electrode 58 is provided on the passivation 46. The pixel electrode 58 is electrically connected to the drain electrode 52 in the contact hole formed in the passivation 46.

The diode 207 and the thin film transistor 307 are manufactured as follows, for example.

First, a conductive film such as a molybdenum (Mo) film is formed on the substrate 31 by a sputtering method. The conductive film is patterned by wet etching or dry etching, thereby forming the gate electrodes 32 and 33 and the connection line 34.

Then, as the gate insulating layer 35, a silicon nitride (SiNx) film is formed by a PECVD method. The thickness of the gate insulating layer 35 is 450 nm, for example. An opening is formed in the gate insulating layer 35, through which a portion of the surface of the connection line 34 is exposed. As the gate insulating layer 35, a silicon oxide (SiOx) film may be used instead of an SiNx film, or a layered film of an SiOx film and an SiNx film may be used.

An IGZO film (thickness: 70 nm for example) is formed by a sputtering method on the gate insulating layer 35 and in the opening of the gate insulating layer 35, and is patterned to form the IGZO layers 40 and 50.

Then, a conductive film such as an Mo film is formed by a sputtering method so as to cover the IGZO layers 40 and 50, and is patterned. This yields the source electrodes 44 and 54 and the drain electrodes 42 and 52. The patterning in this step may be wet etching or dry etching. When wet etching is used, surface portions of the IGZO layers 40 and 50 in the channel regions 40*c* and 50*c* are also etched. Therefore, the thickness of the channel regions 40*c* and 50*c* becomes about 55 nm.

Then, a silicon oxide (SiOx) film is formed by a PECVD method as the passivation 46. The thickness of the passivation 46 is 200 nm, for example. An opening is formed in the passivation 46 through which a portion of the surface of the source electrode 52 is exposed.

Then, an IZO film is formed on the passivation 46 and in the opening of the passivation 46, and is patterned to form the pixel electrode 58. This yields the diode 207 and the thin film transistor 307.

Where the channel width of the thin film transistor 307 is 30 μm and the channel length L is 4 μm, for example, the mobility of the thin film transistor 307 is 4.2 $cm^2/Vs$, for example, and the threshold value is about −1.3 V, and the S value is about 0.9 (V/dec). The channel width of the diode 207 is set to 30 μm, the channel length L to 3 μm, and the resistive region the length $L_R$ to 3 μm. The lengths L and $L_R$ of the diode 207 are adjusted as necessary depending on the application of the diode 207.

An etch stop layer may be provided on the IGZO layer of the thin film transistor 307 and the diode 207.

[Configuration of Thin Film Transistor (Multi-Channel TFT)]

A thin film transistor of the present embodiment will now be described with reference to the drawings. Although a TFT including a micro-crystalline silicon film as the active layer will be described hereinbelow as an example, the present invention is not limited to this.

Figure 28:
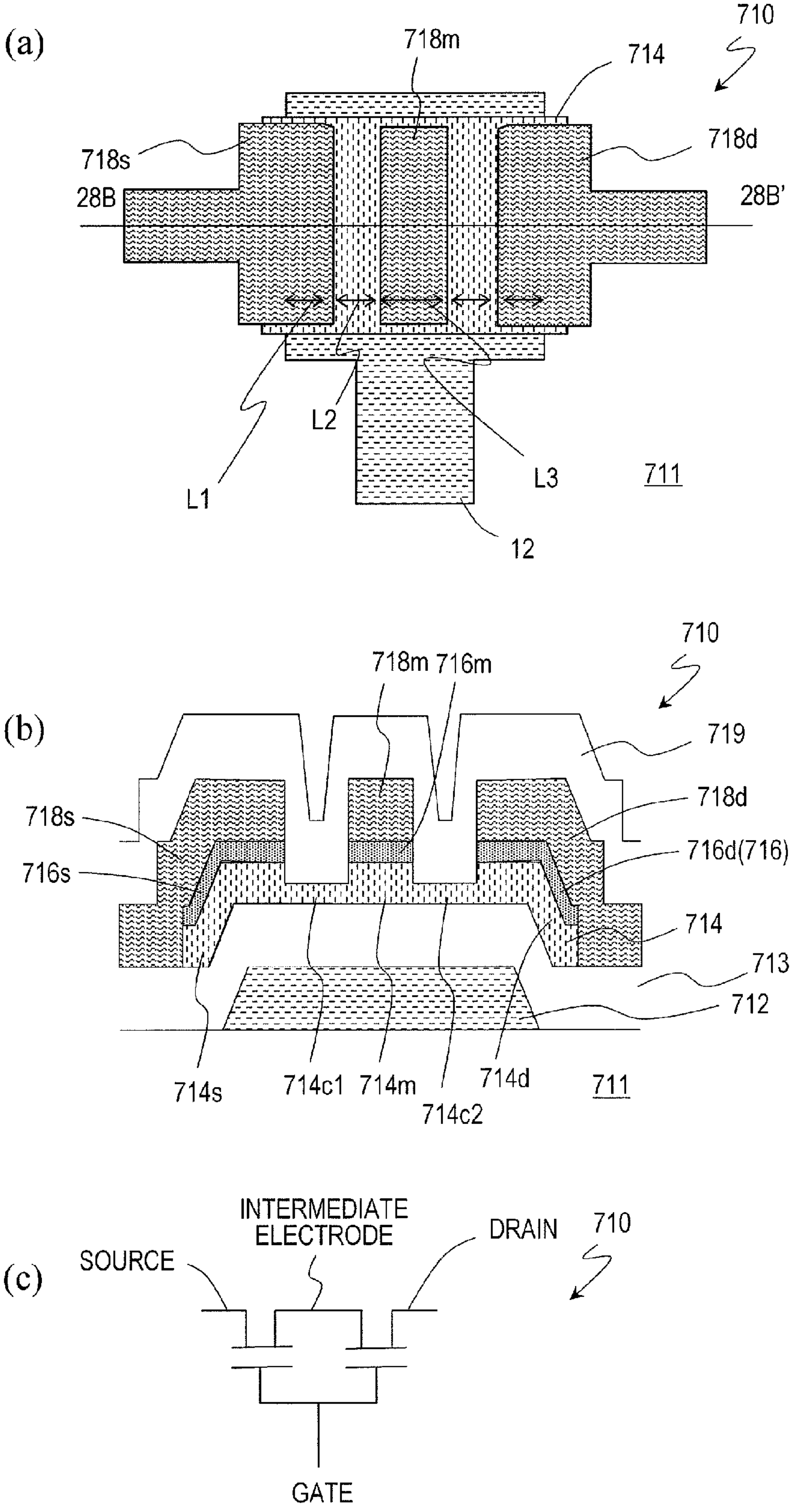
FIG. 28 (*a*) is a schematic plan view showing a thin film transistor 710 of the first embodiment of the present invention, (*b*) is a schematic cross-sectional view taken along line 28B-28B' of (*a*), and (*c*) is an equivalent circuit diagram of the thin film transistor 710.

FIG. 28 is a diagram schematically showing a thin film transistor 710 of an embodiment of the present invention. FIG. 28(*a*) is a schematic plan view of the thin film transistor 710, FIG. 28(*b*) is a schematic cross-sectional view taken along line 28B-28B' of FIG. 28(*a*), and FIG. 28(*c*) is an equivalent circuit diagram of the thin film transistor 710.

The thin film transistor 710 has a dual-channel structure, and has a structure that is electrically equivalent to two TFTs connected in series as shown in the equivalent circuit diagram of FIG. 28(*c*).

The thin film transistor 710 includes an active layer 714 supported by a substrate (e.g., a glass substrate) 711. The active layer 714 is a semiconductor layer, and herein includes a micro-crystalline silicon film. The active layer 714 includes channel regions 714*c*1 and 714*c*2, a source region 714*s*, a drain region 714*d*, and an intermediate region 714*m* formed between the two channel regions 714*c*1 and 714*c*2. Although an example where there are one intermediate region 714*m* and two channel regions 714*c*1 and 714*c*2 is illustrated herein, the present invention is not limited to this, and there may be two or more intermediate regions and three or more channel regions.

The thin film transistor 710 further includes: a contact layer 716 including a source contact region 716*s* in contact with the source region 714*s*, a drain contact region 716*d* in contact with the drain region 714*d* and an intermediate contact region 716*m* in contact with the intermediate region 714*m*; a source electrode 718*s* in contact with the source contact region 716*s*; a drain electrode 718*d* in contact with the drain contact region 716*d*; an intermediate electrode 718*m* in contact with the intermediate contact region 716*m*; and a gate electrode 712 opposing the two channel regions 714*c*1 and 714*c*2 and the intermediate region 714*m* with a gate insulating film 713 interposed therebetween. The intermediate electrode 718*m* is a so-called floating electrode which does not form an electric connection anywhere. The thin film transistor 710 further includes a protection film 719 covering these.

The first channel region 714*c*1 is formed between a source region 714*s* and the intermediate region 714*m*, and the second channel region 714*c*2 is formed between a drain region 714*d* and the intermediate region 714*m*. The two channel regions 714*c*1 and 714*c*2, the source region 714*s*, the drain region 714*d*, and the intermediate region 714*m* are all formed in a single continuous active layer 714. The entirety of a portion of the intermediate electrode 718*m* that is present between the first channel region 714*c*1 and the second channel region 714*c*2 overlaps with the gate electrode 712 with the intermediate region 714*m* and the gate insulating film 713 interposed therebetween.

Although the entirety of the intermediate electrode 718*m* herein overlaps with the gate electrode 712 with the intermediate region 714*m* and the gate insulating film 713 interposed therebetween, the present invention is not limited to this. For example, where the intermediate electrode 718*m* is provided so as to extend to the outside of the region between the first channel region 714*c*1 and the second channel region 714*c*2 which are located on opposite sides thereof, e.g., where it extends in the up-down direction in FIG. 28(*a*), the portion that is present outside of the region between the first channel region 714*c*1 and the second channel region 714*c*2 does not need to overlap with the gate electrode 712 with the intermediate region 714*m* and the gate insulating film 713 interposed therebetween.

Figure 29:
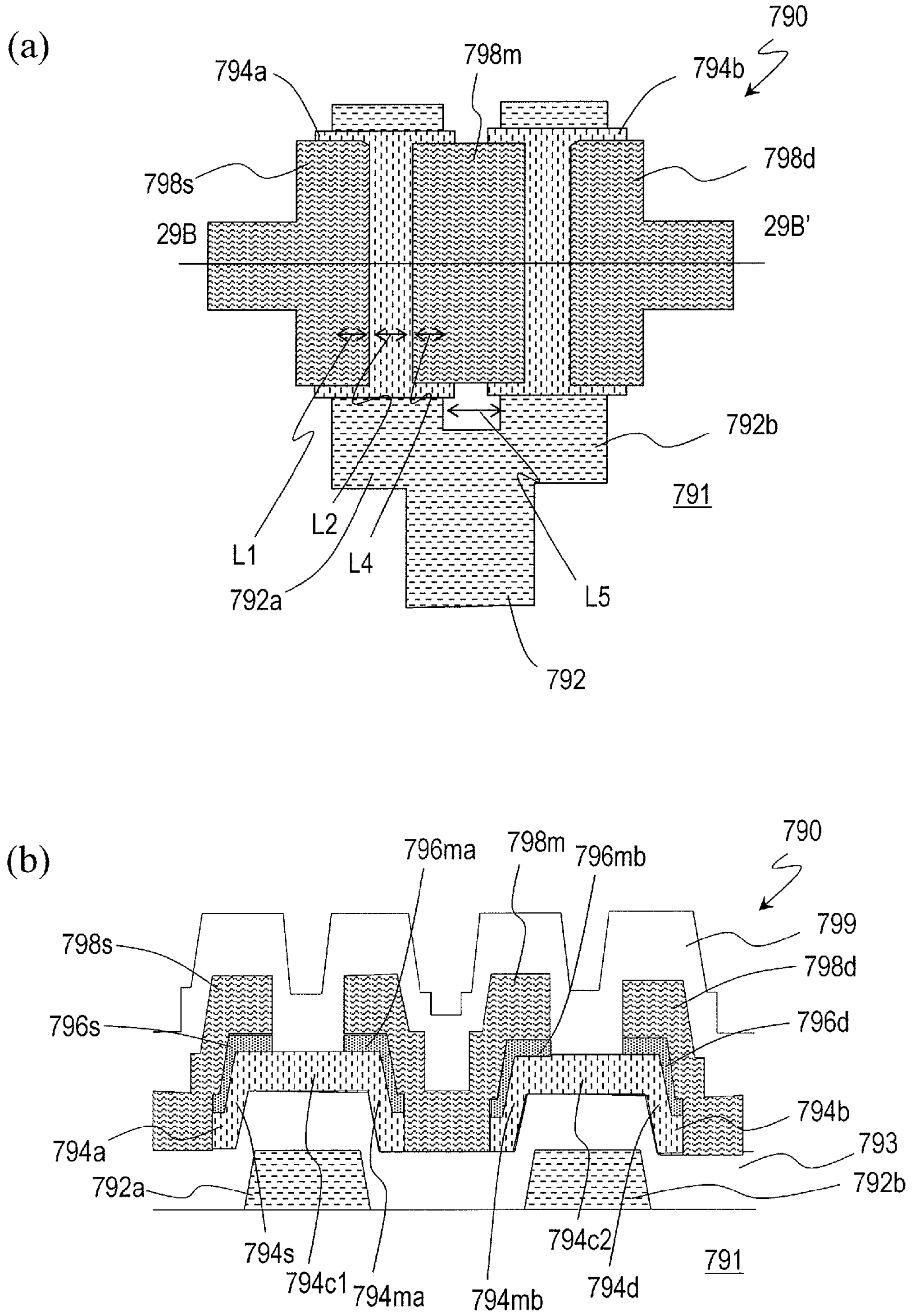
FIG. 29 (*a*) is a schematic plan view showing another thin film transistor 790 having a double-gate structure, and (*b*) is a schematic cross-sectional view taken along line 29B-29B' of (*a*).

The thin film transistor 710 differs from a thin film transistor 790 shown in FIG. 29 in that the entirety of the portion of the intermediate electrode 718*m* that is present between the first channel region 714*c*1 and the second channel region 714*c*2 overlaps with the gate electrode 712 with the intermediate region 714*m* and the gate insulating film 713 interposed therebetween, and has advantages such as having a superior effect of reducing the OFF current.

As is clear from the cross-sectional structure shown in FIG. 28(*b*), the thin film transistor 710 is of the bottom gate type (reverse-staggered type) in which the gate electrode 712 is provided between the active layer 714 and the substrate 711, and is of the channel-etched type in which the channel 714*c*1 and 714*c*2 are formed in regions where the active layer 714 is etched.

The active layer 714 of the thin film transistor 710 is formed by a micro-crystalline silicon film or a layered film of a micro-crystalline silicon film and an amorphous silicon film, and can be manufactured using a conventional process for manufacturing an amorphous silicon TFT. A micro-crystalline silicon film can be formed by using a plasma CVD method similar to a method of making an amorphous silicon film using a silane gas diluted with a hydrogen gas as the material gas, for example.

A micro-crystalline silicon film includes crystal particles and amorphous phase. A thin amorphous layer (hereinafter referred to as an "incubation layer") may be formed on the substrate side of the micro-crystalline silicon film. The thickness of the incubation layer is some nm, for example, though it depends on the deposition conditions of the micro-crystalline silicon film. Note however that there are cases where substantially no incubation layer is observed depending on the deposition conditions and the deposition method of the micro-crystalline silicon film, e.g., particularly, cases where a high-density plasma CVD method is used.

Crystal particles included in a micro-crystalline silicon film are typically smaller than crystal particles forming a polycrystalline silicon film. Observing a cross section of a micro-crystalline silicon film using a transmission electron microscope (TEM) shows that the average particle diameter of the crystal particles is generally 2 nm or more and 300 nm or less. Crystal particles may be in such a form that it extends in a columnar shape from the incubation layer to the upper surface of the micro-crystalline silicon film. When the diameter of the crystal particles is about 10 nm and when the volume percentage of the crystal particles with respect to the entire micro-crystalline silicon film is 60% or more and 85% or less, it is possible to obtain a high-quality micro-crystalline silicon film with few defects in the film.

Micro-crystalline silicon includes crystal particles and therefore has a higher carrier mobility than amorphous silicon but has a smaller bandgap and is likely to have defects formed in the film as compared with amorphous silicon. Therefore, a micro-crystalline silicon TFT has a problem that the OFF current is large. With the thin film transistor 710 of the present embodiment, the OFF current thereof can be reduced by the novel multi-gate structure.

The thin film transistor of the present embodiment does not have to have such a novel multi-gate structure as described above. For example, it may be a conventional double-gate TFT shown in FIG. 29. FIG. 29 is a schematic diagram of a thin film transistor 790 having a double-gate structure, wherein FIG. 29(*a*) is a schematic plan view, and FIG. 29(*b*) is a schematic cross-sectional view taken along line 29B-29B' of FIG. 29(*a*).

A gate electrode 792 of the thin film transistor 790 is branched into two, and has two gate branch portions 792*a* and 792*b*. Active layers 794*a* and 794*b* corresponding respectively to the two gate branch portions 792*a* and 792*b* are formed separately with a gate insulating film 793 which covers the gate electrode 792. The active layer 794*a* includes a source region 794*s*, a first channel region 794*c*1 and a first intermediate region 794*ma* formed therein, and the active layer 794*b* includes a drain region 794*d*, a second channel region 794*c*2 and a second intermediate region 794*mb* formed therein. A source electrode 798*s* is formed so as to oppose the source region 794*s* with a source contact layer 796*s* interposed therebetween, and a drain electrode 798*d* is formed so as to oppose a drain region 794*d* with a drain contact layer 796*d* interposed therebetween. The thin film transistor 790 further includes a protection film 799 covering these.

An intermediate electrode 798*m* of the thin film transistor 790 is formed so as to oppose the intermediate region 794*ma* with an intermediate contact layer 796*ma* interposed therebetween and oppose the intermediate region 794*mb* with an intermediate contact layer 796*mb* interposed therebetween. The intermediate electrode 798*m* is formed so as to bridge between the two active layers 794*a* and 794*b* and between two gate branch portions 792*a* and 792*b*, and the portion of the intermediate electrode 798*m* that is present between the first channel region 794*c*1 and the second channel region 794*c*2 includes a portion that does not overlap with any of the active layers 794*a* and 794*b* and the gate electrode 792.

The equivalent circuit of the thin film transistor 790 is the same as the equivalent circuit of the thin film transistor 710 shown in FIG. 28(*c*). In the present embodiment, it is preferred to use the thin film transistor 710 described above with reference to FIG. 28, rather than the thin film transistor 790. This is because the thin film transistor 710 has the following advantages over the thin film transistor 790, due to the difference therebetween in terms of the structure of the intermediate electrode and the active layer.

First, the thin film transistor 710 can reduce the OFF current more than the thin film transistor 790. The reason will be described below.

As shown in FIGS. 29(*a*) and 29(*b*), in the thin film transistor 790, only the opposite end portions of the intermediate electrode 798*m* are electrically connected to the active layers 794*a* and 794*b* with the intermediate contact layers 796*ma* and 796*mb* interposed therebetween. Therefore, in the thin film transistor 790, one end (on the side of the intermediate contact layer 796*ma*) of the intermediate electrode 798*m* serves as a drain electrode for the source electrode 798*s*, and the other end (on the side of the intermediate contact layer 796*mb*) of the intermediate electrode 798*m* serves as a source electrode for the drain electrode 798*d*. Thus, an electric field localizes in the opposite end portions of the intermediate electrode 798*m*.

In contrast, as shown in FIGS. 28(*a*) and 28(*b*), in the thin film transistor 710, the entirety of the intermediate electrode 718*m* is electrically connected to the active layer 714 with the intermediate contact region 716*m* interposed therebetween. Therefore, the intermediate electrode 718*m* itself serves as a drain electrode for the source electrode 718*s* and also serves as a source electrode for the drain electrode 718*d*. Thus, the degree of electric field localization in the intermediate electrode 718*m* of the thin film transistor 710 is mitigated as compared with the degree of electric field localization in the opposite end portions of the intermediate electrode 798*m* of the thin film transistor 790. As a result, the OFF current of the thin film transistor 710 is even smaller than the OFF current of the thin film transistor 790, and the reliability of the thin film transistor 710 is greater than the reliability of the thin film transistor 790.

Figure 30:
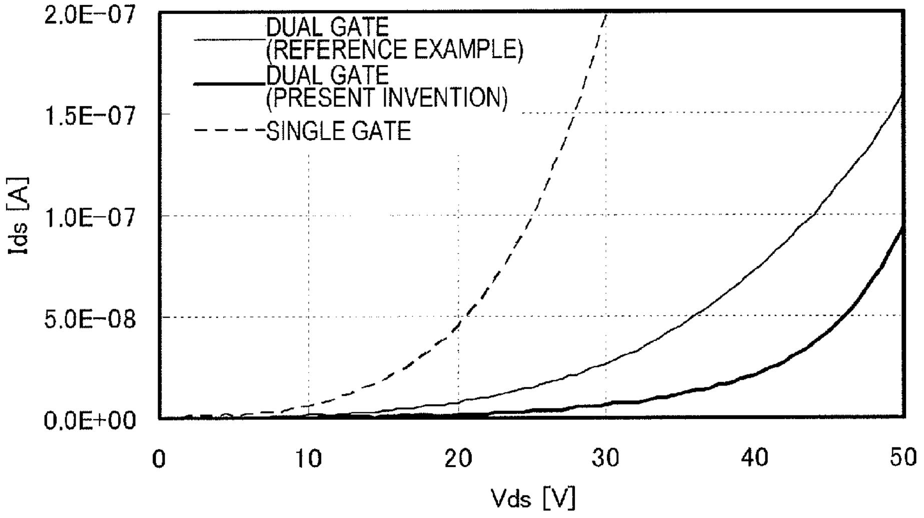
FIG. 30 A graph showing an example of OFF-current characteristics of the thin film transistor 710 and the thin film transistor 790.

FIG. 30 shows examples of the OFF current characteristics of the thin film transistor 710 and the thin film transistor 790. FIG. 30 also shows the OFF current characteristics of a TFT which has a single-channel structure. The horizontal axis of FIG. 30 is the source-drain voltage Vds (V), and the vertical axis thereof is the source-drain current Ids (A). Here, the gate voltage is 0 V, and Ids denotes the OFF current. The semiconductor layers of the thin film transistor 710 and the thin film transistor 790 used herein are micro-crystalline silicon films formed by a high-density PECVD method. The degree of crystallinity of the micro-crystalline silicon film is about 70% as measured by Raman spectroscopy, and the particle diameter is about 5 nm to about 10 nm. The channel length (L) and the channel width (W) of the TFT are L/W=4 μm/100 μm.

As is clear from FIG. 30, a TFT (Reference Example) having a conventional dual-channel structure has a smaller OFF current than a single-channel structure TFT, and a TFT which has a novel dual-channel structure of the present invention has an even smaller OFF current. With the dual-channel structure of the present invention, the electric field localization in the intermediate electrode is mitigated, and it is therefore possible to reduce the OFF current particularly when a high electric field is applied.

Figure 31:
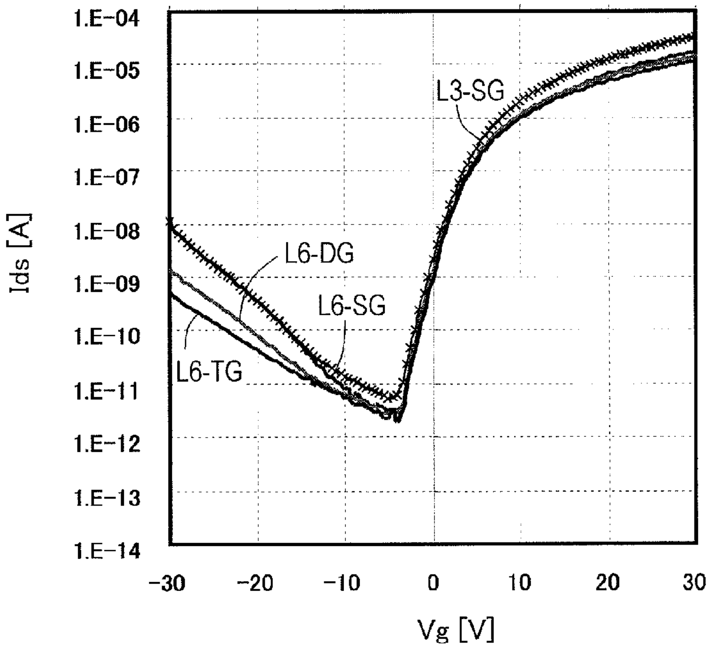
FIG. 31 A graph showing the relationship between the gate voltage Vg (V) and the source-drain current Ids (A) for TFTs having a single-channel structure, a dual-channel structure and a triple-channel structure.

Next, referring to FIG. 31, the relationship between the gate voltage Vg (V) and the source-drain current Ids (A) will be described for TFTs having a single-channel structure, a dual-channel structure and a triple-channel structure. The horizontal axis of FIG. 31 is the gate voltage Vg (V), and the vertical axis thereof is the source-drain current Ids (A). The source-drain voltage Vds is 10 V.

Here, the dual-channel structure is a structure similar to that of the thin film transistor 710 shown in FIG. 28, the single-channel structure is a structure of the thin film transistor 710 without the intermediate electrode 718*m*, and the triple-channel structure is a structure obtained by arranging two intermediate electrodes 718*m* of the thin film transistor 710 in parallel to each other. The channel lengths are all 6 μm. That is, the single-channel structure has a single channel having a channel length of 6 μm (L6-SG), the dual-channel structure has two channels each having a channel length of 3 μm (L6-DG), and the triple-channel structure has three channels each having a channel length of 2 μm (L6-TG). FIG. 31 also shows results (L3-SG) for a single-channel structure having a channel length of 3 μm.

First, observing results of FIG. 31 for the single-channel structures, no difference in OFF current is seen between a case where the channel length is 6 μm (L6-SG) and a case where the channel length is 3 μm (L3-SG). That is, it can be seen that there is no correlation between the magnitude of the OFF current and the channel length, and the OFF current is exclusively the leak current in the drain portion.

As is clear from FIG. 31, it can be seen that it is possible to reduce the OFF current by employing a dual-channel structure and a triple-channel structure. It can also be seen that the effect of reducing the OFF current is greater with the triple-channel structure than with the dual-channel structure.

Table 1 below shows values of source-drain OFF current for a case where the gate voltage is 0 V and the source-drain voltage Vds is 40 V and those for a case where the gate voltage is −29 V and the source-drain voltage Vds is 10V.

TABLE 1

| | OFF current (A) | | |
|---|---|---|---|
| Vg/Vds | Single channel | Dual channel | Triple channel |
| 0 V/40 V | 3.0×E−09 | 1.9×E−10 | 6.0×E−11 |
| −29 V/10 V | 6.6×E−09 | 1.0×E−09 | 3.9×E−10 |

As can be seen from the results of Table 1, where Vds is 40 V, the OFF current when the gate voltage Vg is 0 V can be reduced by one or two orders of magnitude by employing a dual-channel structure or a triple-channel structure, as compared with a single-channel structure. On the other hand, where Vds is 10 V, the OFF current when the gate voltage Vg is −29 V can be reduced by about one order of magnitude by employing a dual-channel structure or a triple-channel structure, as compared with a single-channel structure.

As described above, it can be seen that the OFF current of a TFT can be effectively reduced by employing a multi-channel structure of the present invention. That is, with the present invention, it is possible to reduce the leak current in the OFF region as well as the leak current in the sub-threshold region of a TFT. Therefore, by forming a shift register using TFTs of the present invention, it is possible to improve the characteristics of the shift register. By using TFTs of the present invention as pixel TFTs, as described in Patent Document No. 3 or 4, it is possible to improve the voltage retention characteristics of pixels.

Employing a multi-channel structure of the present invention provides an advantage that a TFT can be made smaller than a TFT which has a conventional multi-channel structure.

Reference is made again to FIGS. 28(*a*) and 29(*a*). As is clear from a comparison between FIG. 28(*a*) and FIG. 29(*a*), the length of the thin film transistor 710 in the channel direction is smaller than that of the thin film transistor 790.

The length of the thin film transistor 710 in the channel direction (the direction from the source electrode 718*s* to the drain electrode 718*d*) is given as 2L1+2L2+L3, as can be seen from FIG. 28(*a*). Now, L1 is the length of the region over which the source electrode 718*s* overlaps with the gate electrode 712 with the active layer 714 interposed therebetween or the length of the region over which the drain electrode 718*d* overlaps with the gate electrode 712 with the active layer 714 interposed therebetween. L2 is the length of each of the channel regions 714*c*1 and 714*c*2. L3 is the length of the intermediate electrode 718*m*. For example, assuming that L1=3 μm, L2=4 μm and L3=4 μm, the length of the thin film transistor 710 in the channel direction is 2L1+2L2+L3=18 μm.

In contrast, the length of the thin film transistor 790 in the channel direction (the direction from the source electrode 798*s* to the drain electrode 798*d*) is given as 2L1+2L2+2L4+L5, as can be seen from FIG. 29(*a*). Now, L1 is the length of the region over which the source electrode 798*s* overlaps with the gate branch portion 792*a* with the active layer 794*a* interposed therebetween or the length of the region over which the drain electrode 798*d* overlaps with the gate branch portion 792*b* with the active layer 794*b* interposed therebetween. L2 is the length of each of the channel regions 794*c*1 and 794*c*2. L4 is the length of the region over which the intermediate electrode 798*m* overlaps with the gate branch portion 792*a* with the active layer 794*a* interposed therebetween or the length of the region over which the intermediate electrode 798*m* overlaps with the gate branch portion 792*b* with the active layer 794*b* interposed therebetween. For example, assuming that L1=3 μm, L2=4 μm, L4=3 μm and L5=5 μm, the length of the thin film transistor 790 in the channel direction is 2L1+2L2+2L4+L5=25 μm.

Thus, by employing the novel dual-channel structure of the present invention, TFTs can be made smaller.

Next, referring to FIGS. 32(*a*) to 32(*f*), a method for manufacturing the active matrix substrate 801 having the thin film transistors 710 will be described. The active matrix substrate 801 illustrated herein is used in a liquid crystal display device.

Figure 32:
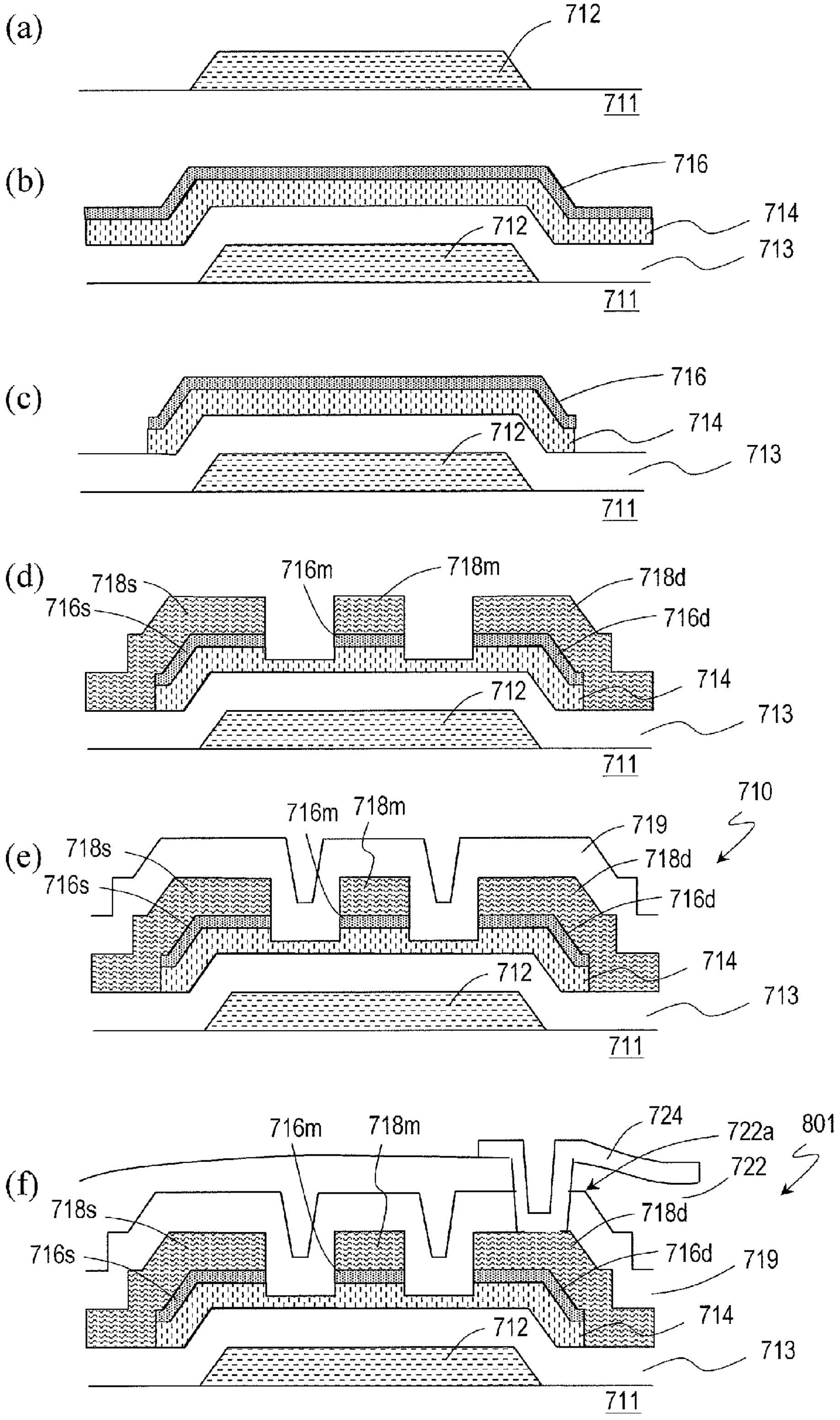
FIGS. 32 (*a*) to (*f*) are schematic cross-sectional views illustrating a method for manufacturing an active matrix substrate 801 including the thin film transistor 710.

First, as shown in FIG. 32(*a*), the gate electrode 712 is formed on the glass substrate 711. The gate electrode 712 is formed by, for example, patterning a Ti/Al/Ti layered film (a thickness of 0.2 μm, for example). In this process, the gate bus lines and CS bus lines (both not shown) can be formed by using the same conductive film as the gate electrode 712.

Next, as shown in FIG. 32(*b*), the gate insulating film 713, a micro-crystalline silicon film 714 and an $N^+$ silicon film 716 are consecutively deposited in this order. The gate insulating film 713 is formed by, for example, depositing an $SiN_x$ film (a thickness of 0.4 μm, for example) 713 by a parallel plate-type plasma CVD method. The micro-crystalline silicon film (a thickness of 0.12 μm, for example) 714 is formed by a high-density plasma CVD method. The $N^+$ silicon film (a thickness of 0.05 μm, for example) 716 is formed by a high-density plasma CVD method or a parallel plate-type plasma CVD method.

The deposition of the $SiN_x$ film 713 is performed under conditions including a substrate temperature: 300° C., a pressure: 50-300 Pa and a power density: 10-20 mW/cm$^2$, using a deposition chamber having a parallel plate (capacitive coupling) electrode structure, for example. A mixed gas of silane ($SiH_4$), ammonium ($NH_3$) and nitrogen ($N_2$) is used as the gas for deposition.

The deposition of the micro-crystalline silicon film 714 is performed under conditions including a substrate temperature: 250-350° C., a pressure: 0.5-5 Pa and a power density: 100-200 mW/cm$^2$, using an ICP-type high-density PECVD, and a silane gas diluted with a hydrogen gas is used as the gas for deposition. The flow rate between silane ($SiH_4$) and hydrogen ($H_2$) is set to 1:1-1:10.

The deposition of the $N^+$ silicon film 716 is performed under conditions including a substrate temperature: 250-300° C., a pressure: 50-300 Pa and a power density: 10-20 mW/cm$^2$ using a deposition chamber having a parallel plate (capacitive coupling) electrode structure. A mixed gas of silane ($SiH_4$), hydrogen ($H_2$) and phosphine ($PH_3$) is used as the gas for deposition.

Thereafter, the micro-crystalline silicon film 714 and the $N^+$ silicon film 716 are patterned, thereby obtaining the active layer 714 and the contact layer 716, as shown in FIG. 32(*c*).

Next, as shown in FIG. 32(*d*), a metal film (so-called a source metal) is deposited so as to cover the $N^+$ silicon film 716 and patterned, thereby forming the source electrode 718*s*, the drain electrode 718*d* and the intermediate electrode 718*m*. An Al/Mo layered film may be used as the metal film, for example. The patterning of the Al/Mo film can be performed by using an SLA etchant ($H_3PO_4$:$H_2O$:$HNO_3$:$CH_3COOH$=16:2:1:1) which is a common metal etchant.

By etching the contact layer ($N^+$ silicon film) 716 by a dry etching method using a mask (e.g., a photoresist layer) which is used for etching the metal film, it is divided into the source contact region 716*s*, the drain contact region 716*d* and the intermediate contact region 716*m*. In this process, a portion of the active layer (micro-crystalline silicon film) 714 is also etched (channel etching). The remaining film thickness of the active layer 714 is about 40 nm.

Next, as shown in FIG. 32(*e*), the protection film 719 is formed. For example, an $SiN_x$ film deposited by plasma CVD may be used as the protection film 719. Thus, the thin film transistor 710 is obtained.

Moreover, as shown in FIG. 32(*f*), a planarization film 722 is formed. The planarization film 722 is formed by using an organic resin film, for example. A contact hole 722*a* is formed in the planarization film 722 and the protection film 719. Thereafter, a transparent conductive film (e.g., an ITO film) is deposited and patterned, thereby forming a pixel electrode 724. The pixel electrode 724 is connected to the drain electrode 718*d* in the contact hole 722*a*.

The active matrix substrate 801 having the thin film transistor 710 connected to the pixel electrode 724 is obtained as described above.

Next, referring to FIGS. 33 and 34, a structure of another TFT of an embodiment of the present invention will be described.

Figure 33:
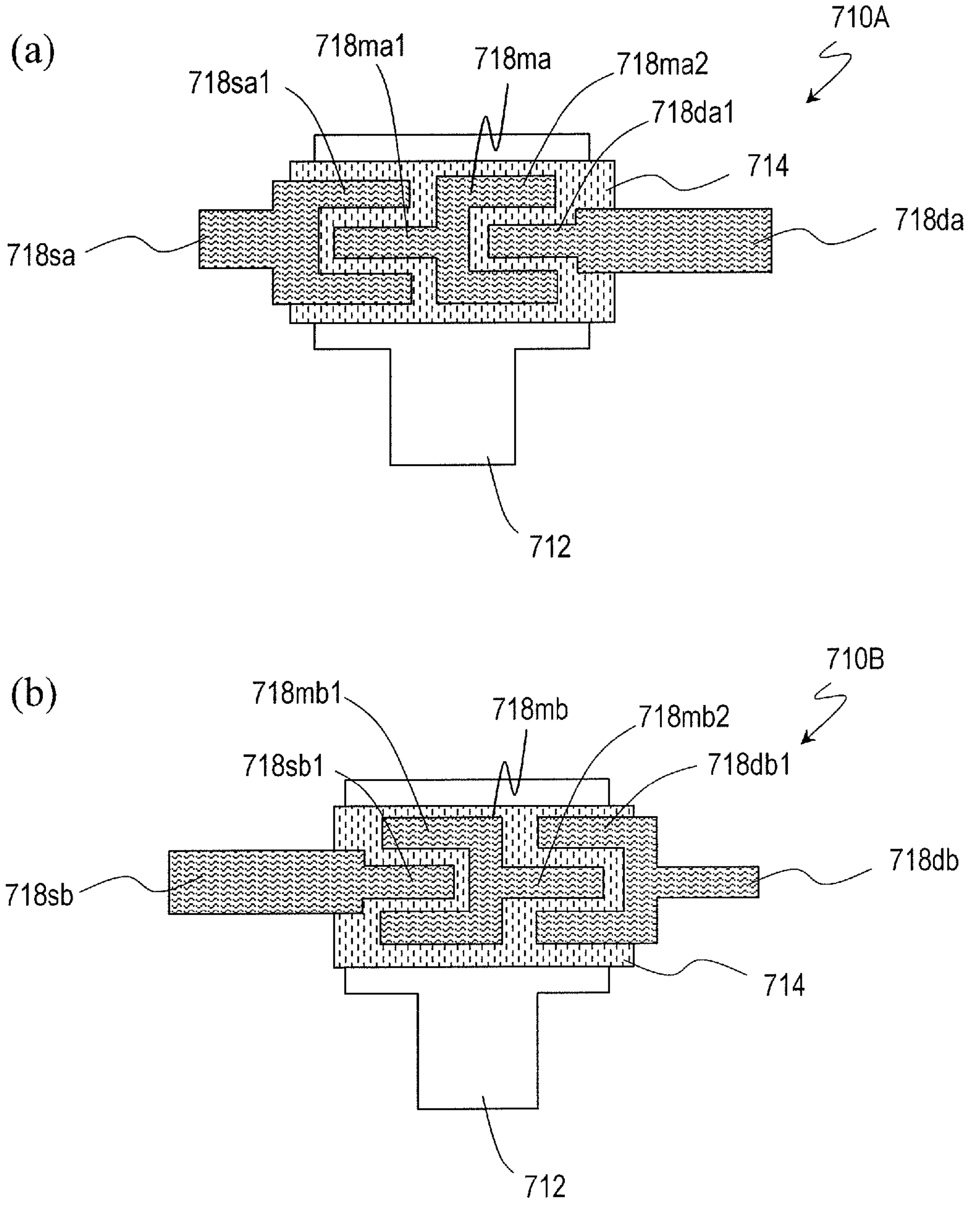
FIG. 33 (*a*) is a schematic plan view showing a thin film transistor 710A of an embodiment of the present invention, and (*b*) is a schematic plan view showing a thin film transistor 710B of an embodiment of the present invention.

FIG. 33(*a*) is a schematic plan view of a thin film transistor 710A, and FIG. 33(*b*) is a schematic plan view of a thin film transistor 710B. The cross-sectional structures of the thin film transistor 710A and the thin film transistor 710B are the same as the cross-sectional structure of the thin film transistor 710 shown in FIG. 35(*b*), and therefore will be omitted.

Figure 35:
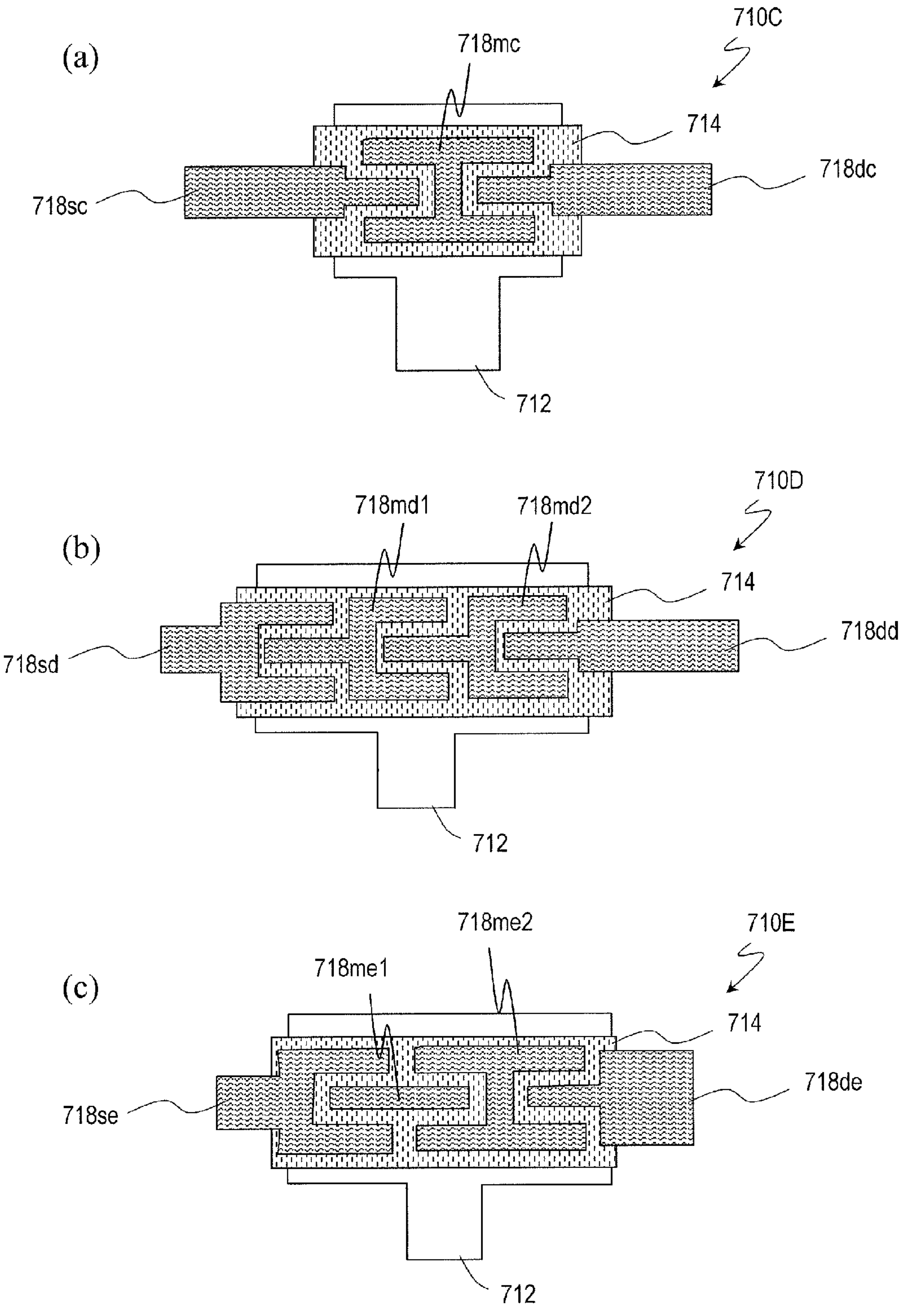
FIG. 35 (*a*) is a schematic plan view showing a thin film transistor 710C of an embodiment of the present invention, (*b*) is a schematic plan view showing a thin film transistor 710D of an embodiment of the present invention, and (*c*) is a schematic plan view showing a thin film transistor 710E of an embodiment of the present invention.

The thin film transistor 710A shown in FIG. 33(*a*) has a dual-channel structure similar to that of the thin film transistor 710 shown in FIG. 35. The thin film transistor 710A includes the gate electrode 712, the active layer 714, a source electrode 718*sa*, a drain electrode 718*da*, and an intermediate electrode 718*ma*, formed on a substrate (not shown). A contact layer (not shown) is formed between each of the electrodes 718*sa*, 718*da* and 718*ma* and the active layer 714. The region over which the active layer 714 overlaps with the source electrode 718*sa* with the contact layer interposed therebetween is the source region, the region over which the active layer 714 overlaps with the drain electrode 718*da* with the contact layer interposed therebetween is the drain region, and the region over which the active layer 714 overlaps with the intermediate electrode 718*ma* with the contact layer interposed therebetween is the intermediate region. As seen in a direction vertical to the substrate, the source region has the same shape as the source electrode 718*sa*, the drain region has the same shape as the drain electrode 718*da*, and the intermediate region has the same shape as the intermediate electrode 718*ma*.

A feature of the thin film transistor 710A is that the area of the portion of the gate electrode 712 that overlaps with the drain region is smaller than the area of the portion of the gate electrode 712 that overlaps with the source region.

As shown in FIG. 33(*a*), the intermediate electrode 718*ma* includes a depressed portion 718*ma*2, and the drain electrode 718*da* includes a protruding portion 718*da*1 in the depressed portion 718*ma*2 of the intermediate electrode 718*ma*. The portion of the drain electrode 718*da* that overlaps with the gate electrode 712 with the active layer 714 (i.e., a drain region) interposed therebetween is the portion 718*da*1 which is protruding in a narrow shape from the main body. As is clear from a comparison with the drain electrode 718*d* of the thin film transistor 710 shown in FIG. 35(*a*), the area of the portion of the drain electrode 718*da* of the thin film transistor 710A that overlaps with the gate electrode 712 with the active layer 714 interposed therebetween is small.

In the thin film transistor 710A shown in FIG. 33(*a*), the source electrode 718*sa* includes a depressed portion 718*sa*1, and the intermediate electrode 718*ma* includes a protruding portion 718*ma*1 in the depressed portion 718*sa*1 of the source electrode 718*sa*. As is clear from a comparison with the source electrode 718*s* of the thin film transistor 710 shown in FIG. 35(*a*), the area of the portion of the source electrode 718*sa* of the thin film transistor 710A that overlaps with the gate electrode 712 with the active layer 714 interposed therebetween is large.

Thus, since the drain electrode 718*da*, the intermediate electrode 718*ma* and the source electrode 718*sa* of the thin film transistor 710A shown in FIG. 33(*a*) have such shapes as described above, the area of the portion of the gate electrode 712 that overlaps with the drain region is smaller than the area of the portion of the gate electrode 712 that overlaps with the source region. The area of the portion of the gate electrode 712 that overlaps with the drain region is smaller than the area of the portion of the gate electrode 712 that overlaps with the intermediate region.

Even if the configuration on the left side of the intermediate electrode 718*ma* of the thin film transistor 710A in FIG. 33(*a*) is made to be the same as the configuration on the left side of the intermediate electrode 718*m* of the thin film transistor 710 shown in FIG. 35(*a*), the area of the portion of the gate electrode 712 that overlaps with the drain electrode 718*da* with the active layer 714 interposed therebetween is smaller than the area of the portion of the gate electrode 712 that overlaps with the source electrode 718*s* with the active layer 714 interposed therebetween (see FIG. 35(*a*)).

Even if the configuration on the right side of the intermediate electrode 718*ma* of the thin film transistor 710A in FIG.

33(*a*) is made to be the same as the configuration on the right side of the intermediate electrode 718*m* of the thin film transistor 710 shown in FIG. 35(*a*), the area of the portion of the gate electrode 712 that overlaps with the drain electrode 718*d* with the active layer 714 interposed therebetween (see FIG. 35(*a*)) is smaller than the area of the portion of the gate electrode 712 that overlaps with the source electrode 718*sa* with the active layer 714 interposed therebetween.

Thus, also when one of the right side or the left side of the intermediate electrode 718*ma* of the thin film transistor 710A shown in FIG. 33(*a*) is combined with the thin film transistor 710 shown in FIG. 35(*a*), it is possible to obtain a configuration where the area of the portion of the gate electrode 712 that overlaps with the drain region is smaller than the area of the portion of the gate electrode 712 that overlaps with the source region.

As described above, by setting the area of the portion of the gate electrode 712 that overlaps with the drain region to be small, it is possible to reduce the OFF current of the TFT. FIG. 34 shows the results obtained of the relationship between the gate voltage Vg (V) and the source-drain current Ids (A) for the thin film transistor 710A shown in FIG. 33(*a*) and the thin film transistor 710B shown in FIG. 33(*b*). The horizontal axis of FIG. 34 is the gate voltage Vg (V), and the vertical axis thereof is the source-drain current Ids (A). The results for source-drain voltages Vds (V) of 5 V and 10 V are shown.

The thin film transistor 710B shown in FIG. 33(*b*) corresponds to what is obtained by switching around the source side and the drain side of the thin film transistor 710A shown in FIG. 33(*a*). A drain electrode 718*db* includes a depressed portion 718*db*1, and an intermediate electrode 718*mb* includes a protruding portion 718*mb*2 in the depressed portion 718*db*1 of the drain electrode 718*db*. The intermediate electrode 718*mb* includes a depressed portion 718*mb*1, and a source electrode 718*sb* includes a protruding portion 718*sb*1 in the depressed portion 718*mb*1 of the intermediate electrode 718*mb*. Therefore, in the thin film transistor 710B, the area of the portion of the gate electrode 712 that overlaps with the drain region is larger than the area of the portion of the gate electrode 712 that overlaps with the source region.

Figure 34:
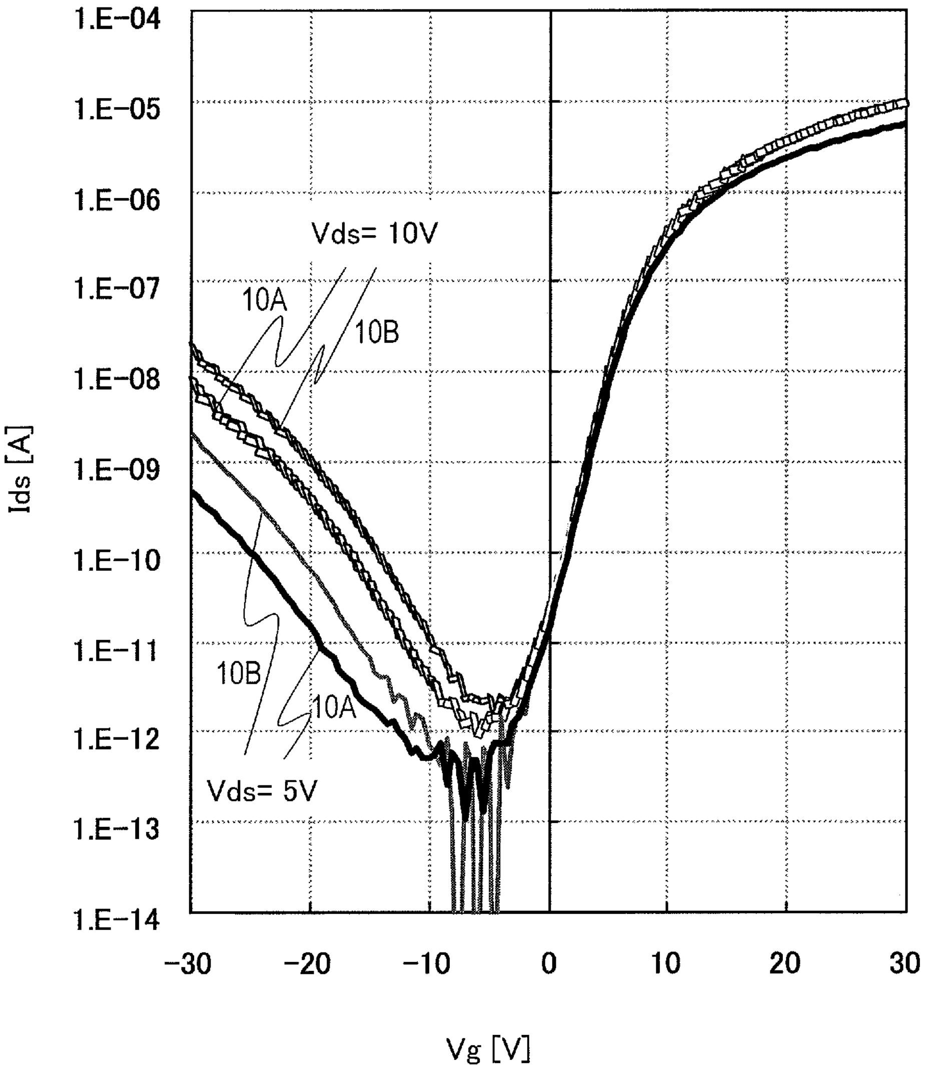
FIG. 34 A graph showing the relationship between the gate voltage Vg (V) and the source-drain current Ids (A) for the thin film transistor 710A and the thin film transistor 710B.

As can be seen from FIG. 34, the thin film transistor 710A has a smaller OFF current than the thin film transistor 710B whether the source-drain voltage Vds (V) is 5 V or 10 V. Thus, it can be seen that by setting the area of the portion of the gate electrode 712 that overlaps with the drain region to be small, it is possible to reduce the OFF current of the TFT. Where the thin film transistor 710A is used as the second transistor of the shift register described above, it is preferred that the drain electrode 718*da* is connected to netA (the gate electrode of the first transistor). The source electrode 718*sa* is connected to VSS, for example.

The magnitude of the OFF current depends on the area of the portion of the gate electrode 712 that overlaps with the drain region, and in that sense the relative magnitude with respect to the area of the portion of the gate electrode 712 that overlaps with the source region is not important. Note however that if the area of the portion of the gate electrode 712 that overlaps with the drain region is set to be small in order to reduce the OFF current of the TFT, an asymmetric configuration is obtained where the area of the portion of the gate electrode 712 that overlaps with the drain region is smaller than the area of the portion of the gate electrode 712 that overlaps with the source region.

As is well known in the art, the characteristics of a TFT depend on the channel width, and it is preferred that the channel width is large. By providing the U-shaped depressed portions 718*ma*2 and 718*sa*1 as in the intermediate electrode 718*ma* and the source electrode 718*sa* shown in FIG. 33(*a*), it is possible to make the channel region U-shaped and increase the channel width.

Next, referring to FIG. 35, a structure of another TFT of an embodiment of the present invention will be described.

FIG. 35(*a*) shows a schematic plan view of a thin film transistor 710C of an embodiment of the present invention. The thin film transistor 710C has a dual-channel structure as does the thin film transistor 710 shown in FIG. 35(*a*). An intermediate electrode 718*mc* of the thin film transistor 710C has an H shape, and has a U-shaped depressed portion on the drain side and on the source side. A drain electrode 718*dc* and a source electrode 718*sc* each have a protruding portion in the depressed portion of the intermediate electrode 718*mc*. The area of the portion of the gate electrode 712 that overlaps with the drain region and the area of the portion of the gate electrode 712 that overlaps with the source region are each smaller than the area of the portion of the gate electrode 712 that overlaps with the intermediate region. In the thin film transistor 710C, as compared with the thin film transistor 710, the area of the portion of the gate electrode 712 that overlaps with the drain region is smaller and the width of the two channel regions is larger. Therefore, the thin film transistor 710C has a smaller OFF current and better TFT characteristics than the thin film transistor 710.

FIG. 35(*b*) shows a schematic plan view of a thin film transistor 710D of an embodiment of the present invention. The thin film transistor 710D has a triple-channel structure including two intermediate electrodes 718*md*1 and 718*md*2, as opposed to the thin film transistor 710A shown in FIG. 33(*a*) having a dual-channel structure. That is, a first channel region is formed between a source electrode 718*sd* and the first intermediate electrode 718*md*1, a second channel region is formed between a drain electrode 718*dd* and the second intermediate electrode 718*md*2, and a third channel region is formed between the first intermediate electrode 718*md*1 and the second intermediate electrode 718*md*2.

Although not shown, a first intermediate contact region is formed in the contact layer under the first intermediate electrode 718*md*1, and a first intermediate region is formed in the active layer under the first intermediate contact region. A second intermediate contact region is formed in the contact layer under the second intermediate electrode 718*md*2, and a second intermediate region is formed in the active layer under the second intermediate contact region.

For each of the three channels of the thin film transistor 710D, the portion that serves as the drain electrode is a protruding portion (the protruding portions of the intermediate electrodes 718*md*1 and 718*md*2 and the protruding portion of the drain electrode 718*dd*) and the area thereof that that overlaps with the gate electrode 712 is small, thus providing a significant effect of reducing the OFF current. The area of the portion of the gate electrode 712 that overlaps with the drain region and the area of the portion of the gate electrode 712 that overlaps with the source region are each smaller than the area of the portion of the gate electrode 712 that overlaps with the intermediate region. For each of the three channels, the portion that serves as the source electrode has a U-shaped depressed portion, and the protruding portion of the intermediate electrode 718*md*1, 718*md*2 or the protruding portion of the drain electrode 718*dd* is present in each depressed portion. Therefore, the three channel regions have a large width, and have desirable TFT characteristics. Where the thin film transistor 710D is used as the second transistor of the shift register described above, it is preferred that the drain electrode 718*dd* is connected to netA (the gate electrode of the first transistor).

FIG. 35(*c*) shows a schematic plan view of a thin film transistor 710E of an embodiment of the present invention. The thin film transistor 710E has a triple-channel structure including two intermediate electrodes 718*me*1 and 718*me*2, as does the thin film transistor 710D shown in FIG. 35(*b*). That is, a first channel region is formed between a source electrode 718*se* and the first intermediate electrode 718*me*1, a second channel region is formed between a drain electrode 718*de* and the second intermediate electrode 718*me*2, and a third channel region is formed between the first intermediate electrode 718*me*1 and the second intermediate electrode 718*me*2. The second intermediate electrode 718*me*2 has an H shape, and has a U-shaped depressed portion on the drain side and on the source side. The protruding portion of the drain electrode 718*de* is present in one of the depressed portions of the second intermediate electrode 718*me*2, and one end of the rectangular first intermediate electrode 718*me*1 is present in the other depressed portion of the second intermediate electrode 718*me*2. The source electrode 718*se* has a U-shaped depressed portion, and the other end of the first intermediate electrode 718*me*1 is present in the depressed portion of the source electrode 718*se*.

The thin film transistor 710E also has a configuration where the area of the portion of the gate electrode 712 that overlaps with the drain region is smaller than the area of the portion of the gate electrode 712 that overlaps with the source region, and has an advantage that the OFF current is small. The area of the portion of the gate electrode 712 that overlaps with the drain region and the area of the portion of the gate electrode 712 that overlaps with the source region are each smaller than the area of the portion of the gate electrode 712 that overlaps with the intermediate region. Where the thin film transistor 710E is used as the second transistor of the shift register described above, it is preferred that the drain electrode 718*de* is connected to netA (the gate electrode of the first transistor).

Figure 36:
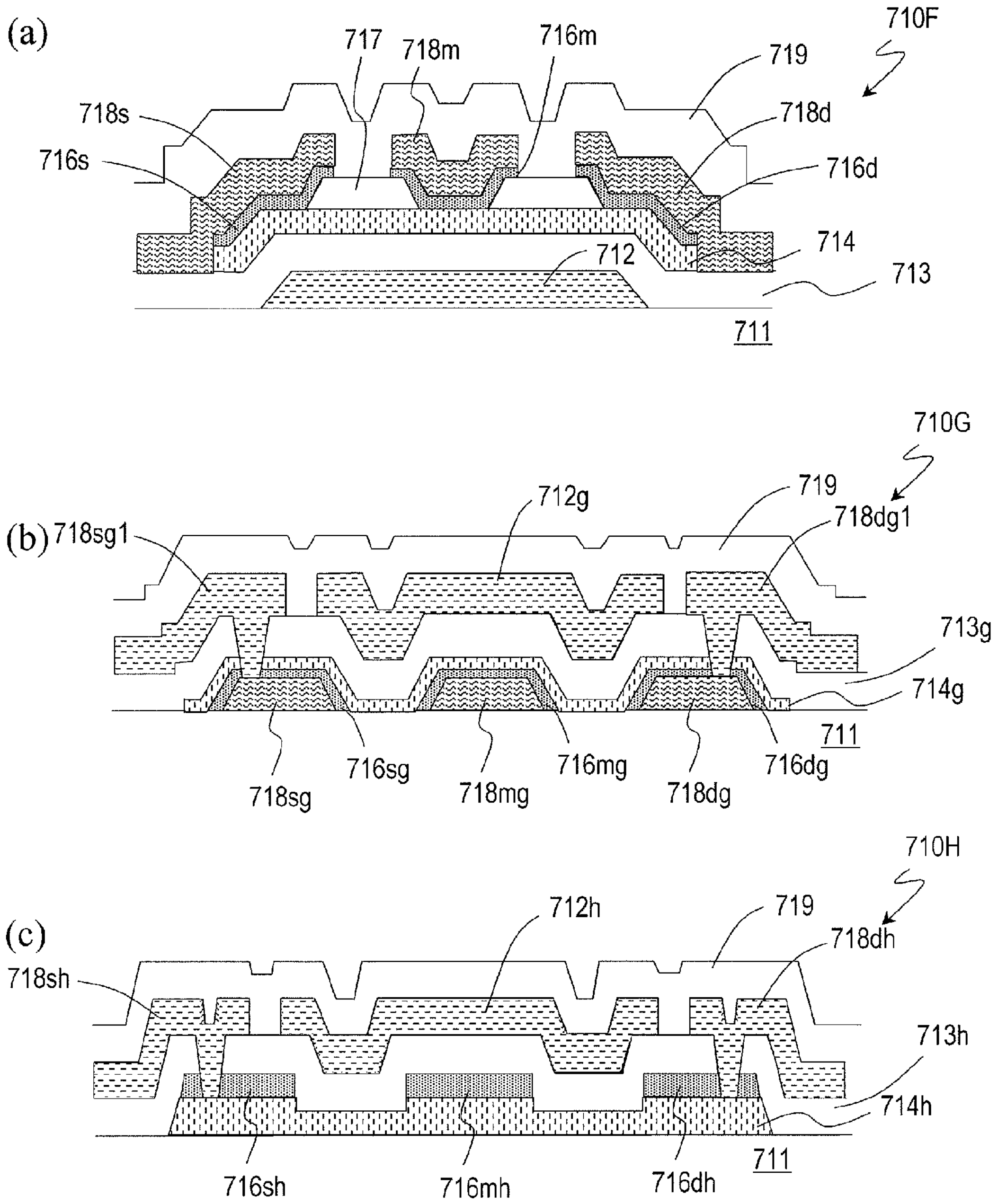
FIG. 36 (*a*) is a schematic plan view showing a thin film transistor 710F of an embodiment of the present invention, (*b*) is a schematic plan view showing a thin film transistor 710G of an embodiment of the present invention, and (*c*) is a schematic plan view showing a thin film transistor 710H of an embodiment of the present invention.
Figure 37:
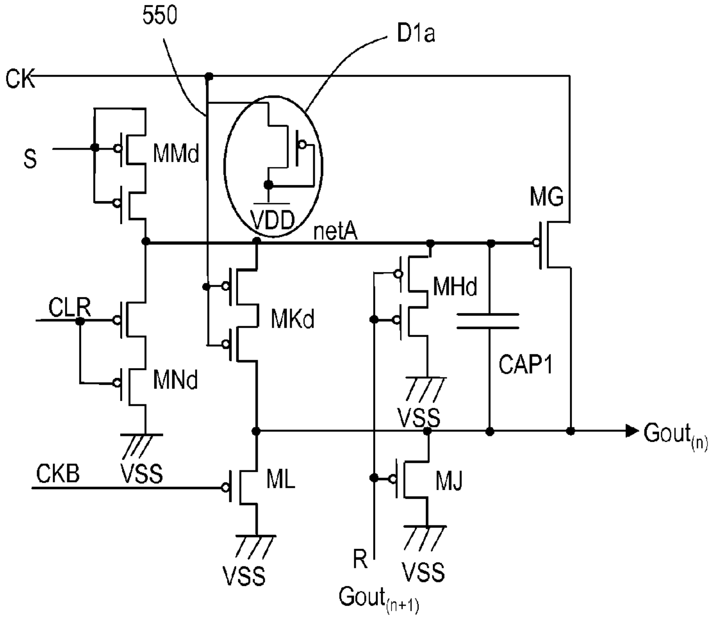
FIG. 37 A circuit diagram of one stage of a shift register of an embodiment of the present invention, which is used in one stage of the shift register 610B.

Referring to FIGS. 36(*a*)-36(*c*), a structure of still another TFT of an embodiment of the present invention will be described.

FIG. 36(*a*) shows a schematic cross-sectional view of a thin film transistor 710F of an embodiment of the present invention. While the thin film transistor 710 shown in FIG. 35 is a channel-etched type TFT, the thin film transistor 710F is different in that it includes an etch stop layer 717.

The thin film transistor 710F is made by adding a step of forming an etch stop layer 717 after the deposition of the micro-crystalline silicon film 714 in the manufacturing process of the thin film transistor 710 shown in FIG. 32. The etch stop layer 717 is formed by, for example, depositing and patterning an $SiN_x$ film (a thickness of 0.15 μm, for example).

With the presence of the etch stop layer 717, the active layer (micro-crystalline silicon film) 714 is not etched when the contact layer ($N^+$ silicon film) 716 is etched so as to divide it into the source contact region 716*s*, the drain contact region 716*d* and the intermediate contact region 716*m*. Therefore, there is an advantage that the thickness of the active layer 714 can be controlled in the deposition step. There is also an advantage that the active layer 714 is not damaged by the etching. Moreover, there is also an advantage that the process stability is high because the gate insulating film 713, the active layer 714 and the etch stop layer 717 can be deposited continuously.

The TFT of an embodiment of the present invention may be a top gate type (staggered type) TFT as shown in FIGS. 36(*b*) and 36(*c*).

A thin film transistor 710G shown in FIG. 36(*b*) includes, formed on the glass substrate 711, a source electrode 718*sg*, an intermediate electrode 718*mg* and a drain electrode 718*dg*, and a source contact region 716*sg*, a drain contact region 716*dg* and an intermediate contact region 716*mg* formed so as to cover these respectively. An active layer 714*g* is formed so as to cover the source contact region 716*sg*, the drain contact region 716*dg* and the intermediate contact region 716*mg*, and a gate insulating film 713*g* is formed thereon. A gate electrode 712*g* is formed so as to overlap with the entirety of the intermediate electrode 718*mg* (the portion present between the two channels), a portion of the source electrode 718*sg* and a portion of the drain electrode 718*dg*, with the gate insulating film 713*g* interposed therebetween. That is, the thin film transistor 710G also has a double-gate structure similar to that of the thin film transistor 710. A source extension electrode 718*sg*1 and a drain extension electrode 718*dg*1 are formed from the same conductive layer as the gate electrode 712*g*, and are electrically connected to the source electrode 718*sg* and the drain electrode 718*dg*, respectively, in contact holes formed in the gate insulating film 713*g*, the active layer 714*g* and the contact regions 716*sg* and 716*dg*.

Thus, employing a top gate type provides an advantage that the vicinity of the uppermost surface of the active layer 714 formed from the micro-crystalline silicon film can be used as a channel region. When a micro-crystalline silicon film is formed on a substrate, a layer made of amorphous phase which is called an "incubation layer" may be formed in the lowermost layer. Particularly, since the portion in contact with the substrate is formed in the initial period of deposition, it is likely to include voids and has a low mobility. By employing a top gate type, no incubation layer is included in the channel region, and it is therefore possible to make full use of the high mobility of the micro-crystalline silicon film.

A thin film transistor 710H shown in FIG. 36(*c*) includes an active layer 714*h* formed on the substrate 711, a source contact region 716*sh*, a drain contact region 716*dh* and an intermediate contact region 716*mh* formed on the active layer 714*h*. The contact regions are separated by the channel etching as in the thin film transistor 710. A gate insulating film 713*h* is formed so as to cover the active layer 714*h*, the source contact region 716*sh*, the drain contact region 716*dh* and the intermediate contact region 716*mh*. A gate electrode 712*h* is formed so as to overlap with the entirety of the intermediate contact region 716*mh* (herein serving also as an intermediate electrode) (the portion present between the two channels), a portion of the source contact region 716*sh* and a portion of the drain contact region 716*dh* with the gate insulating film 713*h* interposed therebetween. That is, the thin film transistor 710H also has a double-gate structure similar to that of the thin film transistor 710. A source extension electrode 718*sh* and a drain extension electrode 718*dh* are formed from the same conductive layer as the gate electrode 712*h*, and are electrically connected to the source electrode 718*sh* and the drain electrode 718*dh*, respectively, in contact holes formed in the gate insulating film 713*h*, the active layer 714*h* and the contact layers 716*sh* and 716*dh*.

Also having a top gate structure, as does the thin film transistor 710G, the thin film transistor 710H provides an advantage that the vicinity of the uppermost surface of the active layer 714*h* formed from the micro-crystalline silicon film can be used as a channel region. Moreover, in the thin film transistor 710H, since the intermediate contact region 716*mh* serves also as an intermediate electrode, there is an advantage that the step of forming the intermediate electrode can be omitted.

As described above, the TFT of an embodiment of the present invention may be of either the bottom gate type or the top gate type, and is capable of reducing the OFF current. By including a micro-crystalline silicon film as the active layer, the TFT of an embodiment of the present invention can have a high mobility and a low OFF current. The effect is obtained not only when only a micro-crystalline silicon film is provided as the active layer, but also when a layered film of a micro-crystalline silicon film and an amorphous silicon film is provided. In order to make use of the high mobility of the micro-crystalline silicon film, it is preferred that it is provided closer to the gate electrode than an amorphous silicon film so that a channel is formed in the micro-crystalline silicon film. Although the TFT of an embodiment of the present invention has been described herein with an example of a semiconductor film made only of silicon, the embodiment of the present invention is not limited by the type of the semiconductor film, and can be applied to TFTs having other micro-crystalline semiconductor films, e.g., micro-crystalline SiGe films and micro-crystalline SiC films, with which it is desirable to reduce the OFF current.

Although the use of amorphous silicon or micro-crystalline silicon is advantageous in terms of the mass productivity as described above, polycrystalline silicon may also be used.

INDUSTRIAL APPLICABILITY

The semiconductor device of the present invention can be widely applied to devices having thin film transistors, including circuit substrates such as active matrix substrates, display devices such as liquid crystal display devices, organic electroluminescence (EL) display devices and inorganic electroluminescence display devices, image sensing devices such as flat panel X-ray image sensor devices, and electronic devices such as image input devices and fingerprint reader devices. Particularly, it can be applied advantageously to a liquid crystal display device of a high display quality using double speed driving, etc., a liquid crystal display device of a low power consumption, or a liquid crystal display device of a larger size.

REFERENCE SIGNS LIST

D1, D2, D2*a*, D2*b*, D2*c*, D2*d*, D2*e* Protection diode
550, 552, 554, 556 Line
MMd, MKd, MHd, MG, MJ, ML, MNd Thin film transistor
1 Substrate
2, 103 Gate electrode
3 Conductive layer
4 Connection line
5 Gate insulating layer
6, 7, 107 Semiconductor layer (micro-crystal silicon layer)
6*c*, 107*c* Channel region
7*d* Resistive region
6*a*, 6*b*, 7*a*, 7*b* Regions of semiconductor layer
107*a* Source region
107*b* Drain region
8*a*, 8*b*, 9*a*, 9*b*, 109*a*, 109*b* Contact layer
10, 110 Source electrode
12, 112 Drain electrode
13 Passivation
14 Contact hole
15, 16, 116 Gap portion
201, 202, 204, 205, 206, 207 Diode
301, 302, 710, 790 Thin film transistor
711 Substrate (glass substrate)
712 Gate electrode
713 Gate insulating film
714 Active layer (semiconductor layer)
714*c*1, 714*c*2 Channel region
714*s* Source region
714*d* Drain region
714*m* Intermediate region
716 Contact layer
716*s* Source contact region
716*d* Drain contact region
716*m* Intermediate contact region
717 Etch stop layer
718*s* Source electrode
718*d* Drain electrode
718*m* Intermediate electrode
719 Protection film

The invention claimed is:

1. A semiconductor device comprising:

a shift register supported by an insulating substrate and including a plurality of stages each including a plurality of thin film transistors, at least one of the plurality of thin film transistors defining at least one diode by electrically connecting its gate electrode to its source electrode, wherein each of the plurality of stages of the shift register further includes at least one input signal line arranged to receive an external signal and connected to the at least one diode;

the plurality of thin film transistors all have an N type conductivity;

each cathode-side electrode of each of the at least one diode is directly connected to the at least one input signal line which is connected to a gate of a selected one of the plurality of thin film transistors, wherein the cathode-side electrode corresponds to a drain electrode of the at least one of the plurality of thin film transistors; and each anode-side electrode of the at least one diode is directly connected to ground or a voltage source, wherein the anode-side electrode corresponds to a source electrode of the at least one of the plurality of thin film transistors.

2. The semiconductor device according to claim 1, wherein a voltage peak value of the circuit is 20 V or more.

3. The semiconductor device according to claim 1, wherein semiconductor layers of the at least one diode and the selected one of the thin film transistors are defined by the same semiconductor film.

4. The semiconductor device according to claim 3, wherein the same semiconductor film is a micro-crystalline silicon film.

5. The semiconductor device according to claim 1, wherein:

each of the plurality of stages successively outputs output signals;

each of the plurality of stages includes a first transistor arranged to output the output signal, and a plurality of second transistors whose source region or drain region is electrically connected to a gate electrode of the first transistor; and the plurality of second transistors include a multi-channel transistor having an active layer including at least two channel regions, a source region and a drain region.

6. The semiconductor device according to claim 1, wherein the at least one diode includes:

a gate electrode arranged on a substrate;

a gate insulating layer arranged on the gate electrode;

at least one semiconductor layer arranged on the gate insulating layer and including a first region and a second region;

a first electrode provided on the first region and electrically connected to the first region and the gate electrode; and a second electrode provided on the second region and electrically connected to the second region.

7. The semiconductor device according to claim 6, wherein:

the at least one semiconductor layer includes a channel region overlapping with the gate electrode with the gate insulating layer interposed therebetween, and a resistive region not overlapping with the gate electrode with the gate insulating layer interposed therebetween; and a current path including the channel region and the resistive region is arranged between the first electrode and the second electrode while the diode is ON.

8. The semiconductor device according to claim 3, wherein the same semiconductor film is an oxide semiconductor film.

9. The semiconductor device according to claim 8, wherein the oxide semiconductor film is an In—Ga—Zn—O semiconductor film.

10. A semiconductor device comprising:

a shift register supported by an insulating substrate and including a plurality of stages each including a plurality of thin film transistors at least one of the plurality of thin film transistors defining at least one diode by electrically connecting its gate electrode to its source electrode, wherein each of the plurality of stages of the shift register further includes at least one input signal line arranged to receive an external signal and connected to the at least one diode;

the plurality of thin film transistors all have a P type conductivity;

each anode-side electrode of each of the at least one diode is directly connected to the at least one input signal line which is connected to a gate of a selected one of the plurality of thin film transistors, wherein the anode-side electrode corresponds to a source electrode of the at least one of the plurality of thin film transistors; and each cathode-side electrode of the at least one diode is directly connected to a voltage source, wherein the cathode-side electrode corresponds to a drain electrode of the at least one of the plurality of thin film transistors.

11. The semiconductor device according to claim 10, wherein a voltage peak value of the circuit is 20 V or more.

12. The semiconductor device according to claim 10, wherein semiconductor layers of the at least one diode and the selected one of the thin film transistors are defined by the same semiconductor film.

13. The semiconductor device according to claim 12, wherein the same semiconductor film is a micro-crystalline silicon film.

14. The semiconductor device according to claim 10, wherein:

each of the plurality of stages successively outputs output signals;

each of the plurality of stages includes a first transistor arranged to output the output signal, and a plurality of second transistors whose source region or drain region is electrically connected to a gate electrode of the first transistor; and the plurality of second transistors include a multi-channel transistor having an active layer including at least two channel regions, a source region and a drain region.

15. The semiconductor device according to claim 10, wherein the at least one diode includes:

a gate electrode arranged on a substrate;

a gate insulating layer arranged on the gate electrode;

at least one semiconductor layer arranged on the gate insulating layer and including a first region and a second region;

a first electrode provided on the first region and electrically connected to the first region and the gate electrode; and a second electrode provided on the second region and electrically connected to the second region.

16. The semiconductor device according to claim 15, wherein:

the at least one semiconductor layer includes a channel region overlapping with the gate electrode with the gate insulating layer interposed therebetween, and a resistive region not overlapping with the gate electrode with the gate insulating layer interposed therebetween; and a current path including the channel region and the resistive region is arranged between the first electrode and the second electrode while the diode is ON.

17. The semiconductor device according to claim 12, wherein the same semiconductor film is an oxide semiconductor film.

18. The semiconductor device according to claim 17, wherein the oxide semiconductor film is an In—Ga—Zn—O semiconductor film.

* * * * *